United States Patent
Youk et al.

(10) Patent No.: US 11,871,630 B2
(45) Date of Patent: Jan. 9, 2024

(54) DISPLAY DEVICE

(71) Applicant: SAMSUNG DISPLAY CO., LTD., Yongin-si (KR)

(72) Inventors: Kikyung Youk, Bucheon-si (KR); Hanbum Kwon, Hwaseong-si (KR); Seung-Soo Ryu, Hwaseong-si (KR); Heeju Woo, Suwon-si (KR); Cholong Won, Hwaseong-si (KR); Daehyuk Im, Hwaseong-si (KR); Sun Oh Jeong, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/062,804

(22) Filed: Dec. 7, 2022

(65) Prior Publication Data

US 2023/0247874 A1  Aug. 3, 2023

(30) Foreign Application Priority Data

Jan. 14, 2022 (KR) .................. 10-2022-0005868

(51) Int. Cl.
  *H10K 59/131* (2023.01)
  *H10K 59/40* (2023.01)
  *H10K 50/844* (2023.01)

(52) U.S. Cl.
  CPC ......... *H10K 59/131* (2023.02); *H10K 50/844* (2023.02); *H10K 59/40* (2023.02)

(58) Field of Classification Search
  None
  See application file for complete search history.

(56) References Cited

U.S. PATENT DOCUMENTS

| | | | |
|---|---|---|---|
| 9,899,428 B2 | 2/2018 | Odaka | |
| 10,886,348 B2 | 1/2021 | Kim et al. | |
| 11,099,438 B2 | 8/2021 | Shiina | |
| 2017/0364194 A1* | 12/2017 | Jang | H10K 59/131 |
| 2018/0308903 A1* | 10/2018 | Jeong | G06F 3/0443 |
| 2020/0350390 A1* | 11/2020 | Kim | H10K 50/844 |
| 2020/0356214 A1* | 11/2020 | Kim | G06F 3/0412 |
| 2021/0043871 A1 | 2/2021 | Park et al. | |
| 2021/0193777 A1* | 6/2021 | Du | H01L 27/1248 |
| 2021/0223818 A1 | 7/2021 | Jang et al. | |

FOREIGN PATENT DOCUMENTS

| | | |
|---|---|---|
| JP | 6663249 | 3/2020 |
| KR | 10-2019-0130091 | 11/2019 |
| KR | 1020200129211 | 11/2020 |

* cited by examiner

*Primary Examiner* — Nicholas J Lee
(74) *Attorney, Agent, or Firm* — F. Chau & Associates, LLC

(57) ABSTRACT

A display device includes a base layer, a pixel disposed on the base layer, a signal line electrically connected to the pixel, a signal pad connected to the signal line, and a plurality of insulating layers disposed on the base layer. The signal pad includes a first conductive pattern connected to an end portion of the signal line, a second conductive pattern connected to the first conductive pattern, and at least one insulating pattern disposed between the end portion of the signal line and the second conductive pattern in a cross-sectional view and overlapping the second conductive pattern in a plan view.

29 Claims, 49 Drawing Sheets

FIG. 1A
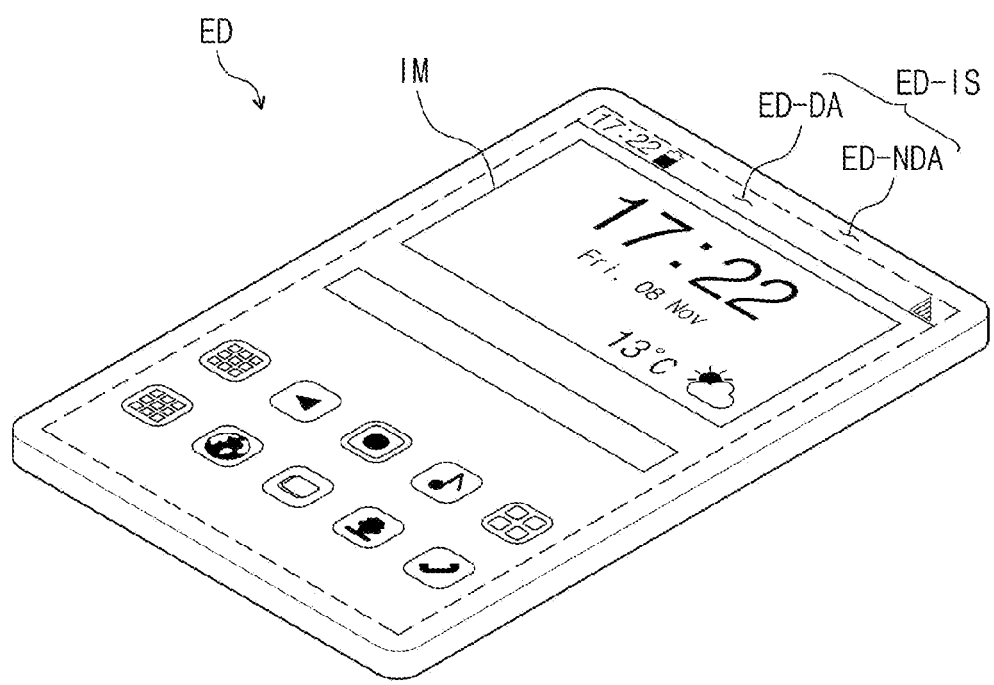
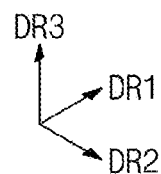

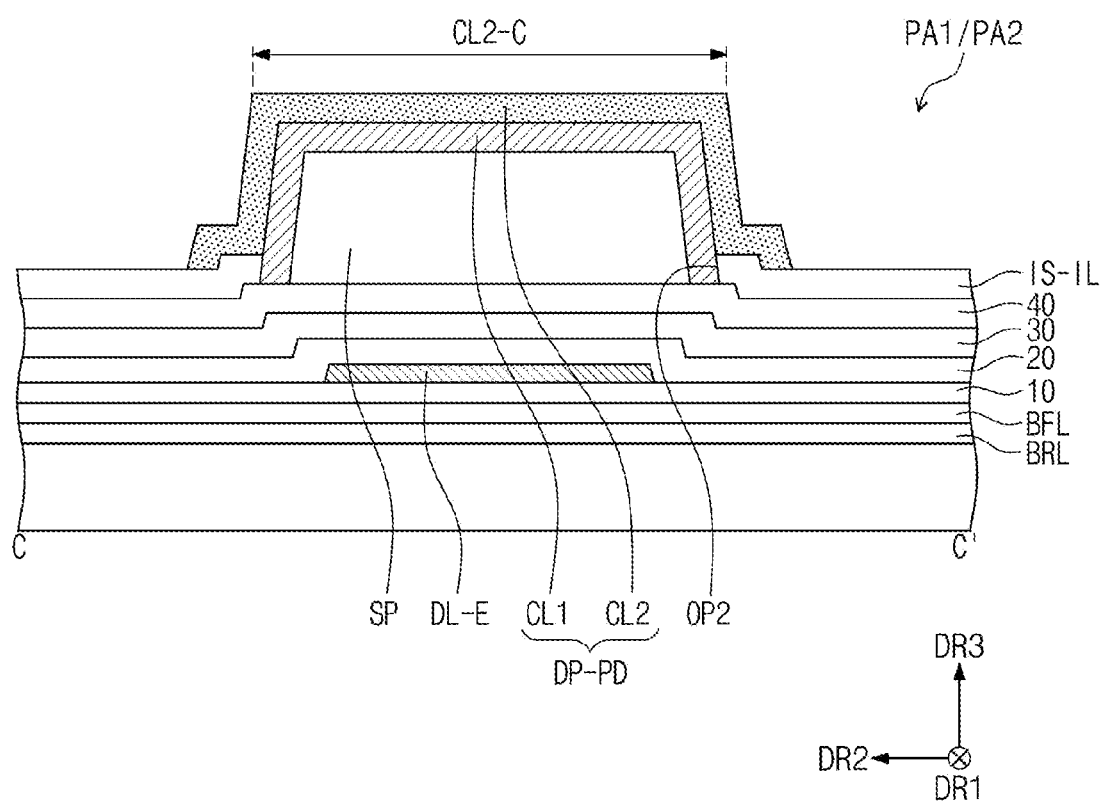

DISPLAY DEVICE

CROSS-REFERENCE TO RELATED APPLICATIONS

This U.S. non-provisional patent application claims priority under 35 U.S.C. § 119 to Korean Patent Application No. 10-2022-0005868, filed on Jan. 14, 2022, the disclosure of which is incorporated by reference herein in its entirety.

TECHNICAL FIELD

Embodiments of the present disclosure relate to a display device, and more particularly, to a pad area of a display device.

DISCUSSION OF RELATED ART

Various display devices utilized in multimedia devices, such as televisions, mobile phones, tablet computers, navigation devices, game devices, etc. are being developed. Some display devices may include a keyboard or a mouse as an input device. In addition, some display devices may include an input sensor, such as a touch panel, as its input device.

Such display devices typically include a display panel and a circuit board. The display panel may be connected to a main board via the circuit board, and the display panel may include a driving chip mounted thereon.

SUMMARY

Embodiments of the present disclosure provide a display device capable of reducing defects of signal pads.

Embodiments of the present disclosure provide a display device including a base layer, a pixel disposed on the base layer, a signal line electrically connected to the pixel, a signal pad connected to the signal line, and a plurality of insulating layers disposed on the base layer. The signal pad includes a first conductive pattern connected to an end portion of the signal line, a second conductive pattern connected to the first conductive pattern, and at least one insulating pattern disposed between the end portion of the signal line and the second conductive pattern in a cross-sectional view and overlapping the second conductive pattern in a plan view. A first group of insulating layers among the insulating layers is disposed between the end portion of the signal line and the first conductive pattern, and the end portion of the signal line is connected to the first conductive pattern via a first contact hole defined through the first group of insulating layers. A second group of insulating layers among the insulating layers is disposed between the first conductive pattern and the second conductive pattern, and the first conductive pattern is connected to the second conductive pattern via a second contact hole defined through the second group of insulating layers.

In an embodiment, the at least one insulating pattern is disposed outside the first contact hole in the plan view.

In an embodiment, the first contact hole is defined inside the second contact hole in the plan view.

In an embodiment, the at least one insulating pattern is in contact with an upper surface of the first group of insulating layers, and the at least one insulating pattern is disposed between the first group of insulating layers and the second conductive pattern when viewed in a cross-section.

In an embodiment, the first contact hole is provided in plural.

In an embodiment, the first contact holes include one side contact hole defined at one side and another side contact hole defined at another side and spaced apart from the one side contact hole. The at least one insulating pattern is disposed between the one side contact hole and the another side contact hole in a direction in which the end portion of the signal line extends.

In an embodiment, the at least one insulating pattern is provided in plural, and the insulating patterns are alternately arranged with the first contact holes in a direction in which the end portion of the signal line extends.

In an embodiment, the at least one insulating pattern is provided in plural, and the insulating patterns include a first insulating pattern disposed at one side and a second insulating pattern disposed at the other side and spaced apart from the first insulating pattern disposed at the one side with the first contact hole interposed therebetween in a direction in which the end portion of the signal line extends.

In an embodiment, the at least one insulating pattern is disposed inside the end portion of the signal line when viewed in the plane.

In an embodiment, the end portion of the signal line extends in a first direction, and a portion of the at least one insulating pattern does not overlap the end portion of the signal line in a second direction crossing the first direction.

In an embodiment, the at least one insulating pattern is in contact with an upper surface of the first conductive pattern, and the at least one insulating pattern is disposed between the first conductive pattern and the second conductive pattern in a cross-sectional view.

In an embodiment, the at least one insulating pattern is disposed inside the first contact hole and the second contact hole in the plan view.

In an embodiment, the at least one insulating pattern is disposed inside the first contact hole and is disposed outside the second contact hole in the plan view.

In an embodiment, the at least one insulating pattern is in contact with an upper surface of the second group of insulating layers, and the at least one insulating pattern is disposed between the second group of insulating layers and the second conductive pattern when viewed in the cross-section.

In an embodiment, at least one of the first conductive pattern and the second conductive pattern surrounds an upper surface of the at least one insulating pattern and a side surface of the at least one insulating pattern.

In an embodiment, at least a portion of a side surface of the at least one insulating pattern is exposed without being covered by the first conductive pattern and the second conductive pattern.

In an embodiment, each of the first conductive pattern and the second conductive pattern does not overlap the side surface of the at least one insulating pattern.

In an embodiment, the first conductive pattern exposes a portion of the side surface of the at least one insulating pattern, and the second conductive pattern does not overlap the side surface of the at least one insulating pattern.

In an embodiment, the first conductive pattern and the second conductive pattern are provided with an opening defined therethrough, and a portion of the opening overlaps a portion of the at least one insulating pattern in the plan view.

In an embodiment, the pixel includes a light emitting element, a transistor electrically connected to the light emitting element and including a semiconductor pattern and a gate overlapping the semiconductor pattern, an upper electrode disposed on the gate, and a plurality of connection electrodes electrically connected to the transistor and disposed on different layers from each other. The end portion of the signal line includes a same material as the gate or the upper electrode, and the first conductive pattern includes a same material as at least one of the connection electrodes.

In an embodiment, the end portion of the signal line and the first conductive pattern include different materials from each other.

In an embodiment, the display device further includes a thin film encapsulation layer disposed on the pixel and a sensing electrode disposed on the thin film encapsulation layer.

In an embodiment, the second conductive pattern includes a same material as the sensing electrode.

Embodiments of the present disclosure provide a display device including a display panel and an input sensor disposed on the display panel, an electronic component electrically connected to the display panel, and an adhesive layer disposed between the display panel and the electronic component. The display panel includes a base layer, a pixel disposed on the base layer, a signal line electrically connected to the pixel, a signal pad connected to the signal line, and a plurality of insulating layers disposed on the base layer. The signal pad includes a first conductive pattern connected to an end portion of the signal line, a second conductive pattern connected to the first conductive pattern, and at least one insulating pattern disposed between the end portion of the signal line and the second conductive pattern in a cross-sectional view and overlapping the end portion of the signal line and the second conductive pattern in a plan view.

In an embodiment, the electronic component includes a bump or a signal pad that is in contact with the second conductive pattern.

In an embodiment, a first group of insulating layers among the insulating layers is disposed between the end portion of the signal line and the first conductive pattern, and the end portion of the signal line is connected to the first conductive pattern via a first contact hole defined through the first group of insulating layers. A second group of insulating layers among the insulating layers is disposed between the first conductive pattern and the second conductive pattern, and the first conductive pattern is connected to the second conductive pattern via a second contact hole defined through the second group of insulating layers.

In an embodiment, the input sensor includes a sensing electrode, and the second conductive pattern includes a same material as the sensing electrode.

In an embodiment, the second conductive pattern and the sensing electrode are in contact with the second group of insulating layers.

In an embodiment, the second group of insulating layers has a multi-layer structure.

In an embodiment, the electronic component includes a driving chip that provides a data signal to the pixel.

According to embodiments of the present disclosure, the display panel is bonded to the electronic component without using an anisotropic conductive film. Thus, a short-circuit caused by conductive balls may be reduced even though the signal pads are densely disposed in the pad area.

According to embodiments of the present disclosure, the insulating pattern disposed in the signal pad of the display panel protrudes toward the electronic component. Accordingly, the signal pad of the display panel is easy to access to a bump or a pad of the signal pad. As the signal pad of the display panel is in tight contact with the bump or the pad of the electronic component, a contact resistance therebetween may be reduced.

According to embodiments of the present disclosure, since the conductive balls are omitted and the signal pad of the display panel is efficiently placed into contact with the bump or the pad of the electronic component, a bonding pressure may be lowered.

Since the bonding pressure may be reduced, physical damage occurring in the display panel or the electronic component may be reduced during the bonding process.

BRIEF DESCRIPTION OF THE DRAWINGS

The above and other features of the present disclosure will become readily apparent by reference to the following detailed description when considered in conjunction with the accompanying drawings, in which:

FIG. 1A is a perspective view of an electronic device according to an embodiment of the present disclosure;

FIGS. 7F to 7P are plan views of pad areas according to embodiments of the present disclosure;

FIG. 9B is a cross-sectional view of the pad areas of FIG. 9A according to an embodiment of the present disclosure;

DETAILED DESCRIPTION

Figure 1B:
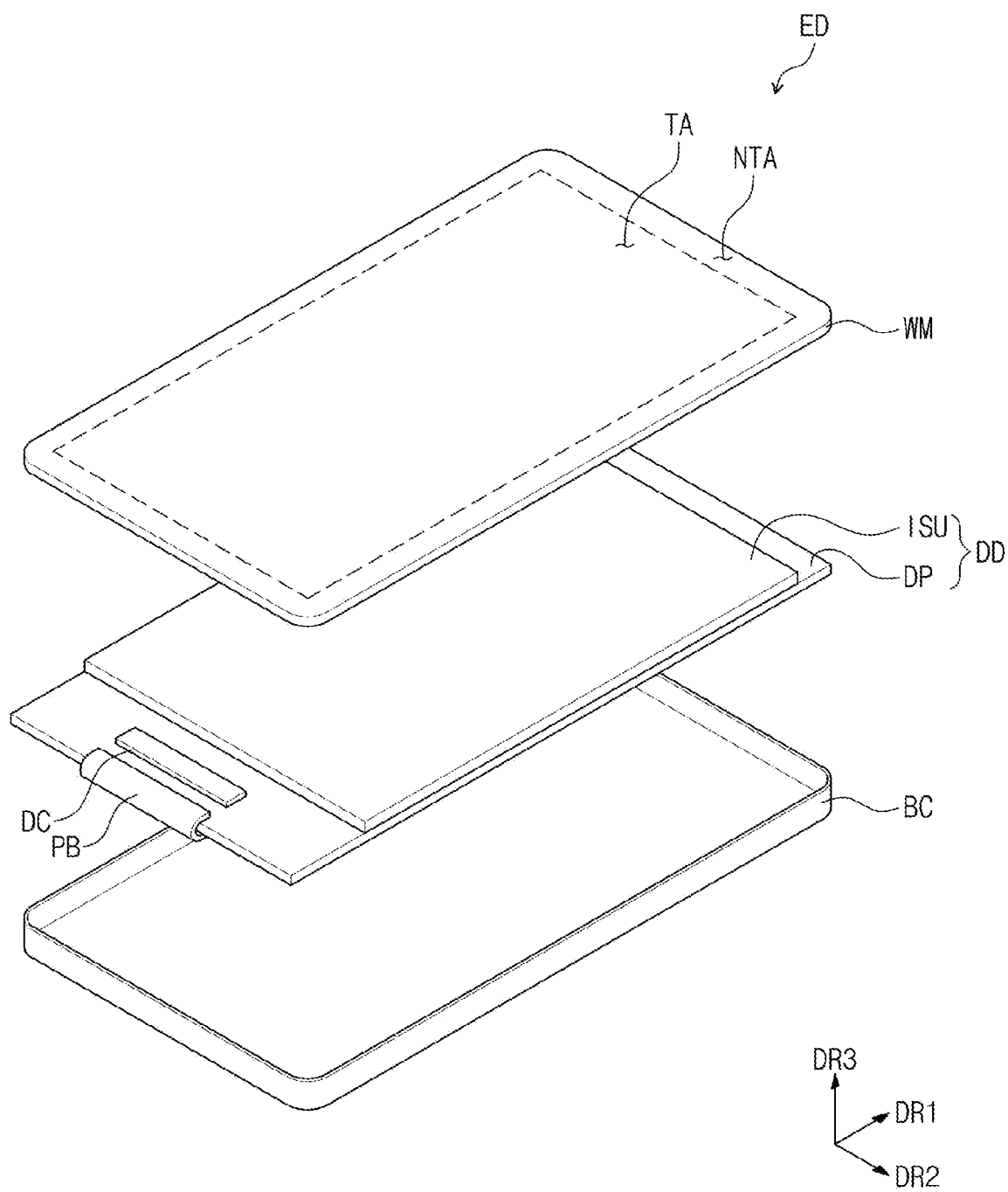
FIG. 1B is an exploded perspective view of an electronic device according to an embodiment of the present disclosure.

Exemplary embodiments of the present disclosure will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

As used herein, the singular forms, "a", "an" and "the" are intended to include the plural forms as well, unless the context clearly indicates otherwise.

Spatially relative terms, such as "beneath", "below", "lower", "above", "upper" etc., may be used herein for ease of description to describe one element or feature's relationship to another element or feature as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

It will be understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Other uses of the term "substantially" should be interpreted in a similar manner FIG. 1A is a perspective view of an electronic device ED according to an embodiment of the present disclosure. FIG. 1B is an exploded perspective view of the electronic device ED according to an embodiment of the present disclosure.

FIGS. 1A and 1B show a mobile phone terminal as a representative example of the electronic device ED. The electronic device ED according to embodiments of the present disclosure may be applied to a large-sized electronic item, such as, for example, a television set and a monitor, and a small and medium-sized electronic item, such as, for example, a tablet computer, a car navigation unit, a game unit, and a smart watch.

Referring to FIG. 1A, the electronic device ED may display an image IM through a display surface ED-IS. FIG. 1A illustrates icon images as a representative example of the image IM. The display surface ED-IS may be substantially parallel to a surface defined by a first direction DR1 and a second direction DR2. A third direction DR3 may indicate a normal line direction of the display surface ED-IS, e.g., a thickness direction of the electronic device ED. Herein, the expressions "when viewed in a plane" or "in a plane", and "in a plan view", may mean a state of being viewed in the third direction DR3 (e.g., in the thickness direction). Front (or upper) and rear (or lower) surfaces of each layer or each unit described below may be distinguished from each other by the third direction DR3.

The display surface ED-IS may include a display area ED-DA through which the image IM is displayed and a non-display area ED-NDA defined adjacent to the display area ED-DA. In embodiments, the image IM is not displayed through the non-display area ED-NDA. However, embodiments of the present disclosure are not limited thereto. For example, according to embodiments, the non-display area ED-NDA may be defined adjacent to one side of the display area ED-DA or may be omitted.

Referring to FIG. 1B, the electronic device ED may include a window WM, a display device DD, and a housing BC. The housing BC may accommodate the display device DD and may be coupled to the window WM. In embodiments, the electronic device ED may further include other electronic modules accommodated in the housing BC and electrically connected to the display device DD. For example, the electronic device ED may further include a main board, a circuit module mounted on the main board, a camera module, a power module, etc.

The window WM may be disposed above the display device DD and may transmit the image provided from the display device DD to outside of the display device DD. The window WM may include a transmission area TA and a non-transmission area NTA. The transmission area TA may overlap the display area ED-DA and may have a shape corresponding to that of the display area ED-DA.

The non-transmission area NTA may overlap the non-display area ED-NDA and may have a shape corresponding to that of the non-display area ED-NDA. The non-transmission area NTA may have a relatively low light transmittance compared to that of the transmission area TA. A bezel pattern may be disposed in an area of a base layer. The area in which the bezel pattern is disposed may be the non-transmission area NTA. The area in which the bezel pattern is not disposed may be the transmission area TA. The base layer of the window WM may include, for example, a glass, sapphire, or plastic material. However, embodiments of the present disclosure are not limited thereto. For example, according to embodiments, the non-transmission area NTA may be omitted.

The display device DD may generate the image and may sense an external input. The display device DD may include a display panel DP and an input sensor ISU. In embodiments, the display device DD may further include an anti-reflective member disposed on the input sensor ISU. The anti-reflective member may include a polarizer and a retarder or may include a color filter and a black matrix.

According to an embodiment, the display panel DP may be a light emitting type display panel. However, the display panel DP is not limited thereto. For example, in embodiments, the display panel DP may be an organic light emitting display panel or an inorganic light emitting display panel. A light emitting layer of the organic light emitting display panel may include an organic light emitting material. A light emitting layer of the inorganic light emitting display panel may include, for example, a quantum dot, a quantum rod, or a nano-LED. Hereinafter, the organic light emitting display panel will be described as a representative example of the display panel DP.

The input sensor ISU may be operated in one of a capacitance method, an optical method, an ultrasonic method, and an electromagnetic induction method. The input sensor ISU may be formed on the display panel DP through successive processes or may be attached to an upper portion of the display panel DP using an adhesive layer after being separately manufactured.

The display device DD may further include a driving chip DC and a circuit board PB. In an embodiment, the driving chip DC may be mounted on the display panel DP. However, embodiments are not limited thereto. The driving chip DC may generate a driving signal utilized for an operation of the display panel DP in response to a control signal applied thereto from the circuit board PB. The circuit board PB may be bonded to the display panel DP, and may be disposed on a rear surface of the display panel DP after being bent. The circuit board PB may be disposed at one end of a base layer BL and may be electrically connected to a circuit element layer DP-CL.

FIG. 1B shows the structure in which the circuit board PB is bent. However, embodiments of the present disclosure are not limited thereto. The display panel DP may be partially bent such that the driving chip DC may face downward. A non-display area of the display panel DP may be bent.

In the above description, the mobile phone terminal is shown as the electronic device ED. However, according to embodiments of the present disclosure, it is sufficient for the electronic device ED to include two or more bonded electronic components. The display panel DP and the driving chip DC mounted on the display panel DP may be different electronic components, and these alone may constitute the electronic device ED. Only the display panel DP and the circuit board PB connected to the display panel DP may constitute the electronic device ED, and only the main board and the electronic module mounted on the main board may constitute the electronic device ED. Hereinafter, the electronic device ED will be described with a focus on the bonding structure between the display panel DP and the driving chip DC mounted on the display panel DP.

Figure 2:
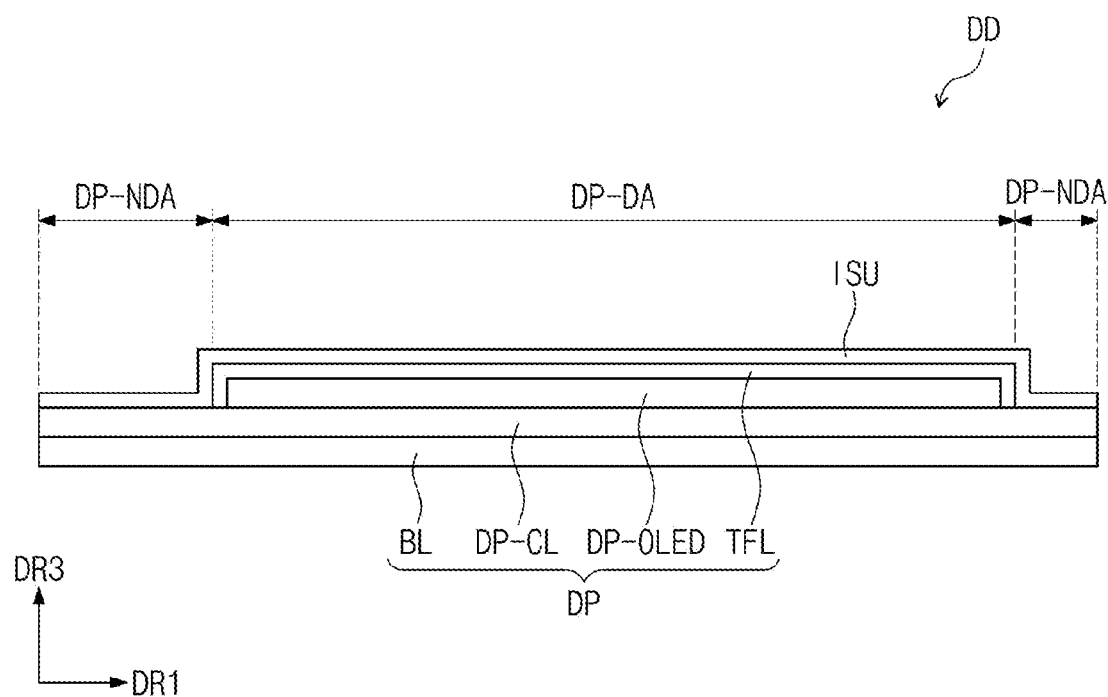
FIG. 2 is a cross-sectional view of a display device according to an embodiment of the present disclosure.
Figure 3:
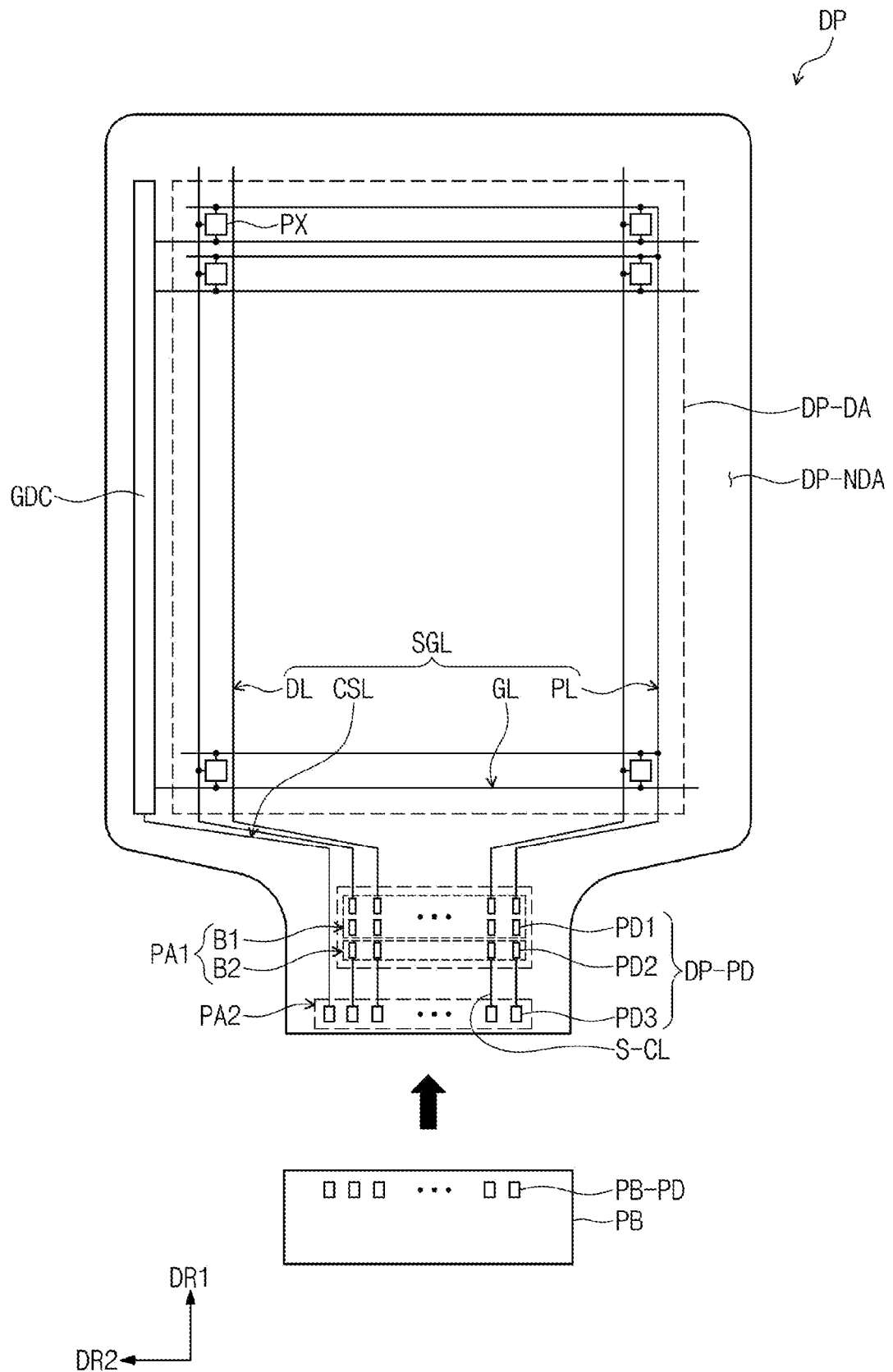
FIG. 3 is a plan view of a display panel according to an embodiment of the present disclosure.

FIG. 2 is a cross-sectional view of the display device DD according to an embodiment of the present disclosure. FIG. 3 is a plan view of the display panel DP according to an embodiment of the present disclosure.

Referring to FIG. 2, the display panel DP may include the base layer BL, the circuit element layer DP-CL, a display element layer DP-OLED, and an upper insulating layer TFL, which are sequentially stacked on the base layer BL. The input sensor ISU may be disposed on the upper insulating layer TFL.

The display panel DP may include a display area DP-DA and a non-display area DP-NDA. The display area DP-DA of the display panel DP may correspond to the display area ED-DA shown in FIG. 1A or the transmission area TA shown in FIG. 1B, and the non-display area DP-NDA may correspond to the non-display area ED-NDA shown in FIG. 1A or the non-transmission area NTA shown in FIG. 1B.

The base layer BL may include at least one plastic film. The base layer BL may include a synthetic resin layer. The synthetic resin layer may include a heat-curable resin. For example, the synthetic resin layer may include a polyimide-based resin. However, embodiments are not limited thereto. The synthetic resin layer may include at least one of, for example, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer BL may include, for example, a glass substrate, a metal substrate, or an organic/inorganic composite material substrate.

The circuit element layer DP-CL may include at least one insulating layer and a circuit element. The insulating layer may include at least one inorganic layer and at least one organic layer. The circuit element may include signal lines and a pixel driving circuit. The insulating layer, a semiconductor layer, and a conductive layer may be formed by coating and deposition processes. Then, the insulating layer, the semiconductor layer, and the conductive layer may be selectively patterned by a photolithography process. A semiconductor pattern, a conductive pattern, and the signal line may be formed by the above-described process. Patterns disposed on the same layer may be formed through the same process. The expression "the patterns are formed through the same process", as used herein, means that the patterns include the same material and have the same stack structure.

The display element layer DP-OLED may include an organic light emitting element. The display element layer DP-OLED may further include an organic layer such as a pixel definition layer.

The upper insulating layer TFL may encapsulate the display element layer DP-OLED. As an example, the upper insulating layer TFL may include a thin film encapsulation layer. The thin film encapsulation layer may have a stack structure of an inorganic layer/organic layer/inorganic layer. The upper insulating layer TFL may protect the display element layer DP-OLED from moisture, oxygen, and a foreign substance such as dust particles. However, embodiments are not limited thereto. According to an embodiment, the upper insulating layer TFL may further include an additional insulating layer in addition to the thin film encapsulation layer. For example, the upper insulating layer TFL may further include an optical insulating layer to control a refractive index.

According to an embodiment, a sealing substrate may be provided rather than the upper insulating layer TFL. In this case, the sealing substrate may face the base layer BL, and the circuit element layer DP-CL and the display element layer DP-OLED may be disposed between the sealing substrate and the base layer BL.

The input sensor ISU may be disposed directly on the display panel DP. In the present disclosure, the expression "a component A is disposed directly on a component B" means that no intervening elements are present between the component A and the component B. In an embodiment, the input sensor ISU may be formed through successive processes with the display panel DP. However, embodiments of the present disclosure are not limited thereto. According to an embodiment, the input sensor ISU may be provided as an individual panel and then may be coupled to the display panel DP by an adhesive layer. According to an embodiment, the input sensor ISU may be omitted.

Referring to FIG. 3, the display panel DP may include a plurality of pixels PX, a gate driving circuit GDC, a plurality of signal lines SGL, and a plurality of signal pads DP-PD.

The pixels PX may be arranged in the display area DP-DA. Each of the pixels PX may include the organic light emitting element and the pixel driving circuit connected to the organic light emitting element. The gate driving circuit GDC may generate a plurality of gate signals and may sequentially output the gate signals to a plurality of gate lines GL, which are described further below. The gate driving circuit GDC may include a transistor formed through the same processes, e.g., a low temperature polycrystalline silicon (LTPS) process or a low temperature polycrystalline oxide (LTPO) process, as a transistor of the pixel PX. The display panel DP may further include another driving circuit to apply a light emission control signal to the pixels PX.

The signal lines SGL may include the gate lines GL, data lines DL, a power line PL, and a control signal line CSL. Each of the gate lines GL may be connected to a corresponding pixel PX among the pixels PX, and each of the data lines DL may be connected to a corresponding pixel PX among the pixels PX. The power line PL may be connected to the pixels PX. The control signal line CSL may provide control signals to the gate driving circuit GDC.

The signal lines SGL may overlap the display area DP-DA and the non-display area DP-NDA. Each of the signal lines SGL may include a pad part and a line part. The line part may overlap the display area DP-DA and the non-display area DP-NDA. The pad part may be connected to an end of the line part. The pad part may overlap a pad area, which is described further below.

Each of the signal pads DP-PD may include first pads PD1, second pads PD2, and third pads PD3. An area in which the first pads PD1 and the second pads PD2 are disposed may be referred to as a first pad area PA1, and an area in which the third pads PD3 are disposed may be referred to as a second pad area PA2. The first pad area PA1 may be an area to which the driving chip DC (refer to FIG. 1B) is bonded, and the second pad area PA2 may be an area to which the circuit board PB (refer to FIG. 1B) is bonded. The first pad area PA1 may include a first area B1 in which the first pads PD1 are disposed and a second area B2 in which the second pads PD2 are disposed. The first pad area PA1 and the second pad area PA2 may be disposed in the non-display area DP-NDA. Some first pads PD1 may be connected to corresponding data lines DL, respectively.

The first pad area PA1 and the second pad area PA2 may be spaced apart from each other in second direction DR2. The second pads PD2 may be connected to the third pads PD3 via connection signal lines S-CL. FIG. 3 shows a structure in which two pad rows are disposed in the first area B1 as a representative example. However, the number of the pad rows disposed in the first area B1 is not limited thereto. According to an embodiment, the number of the pad rows disposed in the first area B1 may be greater than two. The third pads PD3 may be bonded to circuit pads PB-PD of the circuit board PB. The third pads PD3 and the circuit pads PB-PD of the circuit board PB may have a bonding structure that is the same as or different from a bonding structure between the first pad PD1 or the second pad PD2 and bumps of the driving chip DC.

Figure 4:
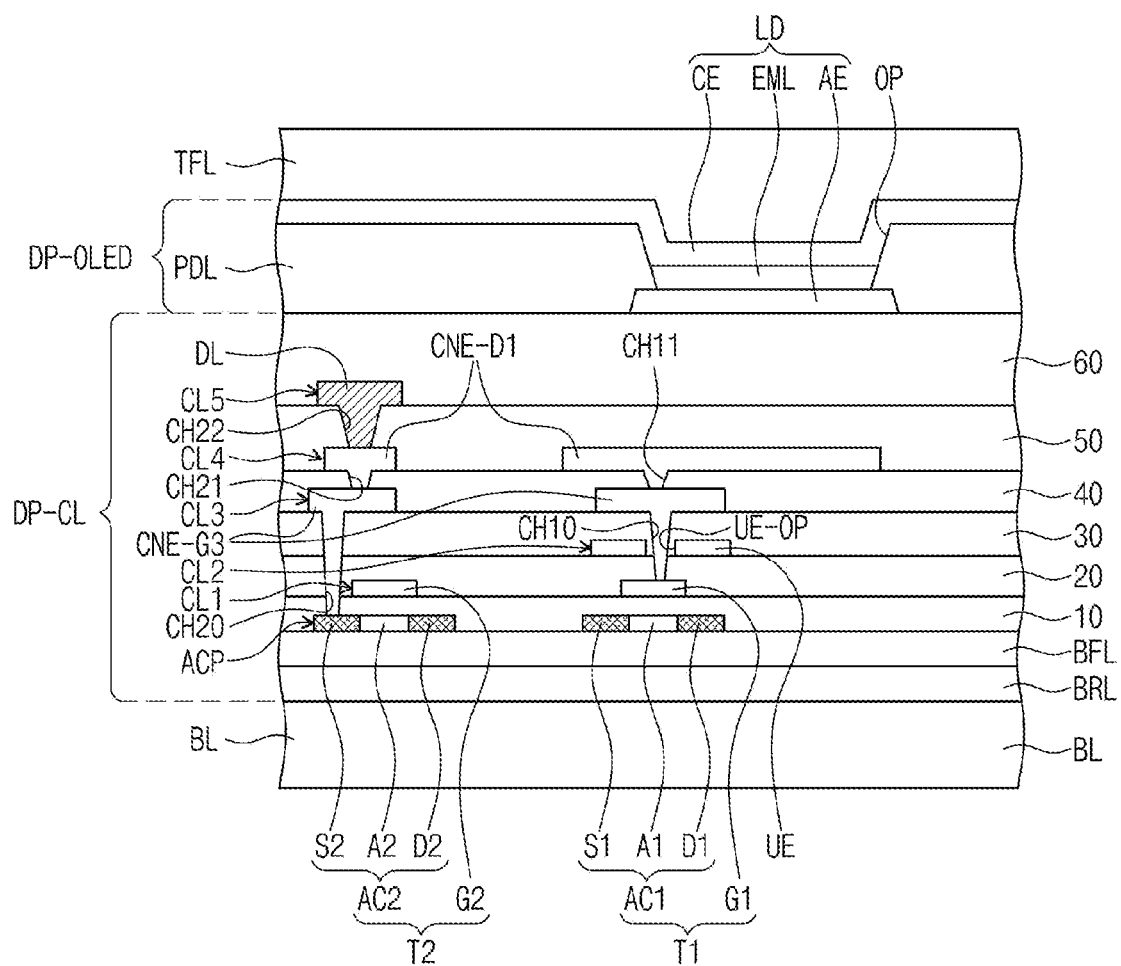
FIG. 4 is a cross-sectional view of a display panel according to an embodiment of the present disclosure.

FIG. 4 is a cross-sectional view of the display panel according to an embodiment of the present disclosure.

Referring to FIG. 4, the display panel may include the base layer BL, the circuit element layer DP-CL, the display element layer DP-OLED, and the upper insulating layer TFL. The circuit element layer DP-CL, the display element layer DP-OLED, and the upper insulating layer TFL may be disposed on the base layer BL. FIG. 4 shows first and second transistors T1 and T2 as the pixel driving circuit.

A plurality of insulating layers may be disposed on an upper surface of the base layer BL. The insulating layers may include a barrier layer BRL and a buffer layer BFL. The barrier layer BRL may prevent a foreign substance from entering the display device DD. The barrier layer BRL may include a silicon oxide layer and a silicon nitride layer. Each of the silicon oxide layer and the silicon nitride layer may be provided in plural, and the silicon oxide layers may be alternately stacked with the silicon nitride layers.

The buffer layer BFL may increase an adhesion between the base layer BL and the semiconductor pattern and/or the conductive pattern. The buffer layer BFL may include a silicon oxide layer and a silicon nitride layer. The silicon oxide layer and the silicon nitride layer may be alternately stacked with each other.

A semiconductor pattern ACP may be disposed on the buffer layer BFL. The semiconductor pattern ACP may include an amorphous or crystalline silicon semiconductor or a metal oxide semiconductor. As shown in FIG. 4, the semiconductor pattern ACP may include a first semiconductor area AC1 and a second semiconductor area AC2. The first semiconductor area AC1 may include a source area S1, a channel area A1, and a drain area D1 of the first transistor T1, and the second semiconductor area AC2 may include a source area S2, a channel area A2, and a drain area D2 of the second transistor T2. According to an embodiment, the first and second transistors T1 and T2 may include different semiconductors from each other. The second transistor T2 may include a material different from that of the first semiconductor area AC1 and may be disposed on a layer different from that of the first semiconductor area AC1.

A first insulating layer 10 may be disposed on the buffer layer BFL. The first insulating layer 10 may cover the semiconductor pattern ACP. The first insulating layer 10 may be an inorganic layer. However, the first insulating layer 10 is not limited thereto. A first conductive layer CL1 may be disposed on the first insulating layer 10. The first conductive layer CL1 may include a plurality of conductive patterns. The first conductive layer CL1 may include a gate G1 of the first transistor T1 and a gate G2 of the second transistor T2. The first conductive layer CL1 may include, for example, molybdenum (Mo), an alloy including molybdenum (Mo), titanium (Ti), or an alloy including titanium (Ti), which has good heat resistance. However, embodiments are not limited thereto. The first conductive layer CL1 may have a single-layer or multi-layer structure.

A second insulating layer 20 may be disposed on the first insulating layer 10 to cover the first conductive layer CL1. The second insulating layer 20 may be an inorganic layer. However, embodiments are not limited thereto. A second conductive layer CL2 may be disposed on the second insulating layer 20. The second conductive layer CL2 may include a plurality of conductive patterns. The second conductive layer CL2 may include an upper electrode UE. The upper electrode UE may overlap the gate G1 of the first transistor T1 and may be provided with an opening UE-OP defined therethrough. The upper electrode UE and the gate G1 of the first transistor T1 overlapping the upper electrode UE may define a capacitor.

A third insulating layer 30 may be disposed on the second insulating layer to cover the second conductive layer CL2. The third insulating layer 30 may be an inorganic layer. However, embodiments are not limited thereto. A third conductive layer CL3 may be disposed on the third insulating layer 30. The third conductive layer CL3 may include a plurality of conductive patterns. The third conductive layer CL3 may include a connection electrode CNE-G3. One connection electrode CNE-G3 may be connected to the gate G1 of the first transistor T1 via a contact hole CH10 defined through the second insulating layer 20 and the third insulating layer 30. The contact hole CH10 may pass through the opening UE-OP. The other connection electrode CNE-G3 may be connected to the source area S2 of the second transistor T2 via a contact hole CH20 defined through the first insulating layer 10, the second insulating layer 20, and the third insulating layer 30. The third conductive layer CL3 may further include a plurality of connection electrodes.

A fourth insulating layer 40 may be disposed on the third insulating layer 30 to cover the third conductive layer CL3. The fourth insulating layer 40 may be an inorganic layer. However, embodiments are not limited thereto. A fourth conductive layer CL4 may be disposed on the fourth insulating layer 40. The fourth conductive layer CL4 may include a plurality of conductive patterns. The fourth conductive layer CL4 may include connection electrodes CNE-D1. The connection electrodes CNE-D1 may be connected to corresponding connection electrodes CNE-G3, respectively, via contact holes CH11 and CH21 defined through the fourth insulating layer 40.

A fifth insulating layer 50 may be disposed on the fourth insulating layer 40 to cover the fourth conductive layer CL4. The fifth insulating layer 50 may be an organic layer. However, embodiments are not limited thereto. A fifth conductive layer CL5 may be disposed on the fifth insulating layer 50. The fifth conductive layer CL5 may include a plurality of conductive patterns. The fifth conductive layer CL5 may include the data line DL. The data line DL may be connected to a corresponding connection electrode CNE-D1 via a contact hole CH22 defined through the fifth insulating layer 50. The fifth conductive layer CL5 may further include a plurality of connection electrodes.

A sixth insulating layer 60 may be disposed on the fifth insulating layer 50 to cover the fifth conductive layer CL5. The sixth insulating layer 60 may be an organic layer. However, embodiments are not limited thereto. A light emitting element LD may be disposed on the sixth insulating layer 60. A first electrode AE of the light emitting element LD may be disposed on the sixth insulating layer 60. The first electrode AE may be an anode. A pixel definition layer PDL may be disposed on the sixth insulating layer 60.

The pixel definition layer PDL may be provided with an opening OP defined therethrough to expose at least a portion of the first electrode AE. The opening OP of the pixel definition layer PDL may define a light emitting area. A light emitting layer EML may be disposed on the first electrode AE. Although a patterned light emitting layer EML is shown as a representative example, embodiments of the present disclosure are not limited thereto. For example, in embodiments, the light emitting layer EML may be commonly disposed in the pixels PX (refer to FIG. 3). The light emitting layer EML that is commonly disposed may generate a white light or a blue light. In addition, the light emitting layer EML may have a multi-layer structure.

In embodiments, a hole transport layer may be further disposed between the first electrode AE and the light emitting layer EML. A hole injection layer may be further disposed between the hole transport layer and the first electrode AE. The hole transport layer or the hole injection layer may be commonly disposed in the pixels PX (refer to FIG. 3).

A second electrode CE may be disposed on the light emitting layer EML. In embodiments, an electron transport layer may be further disposed between the second electrode CE and the light emitting layer EML. An electron injection layer may be further disposed between the electron transport layer and the second electrode CE. The electron transport layer or the electron injection layer may be commonly disposed in the pixels PX (refer to FIG. 3).

Figure 5A:
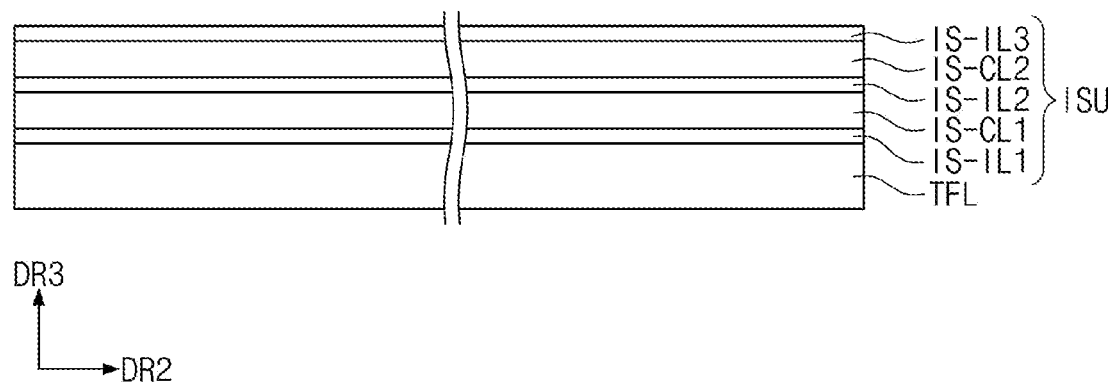
FIG. 5A is a cross-sectional view of an input sensor according to an embodiment of the present disclosure.
Figure 5B:
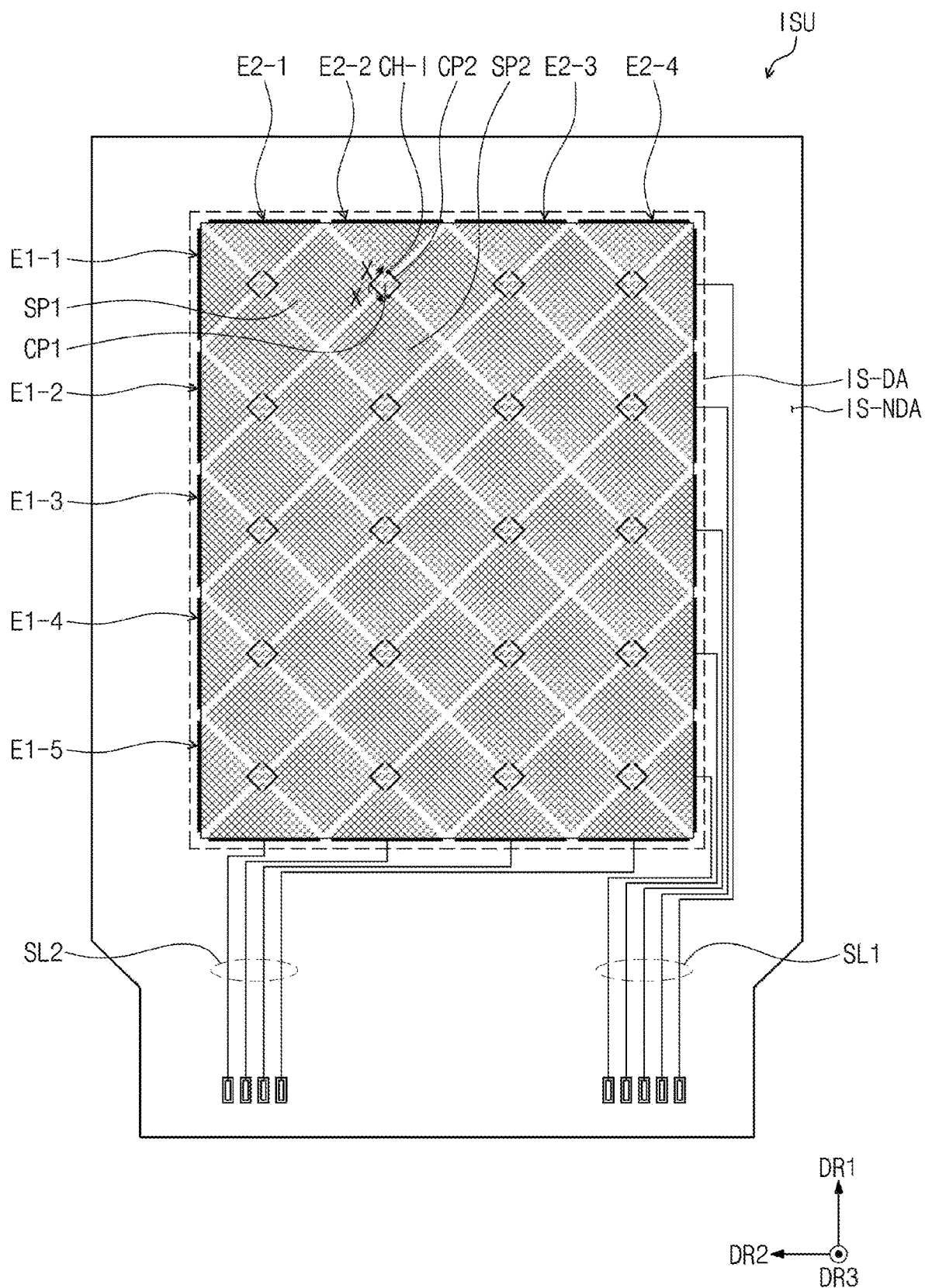
FIG. 5B is a plan view of an input sensor according to an embodiment of the present disclosure.
Figure 5C:
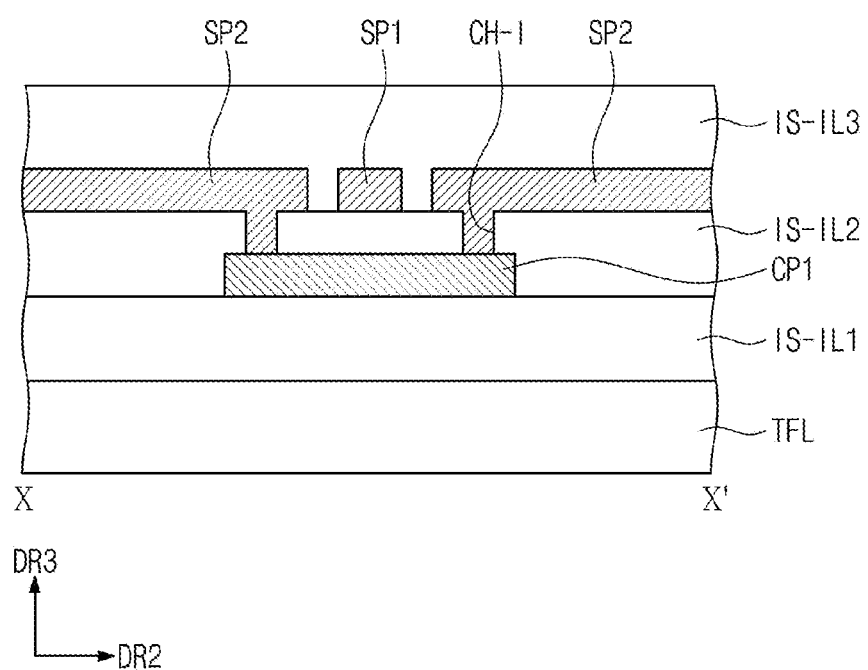
FIG. 5C is a cross-sectional view taken along a line X-X' of FIG. 5B according to an embodiment of the present disclosure.

FIG. 5A is a cross-sectional view of the input sensor ISU according to an embodiment of the present disclosure. FIG. 5B is a plan view of the input sensor ISU according to an embodiment of the present disclosure. FIG. 5C is a cross-sectional view of a bridge pattern of the input sensor ISU according to an embodiment of the present disclosure.

The input sensor ISL may include a first insulating layer IS-IL1 (hereinafter, referred to as a first sensing insulating layer), a first conductive pattern layer IS-CL1, a second insulating layer IS-IL2 (hereinafter, referred to as a second sensing insulating layer), a second conductive pattern layer IS-CL2, and a third insulating layer IS-IL3 (hereinafter, referred to as a third sensing insulating layer). The first sensing insulating layer IS-IL1 may be disposed directly on the upper insulating layer TFL.

According to an embodiment, the first sensing insulating layer IS-IL1 and/or the third sensing insulating layer IS-IL3 may be omitted. When the first sensing insulating layer IS-IL1 is omitted, the first conductive pattern layer IS-CL1 may be disposed on an insulating layer disposed at an uppermost position of the upper insulating layer TFL. The third sensing insulating layer IS-IL3 may be replaced with an adhesive layer or an insulating layer of an anti-reflective member disposed on the input sensor ISU.

The first conductive pattern layer IS-CL1 may include first conductive patterns, and the second conductive pattern layer IS-CL2 may include second conductive patterns. Hereinafter, the first conductive pattern layer IS-CL1 and the first conductive patterns are assigned with the same reference numeral, and the second conductive pattern layer IS-CL2 and the second conductive patterns are assigned with the same reference numeral.

Each of the first conductive patterns IS-CL1 and the second conductive patterns IS-CL2 may have a single-layer structure, however, each of the first conductive patterns IS-CL1 and the second conductive patterns IS-CL2 may have a multi-layer structure of layers stacked in the third direction DR3. The conductive pattern having the multi-layer structure may include two or more layers among transparent conductive layers and metal layers. The conductive pattern having the multi-layer structure may include metal layers containing different metals from each other. The transparent conductive layer may include, for example, indium tin oxide (ITO), indium zinc oxide (IZO), zinc oxide (ZnO), indium tin zinc oxide (ITZO), PEDOT, metal nanowire, or graphene. The metal layer may include, for example, molybdenum, silver, titanium, copper, aluminum, or alloys thereof. The stack structure of each of the first conductive pattern layer IS-CL1 and the second conductive pattern layer IS-CL2 will be described further below.

In an embodiment, each of the first sensing insulating layer IS-IL1 to the third sensing insulating layer IS-IL3 may include an inorganic layer or an organic layer. In an embodiment, the first sensing insulating layer IS-IL1 to the third sensing insulating layer IS-IL3 may include the inorganic layer. The inorganic layer may include, for example, silicon oxide, silicon nitride, or silicon oxynitride.

According to an embodiment, at least one of the first sensing insulating layer IS-IL1 to the third sensing insulating layer IS-IL3 may be an organic layer. For example, the third sensing insulating layer IS-IL3 may include the organic layer. The organic layer may include at least one of, for example, an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Referring to FIG. 5B, the input sensor ISU may include a sensing area IS-DA and a non-sensing area IS-NDA adjacent to the sensing area IS-DA. The sensing area IS-DA and the non-sensing area IS-NDA may correspond to the display area DP-DA and the non-display area DP-NDA shown in FIG. 2, respectively.

The input sensor ISU may include a plurality of sensing electrodes E1-1 to E1-5 and E2-1 to E2-4. The plurality of sensing electrodes E1-1 to E1-5 and E2-1 to E2-4 may include first sensing electrodes E1-1 to E1-5 (hereinafter, the first electrodes) and second sensing electrodes E2-1 to E2-4 (hereinafter, the second electrodes), which are disposed in the sensing area IS-DA and are insulated from each other while crossing each other. The input sensor ISU may include first signal lines SL1 disposed in the non-sensing area IS-NDA and electrically connected to the first electrodes E1-1 to E1-5, and second signal lines SL2 disposed in the non-sensing area IS-NDA and electrically connected to the second electrodes E2-1 to E2-4. The first electrodes E1-1 to E1-5, the second electrodes E2-1 to E2-4, the first signal lines SL1, and the second signal lines SL2 may be defined by combinations of the first conductive patterns IS-CL1 and the second conductive patterns IS-CL2 described with reference to FIG. 5A.

Each of the first electrodes E1-1 to E1-5 and the second electrodes E2-1 to E2-4 may include a plurality of conductive lines. The conductive lines may define a plurality of openings, and each of the first electrodes E1-1 to E1-5 and the second electrodes E2-1 to E2-4 may have a mesh shape. Each of the openings may be defined to correspond to the opening OP of the pixel definition layer PDL shown in FIG. 4.

One of the first electrodes E1-1 to E1-5 and the second electrodes E2-1 to E2-4 may have an integral shape. In an embodiment, the first electrodes E1-1 to E1-5 may have the integral shape. The first electrodes E1-1 to E1-5 may include sensing portions SP1 and intermediate portions CP1. A portion of the second conductive patterns IS-CL2 may correspond to the first electrodes E1-1 to E1-5.

Each of the second electrodes E2-1 to E2-4 may include sensing patterns SP2 and bridge patterns CP2 (also referred to as connection patterns). As shown in FIGS. 5B and 5C, two sensing patterns SP2 adjacent to each other may be connected to each other by two bridge patterns CP2 via contact holes CH-I defined through the second sensing insulating layer IS-IL2. However, the number of the bridge patterns is not limited thereto. A portion of the second conductive patterns IS-CL2 may correspond to the sensing patterns SP2. A portion of the first conductive patterns IS-CL1 may correspond to the bridge patterns CP2.

In an embodiment, the bridge patterns CP2 may be formed from the first conductive patterns IS-CL1 shown in FIG. 5A, and the first electrodes E1-1 to E1-5 and the sensing patterns SP2 may be formed from the second conductive patterns IS-CL2. However, formation of these components is not limited thereto. According to an embodiment, the first electrodes E1-1 to E1-5 and the sensing patterns SP2 may be formed from the first conductive patterns IS-CL1 shown in FIG. 5A, and the bridge patterns CP2 may be formed from the second conductive patterns IS-CL2 shown in FIG. 5A.

One of the first signal lines SL1 and the second signal lines SL2 may receive a transmission signal from an external circuit to sense the external input, and the other one of the first signal lines SL1 and the second signal lines SL2 may apply a variation in capacitance between the first electrodes E1-1 to E1-5 and the second electrodes E2-1 to E2-4 to the external circuit as a reception signal.

A portion of the second conductive patterns IS-CL2 may correspond to the first signal lines SL1 and the second signal lines SL2. The first signal lines SL1 and the second signal lines SL2 may have a multi-layer structure and may include a first layer line formed from the first conductive patterns IS-CL1 and a second layer line formed from the second conductive patterns IS-CL2. The first layer line and the second layer line may be connected to each other via a contact hole defined through the second sensing insulating layer IS-IL2 (refer to FIG. 5A).

Figure 6:
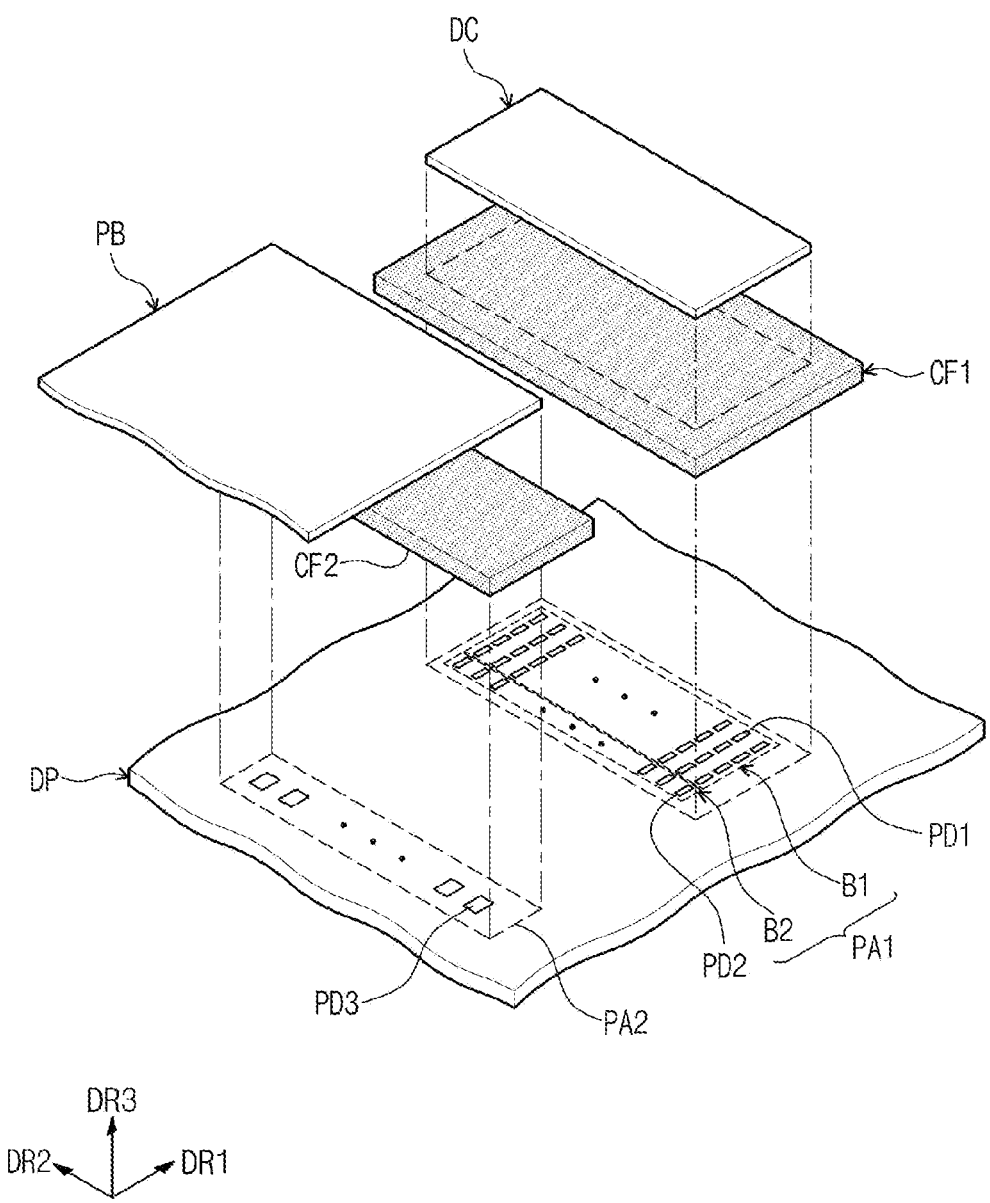
FIG. 6 is an exploded perspective view of a pad area of a display device according to an embodiment of the present disclosure.

FIG. 6 is an exploded perspective view of the pad areas PA1 and PA2 of the display device according to an embodiment of the present disclosure.

Referring to FIG. 6, the driving chip DC may be bonded to the first pad area PA1 by a first adhesive layer CF1, and the circuit board PB may be bonded to the second pad area PA2 by a second adhesive layer CF2. According to an embodiment, the first adhesive layer CF1 and the second adhesive layer CF2 do not include a conductive ball and may include only a synthetic resin.

In embodiments, the driving chip DC may include first bumps electrically connected to the first pads PD1, respectively, and second bumps electrically connected to the second pads PD2, respectively. The driving chip DC may receive first signals from outside of the driving chip DC via the second pads PD2 and the second bumps. The driving chip DC may apply second signals generated based on the first signals to the first pads PD1 via the first bumps. For example, the driving chip DC may include a data driving circuit. The first signal may be an image signal that is a digital signal provided from outside of the driving chip DC, and the second signal may be a data signal that is an analog signal. The driving chip DC may generate an analog voltage corresponding to a grayscale value of the image signal. The data signal may be applied to the pixel PX via the data line DL shown in FIG. 3.

The circuit board PB may include signal pads electrically connected to the third pads PD3, respectively. The circuit board PB may apply the image signal, the driving voltage, and other control signals to the driving chip DC.

Figure 7A:
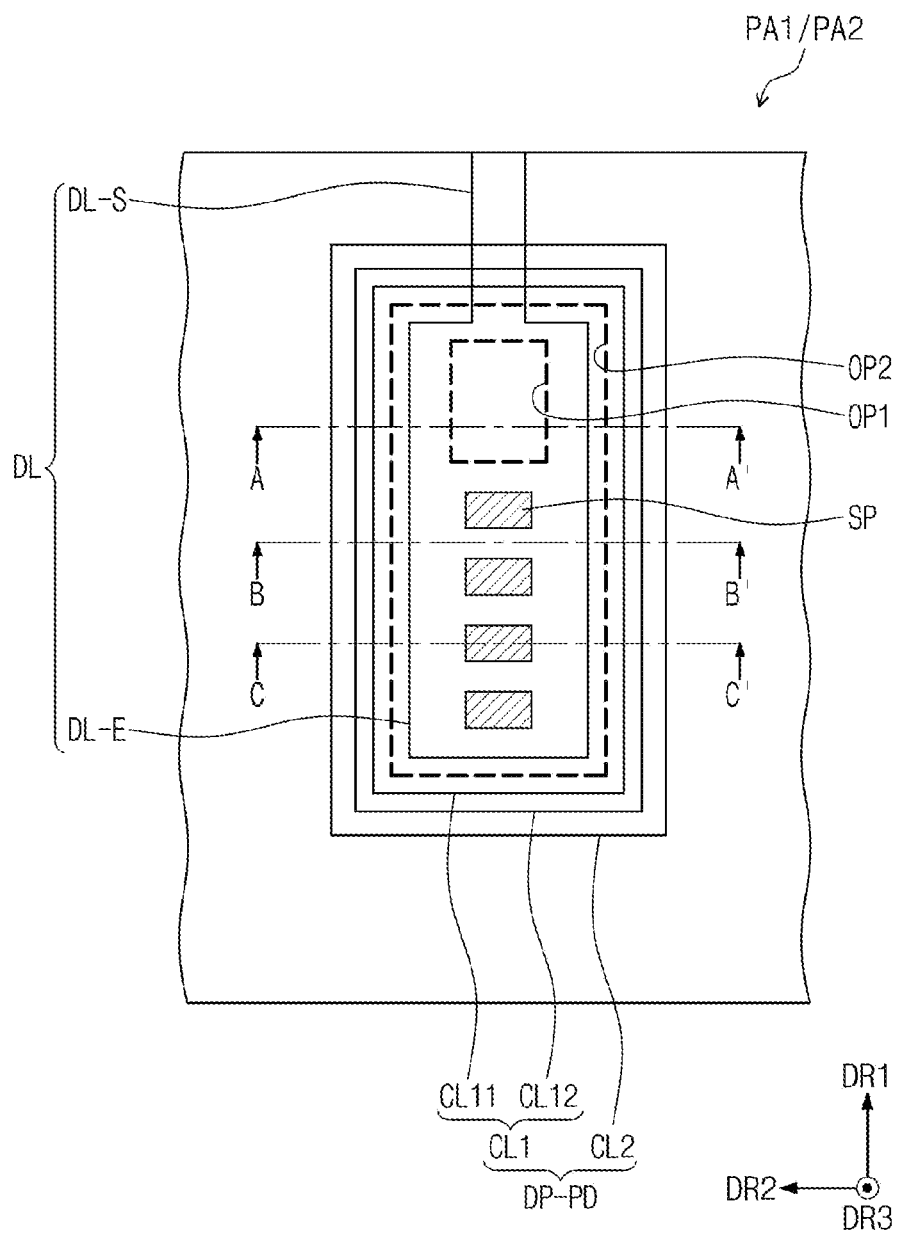
FIG. 7A is a plan view of a pad area according to an embodiment of the present disclosure.

FIG. 7A is a plan view of the pad areas according to an embodiment of the present disclosure. FIGS. 7B to 7E are cross-sectional views of pad areas of FIG. 7A according to embodiments of the present disclosure. FIGS. 7F to 7P are plan views of pad areas according to embodiments of the present disclosure. FIG. 8 is a cross-sectional view of a bonding structure of the electronic device according to an embodiment of the present disclosure.

The signal pad DP-PD shown in FIG. 7A may be one of the first to third pads PD1 to PD3 described with reference to FIG. 6. FIG. 7A shows the data line DL including an end portion DL-E and a line portion DL-S, which have different widths, as a representative example of the signal line. However, embodiments of the present disclosure are not limited thereto. The signal line may be a signal line other than the data line DL and may have a uniform width in both the end portion DL-E and the line portion DL-S.

Referring to FIGS. 7A to 7D, the signal pad DP-PD may include the first conductive pattern CL1 connected to the data line DL, the second conductive pattern CL2 connected to the first conductive pattern CL1, and at least one insulating pattern SP overlapping the second conductive pattern CL2 when viewed in a plane. Since the signal pad DP-PD includes the insulating pattern SP that is a non-conductive material, the signal pad DP-PD may be defined as a signal pad structure. FIG. 7A shows a structure in which the signal pad DP-PD includes four insulating patterns SP as a representative example.

When viewed in the plane, each of the insulating patterns SP may have a rectangular shape. However, the shape of the insulating patterns SP is not limited thereto. For example, according to an embodiment, each of the insulating patterns SP may have a circular shape or an oval shape. The insulating patterns SP are not limited to having the same shape as one another.

Referring to FIGS. 7A to 7D, the end portion DL-E may be disposed on the first insulating layer 10. The end portion DL-E may be disposed on the same layer as the gates G1 and G2 shown in FIG. 4. The end portion DL-E may be formed through the same process as the gates G1 and G2.

However, the location of the end portion DL-E is not limited thereto. The end portion DL-E may be disposed on the same layer as, may include the same material as, and may have the same stack structure as that of the upper electrode UE or the connection electrode CNE-G3 of the third conductive layer CL3 shown in FIG. 4. Some of the signal lines may be formed through the same process as the gates G1 and G2, and the other of the signal lines may be formed through the same process as the upper electrode UE or the connection electrode CNE-G3 of the third conductive layer CL3.

The data line DL may be disposed on a single layer and may have an integral shape. However, embodiments are not limited thereto. One data line DL may include a plurality of portions disposed on different layers from each other. For example, the line portion DL-S may include two or more portions.

The signal pad DP-PD may include the first conductive pattern CL1 connected to the end portion DL-E and the second conductive pattern CL2 connected to the first conductive pattern CL1. The end portion DL-E, the first conductive pattern CL1, and the second conductive pattern CL2 may be distinguished from each other depending on whether the insulating layers 20 to IS-IL2 are disposed between the end portion DL-E, the first conductive pattern CL1, and the second conductive pattern CL2, or depending on whether the end portion DL-E, the first conductive pattern CL1, and the second conductive pattern CL2 are connected to each other through contact holes OP1 and OP2.

The first conductive pattern CL1 may be disposed on the fourth insulating layer 40. The first conductive pattern CL1 may be connected to the end portion DL-E via a first contact hole OP1 defined through the second insulating layer 20 to the fourth insulating layer 40. The second insulating layer 20 to the fourth insulating layer 40 may be formed through the same process as the second insulating layer 20 to the fourth insulating layer 40 of the display area DP-DA shown in FIG. 4. The stack structure of the insulating layer through which the first contact hole OP1 is defined may be changed according to the stack structure of the circuit element layer DP-CL. According to an embodiment, the first contact hole OP1 may be defined to penetrate a greater number of insulating layers than the number of the second to fourth insulating layers 20 to 40.

The first conductive pattern CL1 and the end portion DL-E may be distinguished from each other by the second insulating layer 20 to the fourth insulating layer interposed therebetween. In an embodiment, the second insulating layer 20 to the fourth insulating layer 40 may be defined as a first group of insulating layers. The stack structure of the first group of insulating layers may be changed.

The first conductive pattern CL1 may include a first layer CL11 and a second layer CL12. Since the insulating layer is not disposed between the first layer CL11 and the second layer CL12, the first layer CL11 and the second layer CL12 may be defined as one conductive pattern. In an embodiment, the first layer CL11 and the second layer CL12 are not connected to each other via a contact hole. The first layer CL11 may be formed through the same process as the fourth conductive layer CL4 of FIG. 4, and the second layer CL12 may be formed through the same process as the fifth conductive layer CL5 of FIG. 4. In an embodiment, the fifth insulating layer 50 and the sixth insulating layer 60 shown in FIG. 4 are not disposed in the pad areas PA1 and PA2. According to an embodiment, one of the first layer CL11 and the second layer CL12 may be omitted. According to an embodiment, the first conductive pattern CL1 may be omitted.

The second conductive pattern CL2 may be disposed on the second sensing insulating layer IS-IL2 of the input sensor ISU. The second conductive pattern CL2 may be formed through the same process as the second conductive pattern layer IS-CL2 of FIG. 5A and the sensing patterns SP2 of FIG. 5C. When viewed in a plane, the second conductive pattern CL2 may have an area greater than that of the first conductive pattern CL1. However, embodiments are not limited thereto. The second conductive pattern CL2 and the first conductive pattern CL1 may have the same area, and edges of the second conductive pattern CL2 and the first conductive pattern CL1 may be substantially aligned with each other.

The second conductive pattern CL2 may be connected to the first conductive pattern CL1 via a second contact hole OP2 defined through the first sensing insulating layer IS-IL1 of the input sensor ISU and the second sensing insulating layer IS-IL2 of the input sensor ISU. The first sensing insulating layer IS-IL1 and the second sensing insulating layer IS-IL2 may overlap the sensing area IS-DA and the non-sensing area IS-NDA shown in FIG. 5B. Accordingly, the first sensing insulating layer IS-IL1 and the second sensing insulating layer IS-IL2 may overlap the pad areas PA1 and PA2.

The second conductive pattern CL2 and the first conductive pattern CL1 may be distinguished from each other by the first sensing insulating layer IS-IL1 and the second sensing insulating layer IS-IL2 interposed therebetween. In an embodiment, the first sensing insulating layer IS-IL1 and the second sensing insulating layer IS-IL2 may be defined as a second group of insulating layers IS-IL. According to an embodiment, one of the first sensing insulating layer IS-IL1 and the second sensing insulating layer IS-IL2 may be omitted.

Referring to FIG. 7A, the first contact hole OP1 may overlap a portion of the end portion DL-E when viewed in a plane. The end portion DL-E may extend in the first direction DR1, and the insulating patterns SP may be aligned with the first contact hole OP1 in the first direction DR1. When viewed in the plane, the insulating patterns SP may be disposed at an outer side of the first contact hole OP1, and the insulating patterns SP may be disposed at an inner side of the second contact hole OP2. When viewed in the plane, the first contact hole OP1 may be defined inside the second contact hole OP2.

Figure 7B:
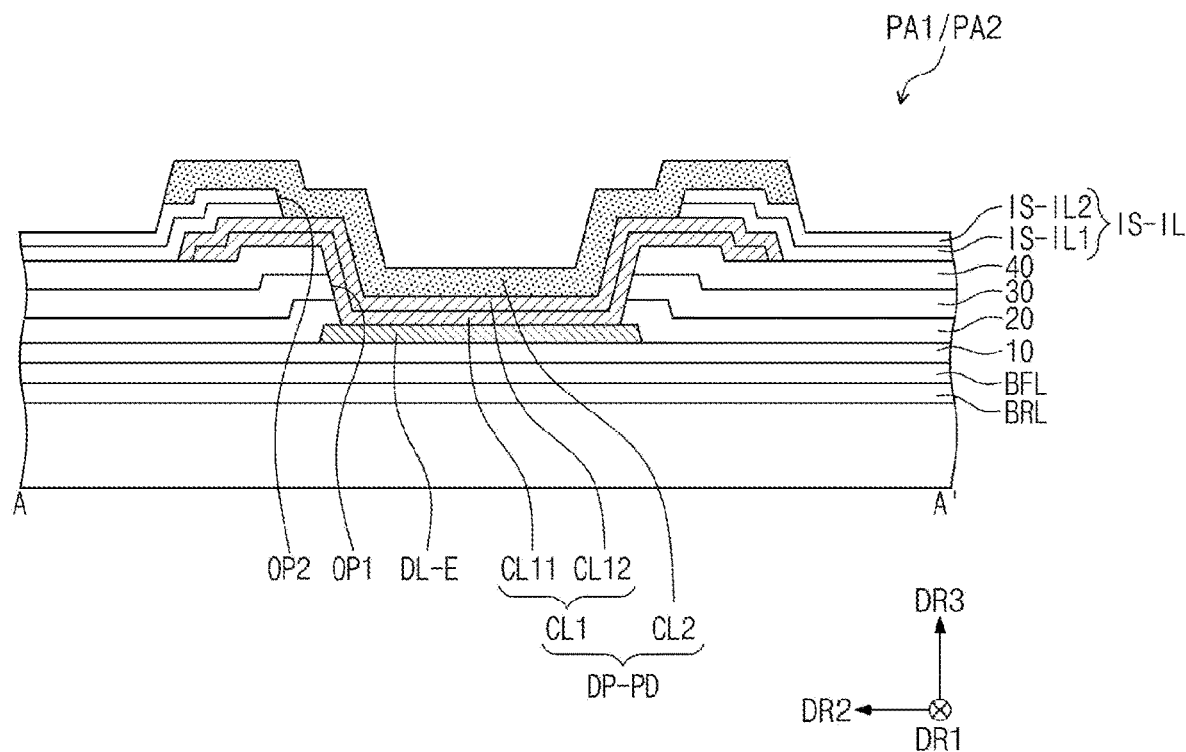
FIGS. 7B to 7E are cross-sectional views of the pad area of FIG. 7A according to embodiments of the present disclosure.
Figure 8:
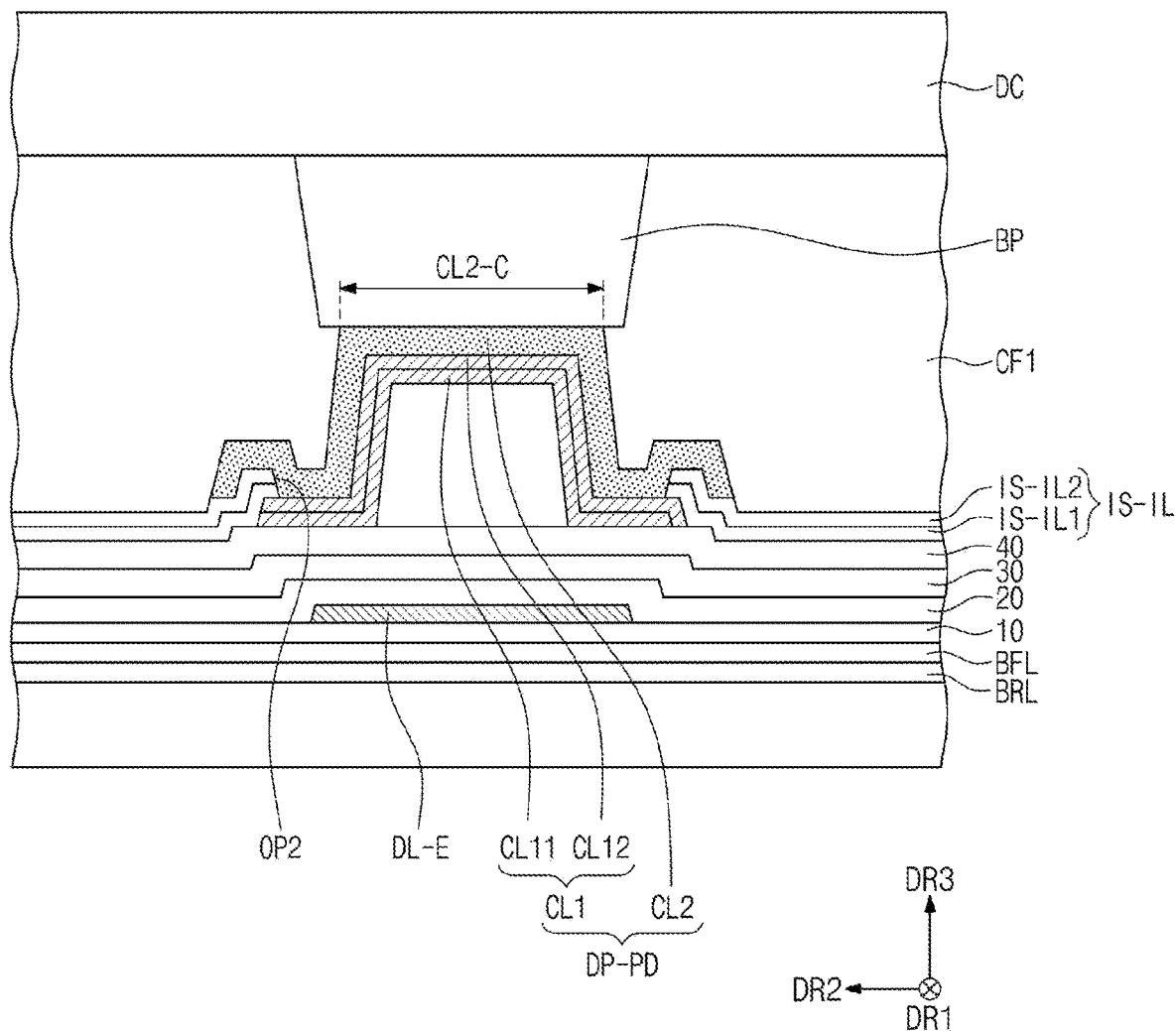
FIG. 8 is a cross-sectional view of a bonding structure of an electronic device according to an embodiment of the present disclosure.

Referring to FIGS. 7A and 7B, the first conductive pattern CL1 may be in contact with the end portion DL-E via the first contact hole OP1. A contact area between the first conductive pattern CL1 and the end portion DL-E may be determined by a size of the first contact hole OP1.

Figure 7C:
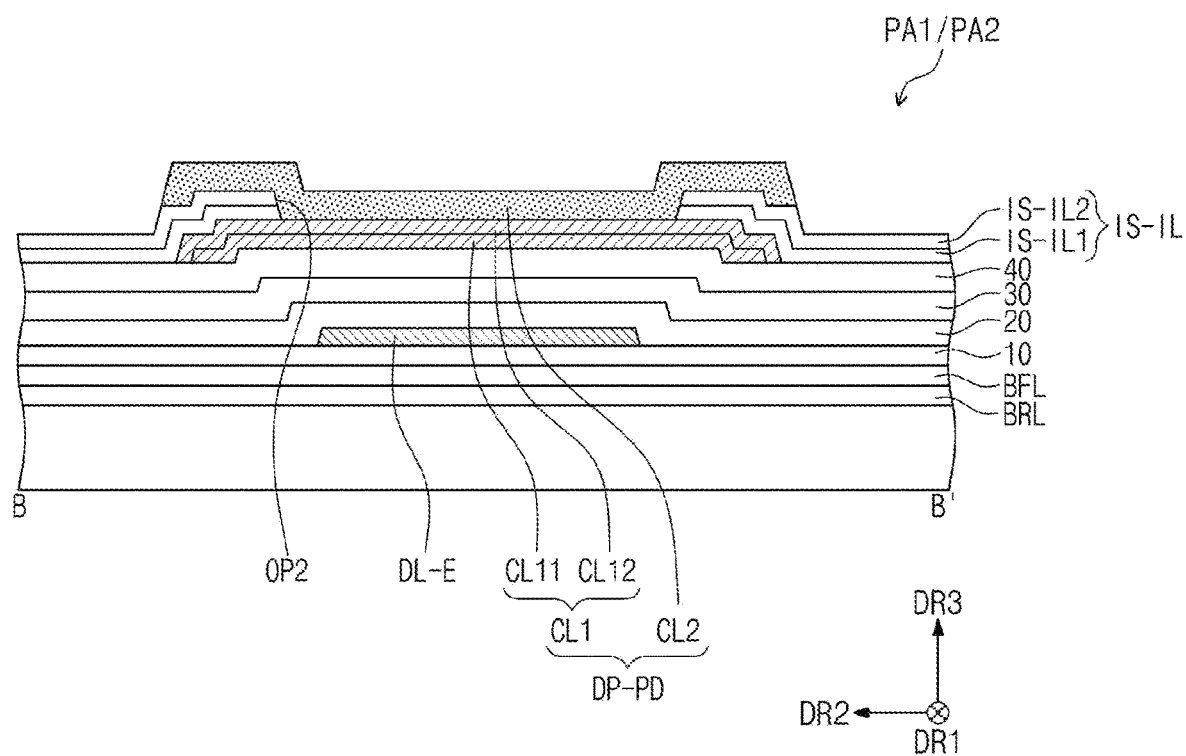

Referring to FIGS. 7A and 7C, a portion of the first conductive pattern CL1, which does not overlap the first contact hole OP1, may be disposed on the fourth insulating layer 40. A portion of the second conductive pattern CL2, which does not overlap the first contact hole OP1, may be disposed on the first conductive pattern CL1 and may be in contact with the first conductive pattern CL1 via the second contact hole OP2.

A portion of the second conductive pattern CL2 may be disposed on the second sensing insulating layer IS-IL2. The second sensing insulating layer IS-IL2 may be disposed between the portion of the second conductive pattern CL2 and the portion of the first conductive pattern CL1.

Figure 7D:
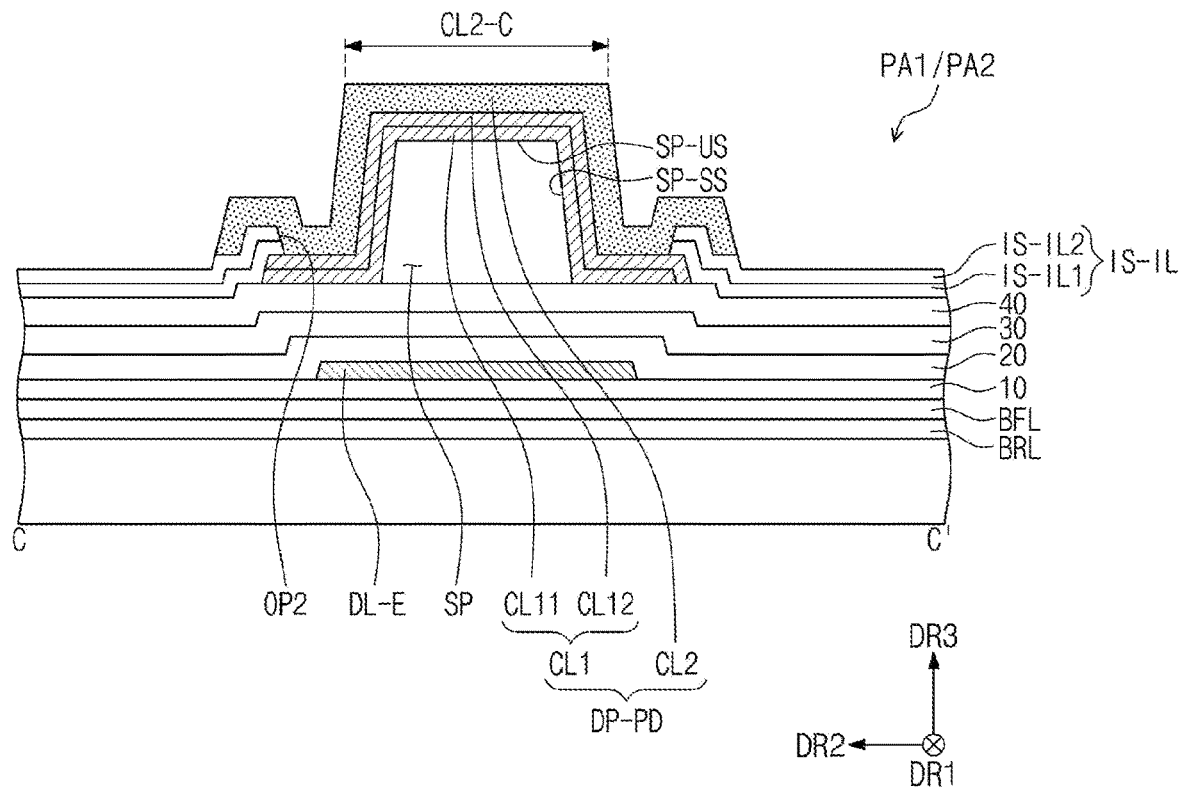

Referring to FIGS. 7A and 7D, the other portion of the second conductive pattern CL2, which does not overlap the first contact hole OP1, may overlap the insulating pattern SP. The portion of the first conductive pattern CL1 may be disposed between the portion of the second conductive pattern CL2 and the insulating pattern SP. An upper surface SP-US and a side surface SP-SS of the insulating pattern SP may be surrounded by the first conductive pattern CL1.

The insulating pattern SP may include a polymer. The insulating pattern SP may include a heat-curable polymer. However, embodiments are not limited thereto. According to an embodiment, the insulating pattern SP may include a thermoplastic polymer. In an embodiment, the insulating pattern SP, which is disposed on the fourth insulating layer and is in contact with the fourth insulating layer 40, is shown as an example.

Figure 7E:
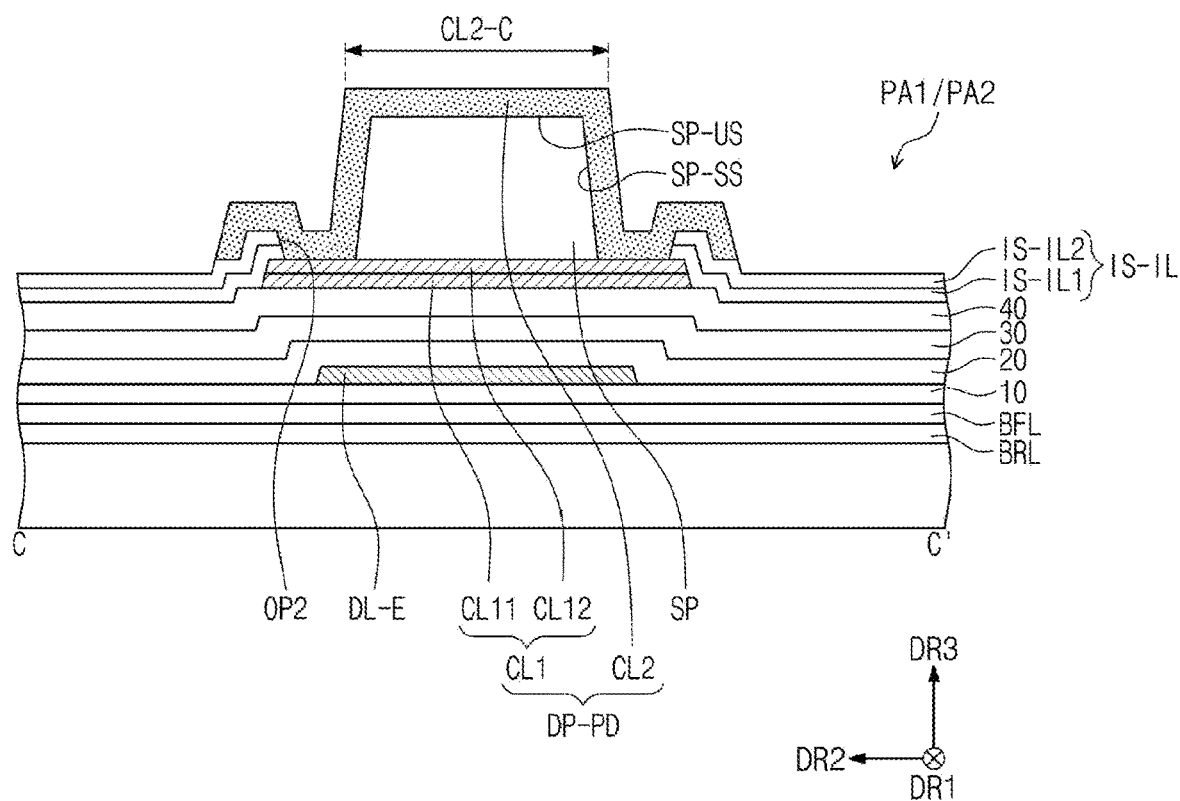

Referring to FIG. 7E, the insulating pattern SP may be disposed between the first conductive pattern CL1 and the second conductive pattern CL2. The upper surface SP-US and the side surface SP-SS of the insulating pattern SP may be surrounded by the second conductive pattern CL2. According to an embodiment, the insulating pattern SP may be formed through the same process as at least one of the sixth insulating layer 60 and the pixel definition layer PDL shown in FIG. 4. The insulating pattern SP may be formed through the same process as the pixel definition layer PDL shown in FIG. 4. According to an embodiment, no additional process is required to form the insulating pattern SP.

Referring to FIGS. 7D and 7E, a contact portion CL2-C of the second conductive pattern CL2 may protrude more from the second sensing insulating layer IS-IL2 than the other portion of the second conductive pattern CL2 by the insulating pattern SP.

FIG. 8 shows the driving chip DC as an electronic component. FIG. 8 shows a structure in which a bump BP of the driving chip is in contact with the contact portion CL2-C of the second conductive pattern CL2.

The bump BP of the driving chip DC may be in contact with the contact portion CL2-C of the second conductive pattern CL2 after penetrating through the first adhesive layer CF1 by a bonding pressure. The first adhesive layer CF1 that is not yet cured may have a viscosity lower than that of an anisotropic conductive film. The anisotropic conductive film may have a relatively high viscosity to align conductive balls.

Since the contact portion CL2-C of the second conductive pattern CL2 is protruded toward the bump BP, the contact portion CL2-C and the bump BP may be in tight contact with each other, and a contact resistance between the contact portion CL2-C and the bump BP may be reduced. As the conductive balls are omitted and the bump BP is efficiently put into contact with the signal pad DP-PD, the bonding pressure may be reduced. Since the bonding pressure is reduced, physical damages on the display panel or the electronic components during the bonding process may be reduced.

FIGS. 7F to 7P show pad areas PA1 and PA2 arranged in different ways from the pad areas PA1 and PA2 of FIG. 7A when viewed in the plane. Hereinafter, different features from those of the pad areas PA1 and PA2 of FIGS. 7A to 7E will be schematically described, and a further description of components and technical aspects previously described may be omitted.

Figure 7F:
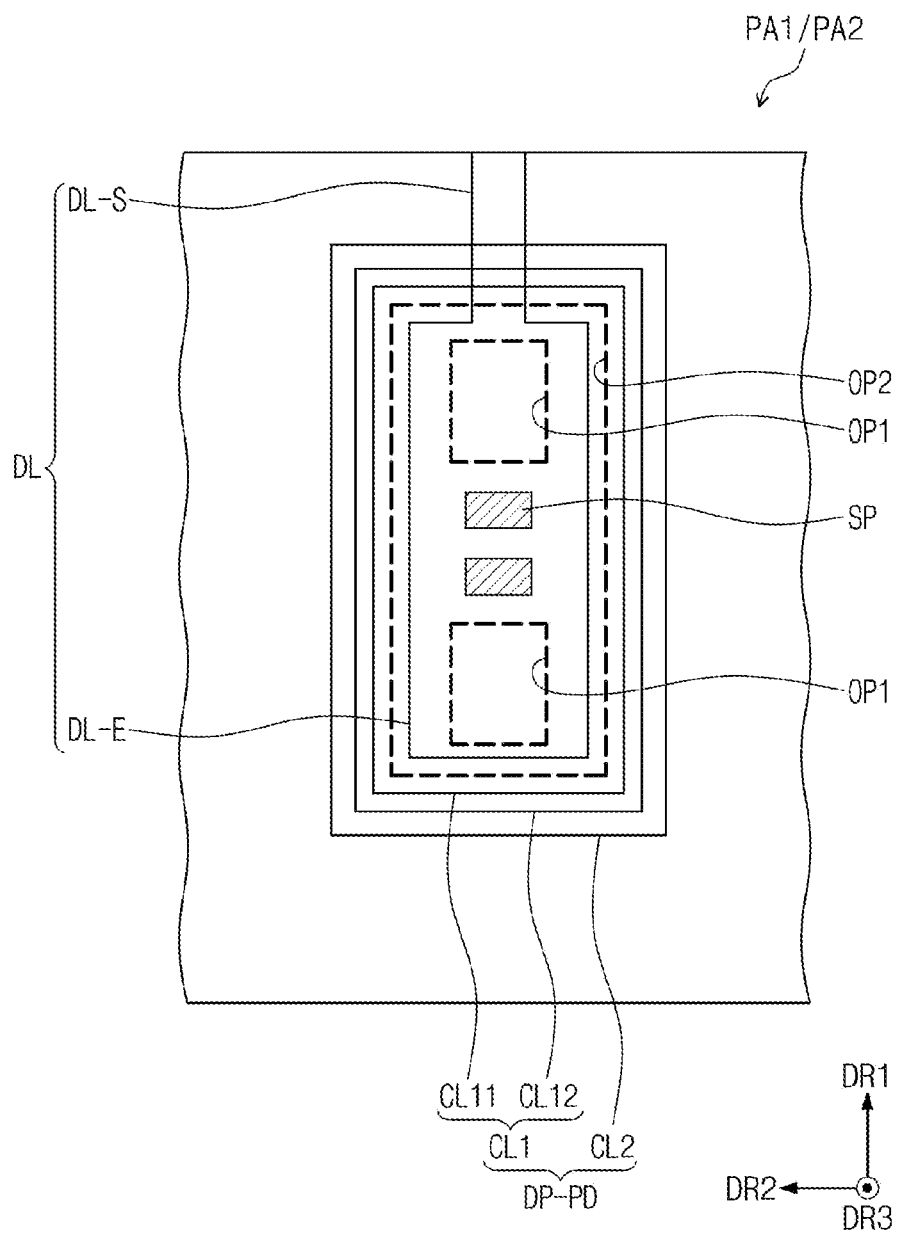
Figure 7G:
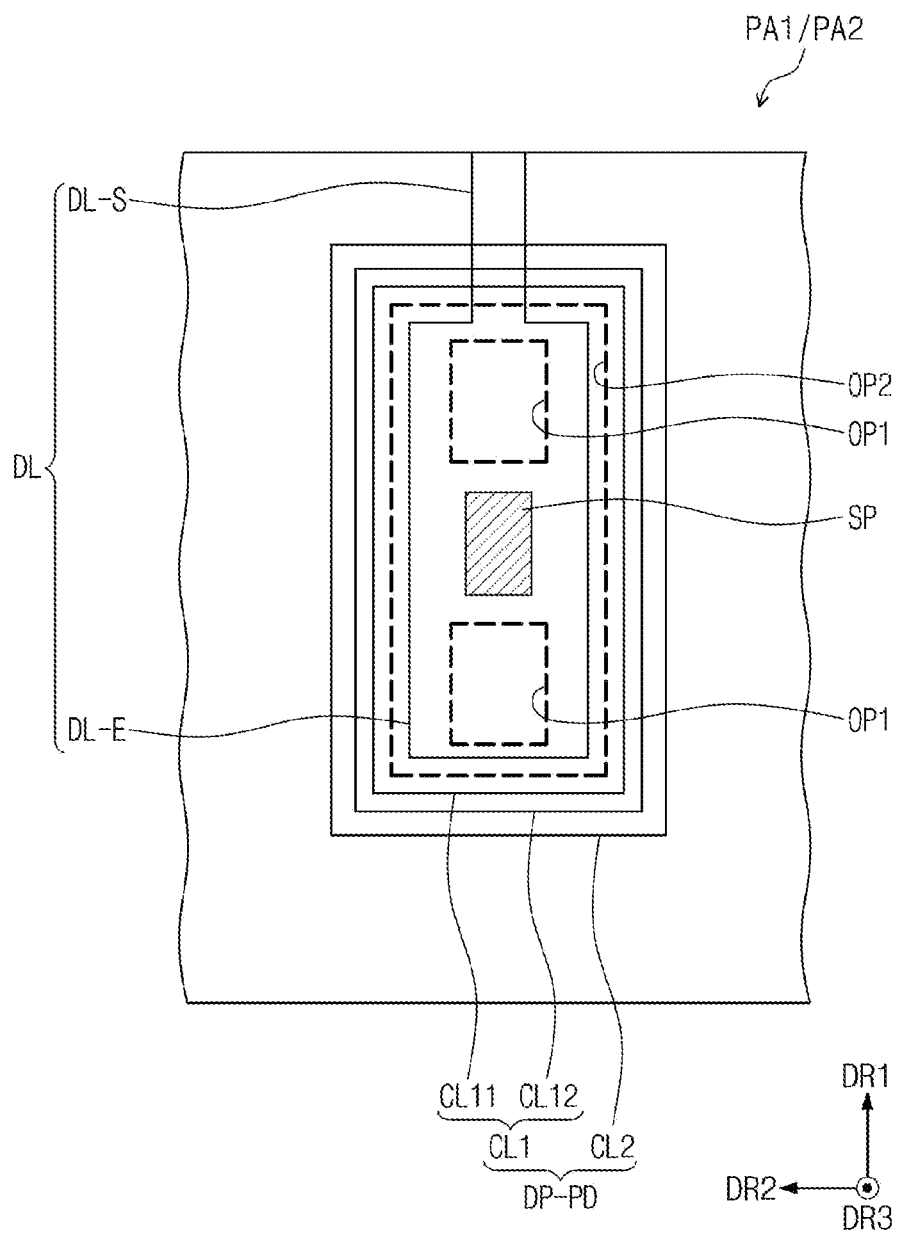
Figure 7H:
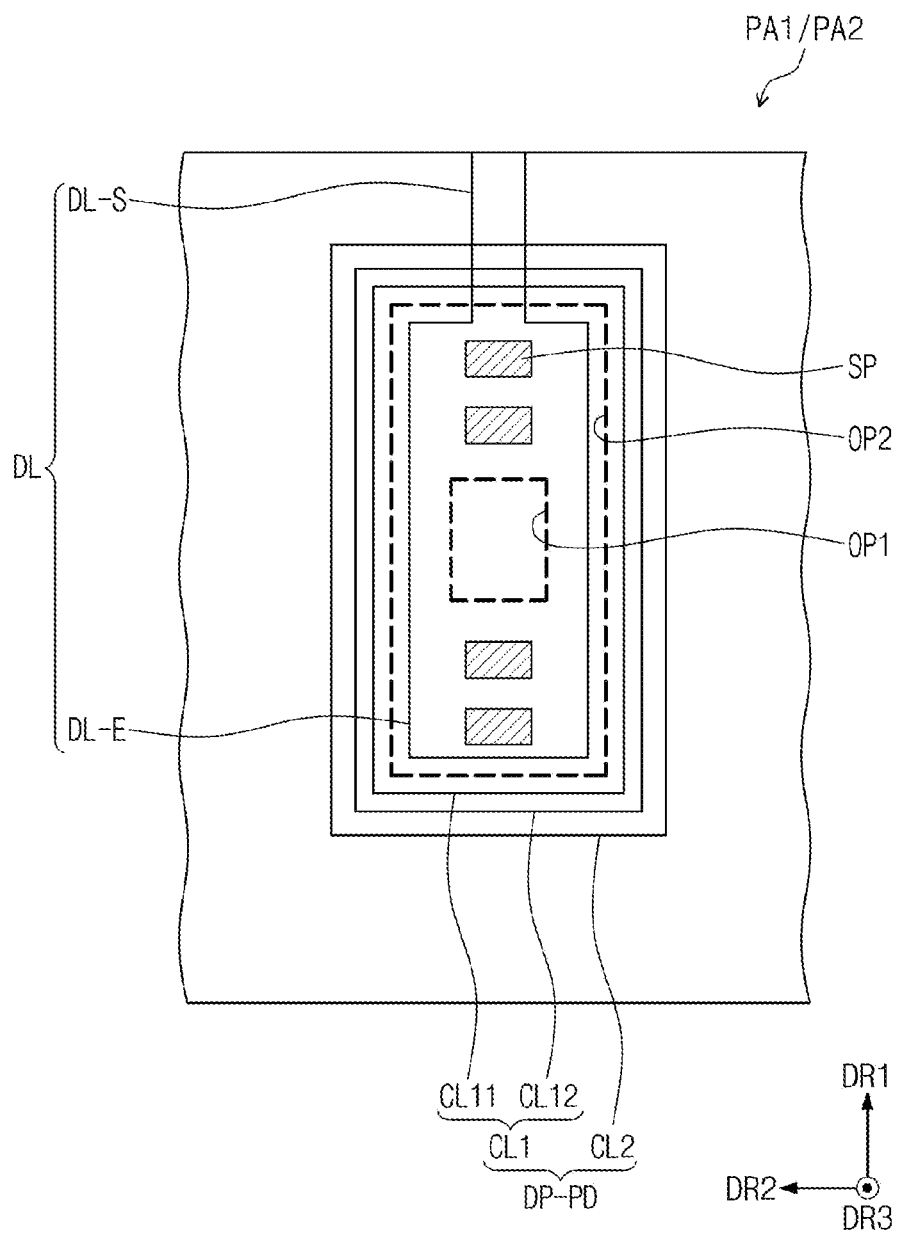
Figure 7I:
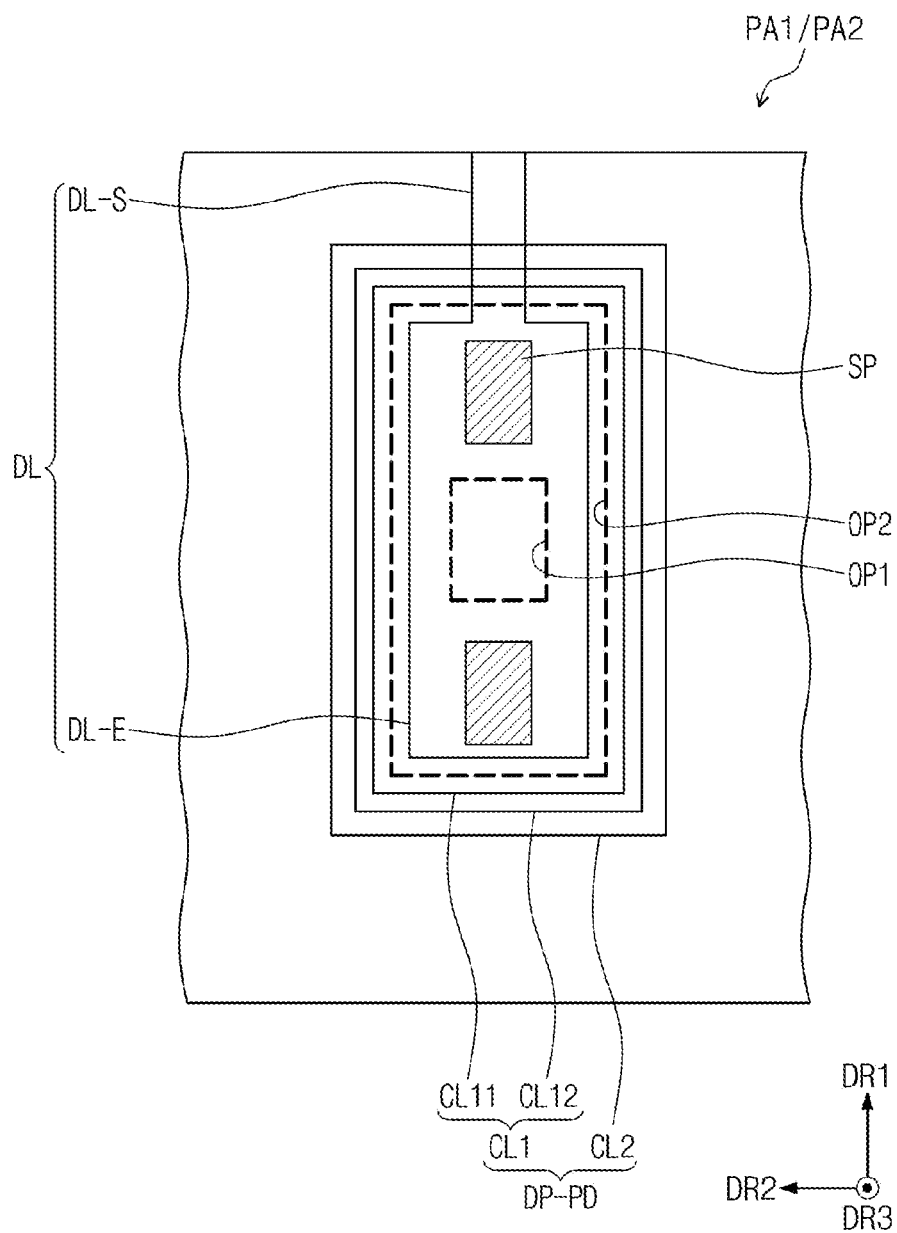

Referring to FIG. 7F, a first contact hole OP1 may be provided in plural. Insulating patterns SP may be disposed between two first contact holes OP1. As shown in FIG. 7G, one insulating pattern SP may be disposed between a first contact hole OP1 disposed at one side and a first contact hole OP1 disposed at the other side in the first direction DR1. As shown in FIGS. 7H and 7I, a first contact hole OP1 may be disposed between insulating patterns SP. The first contact hole OP1 may be disposed between the insulating patterns SP disposed at one side (or an upper side) and the insulating patterns SP disposed at the other side (or a lower side) in the first direction DR1. In an embodiment, a plurality of first contact holes OP1 may be disposed between the insulating patterns SP.

Figure 7J:
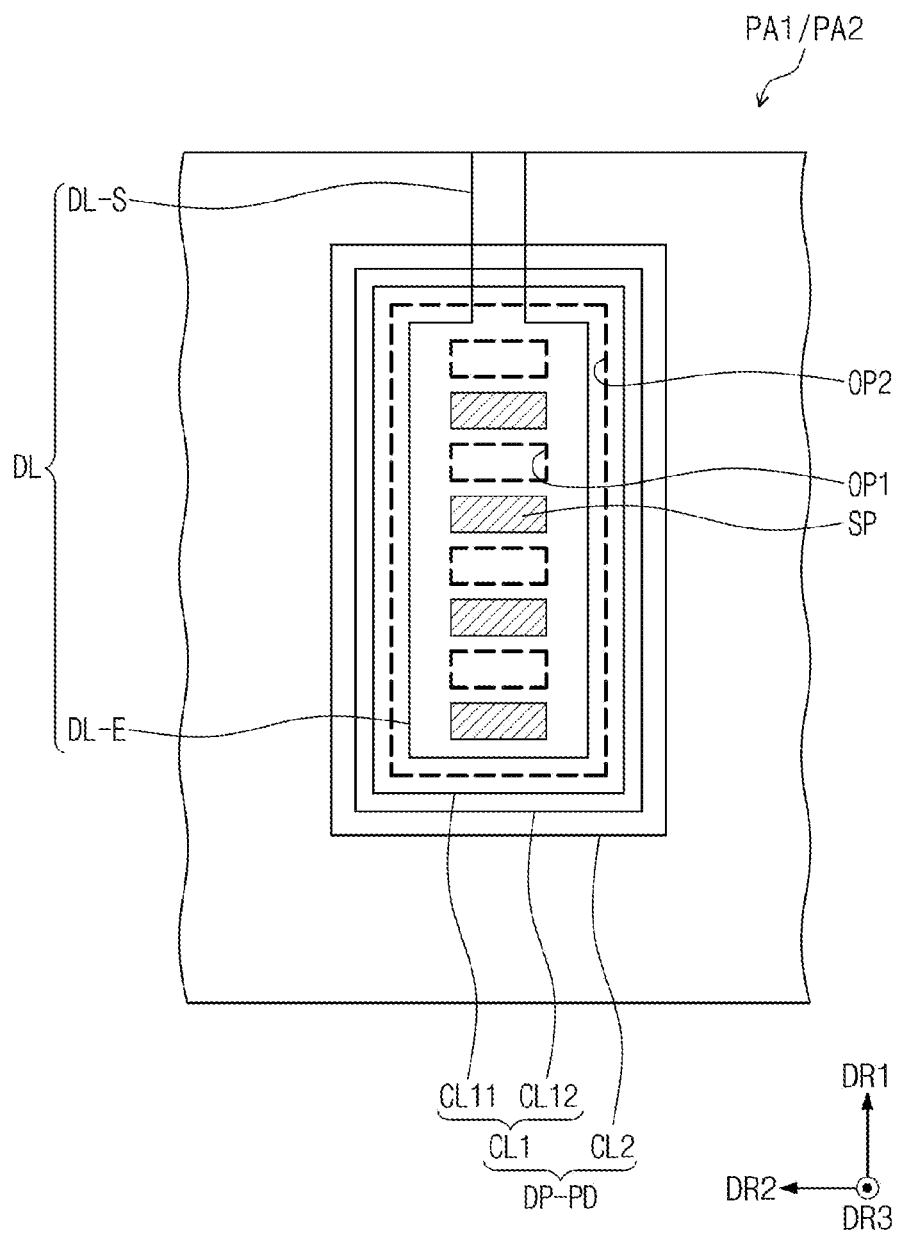
Figure 7K:
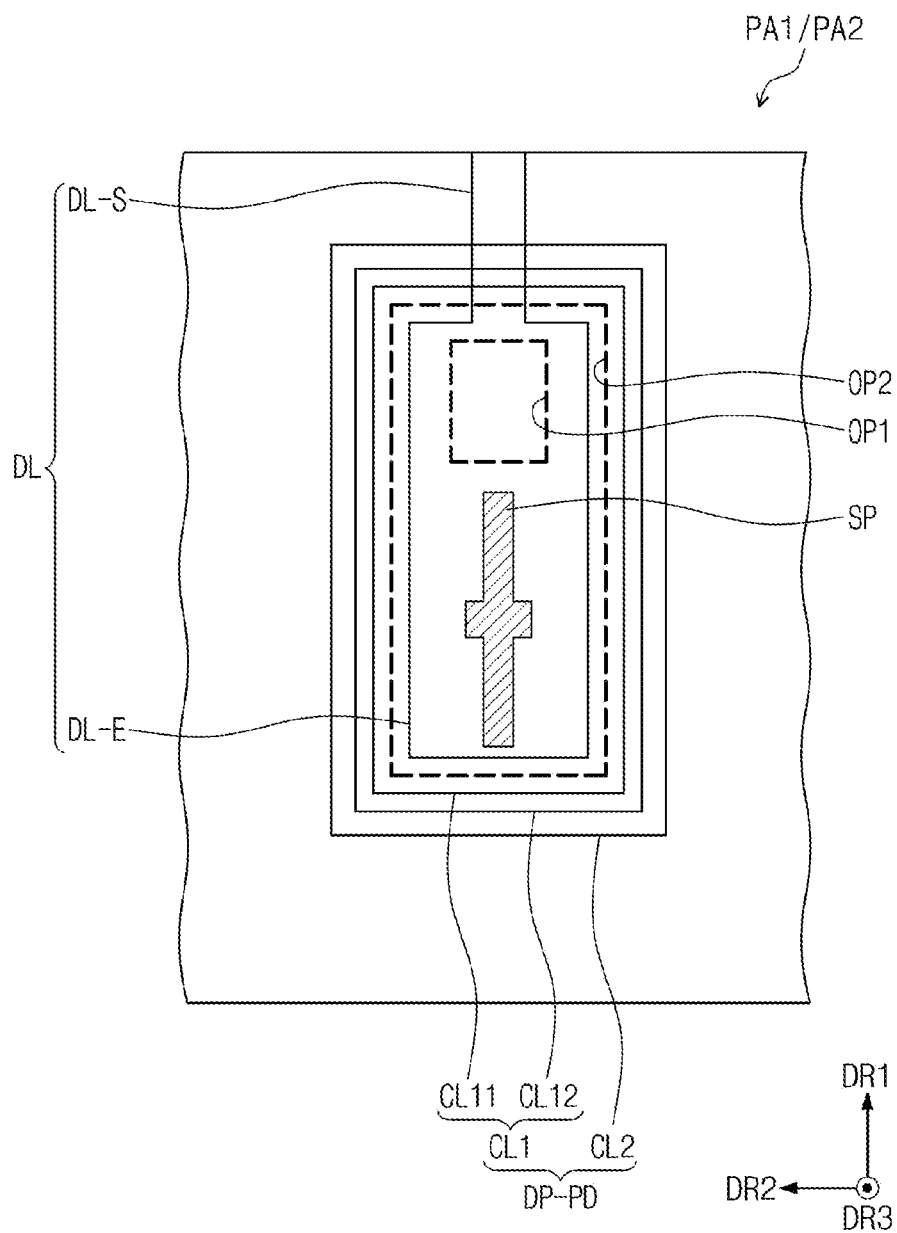
Figure 7L:
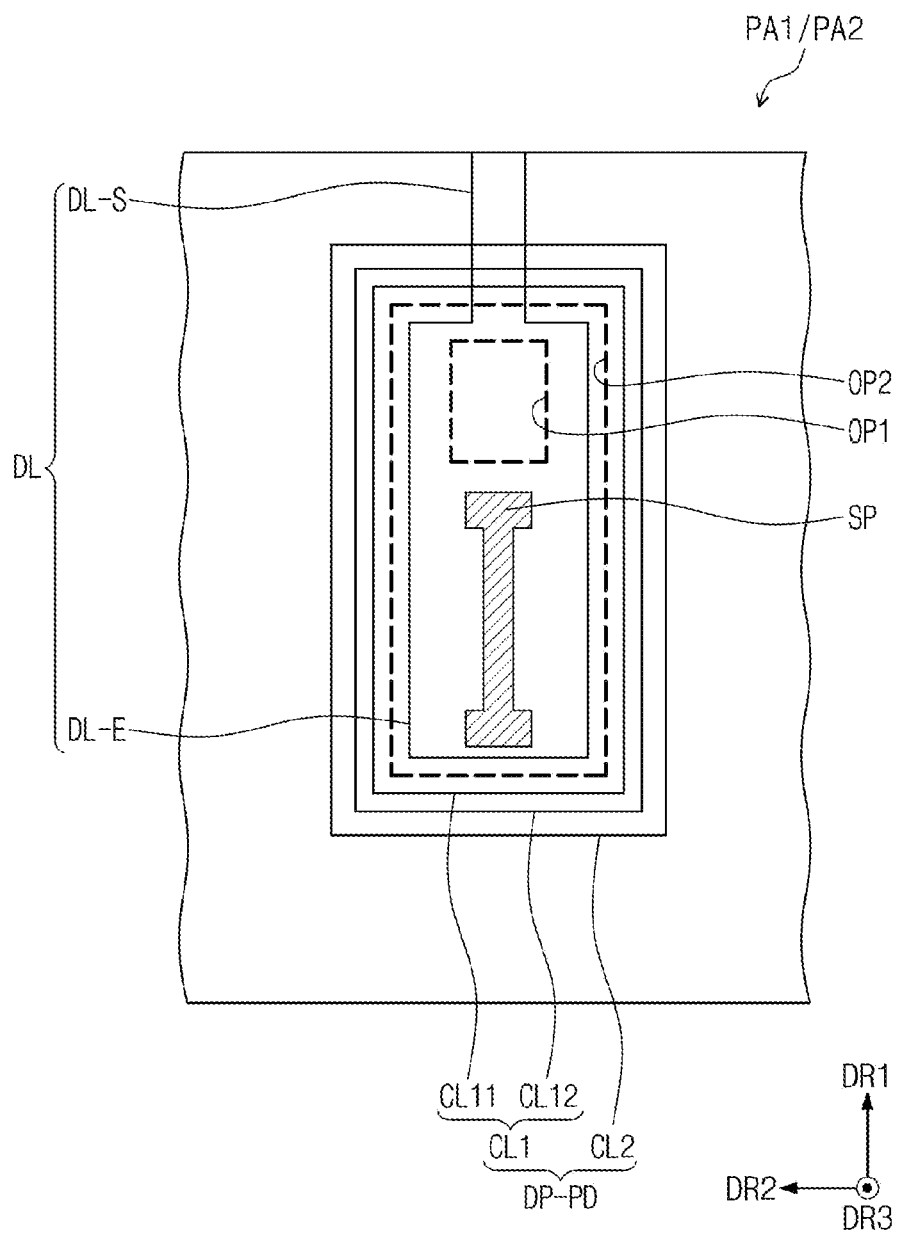
Figure 7M:
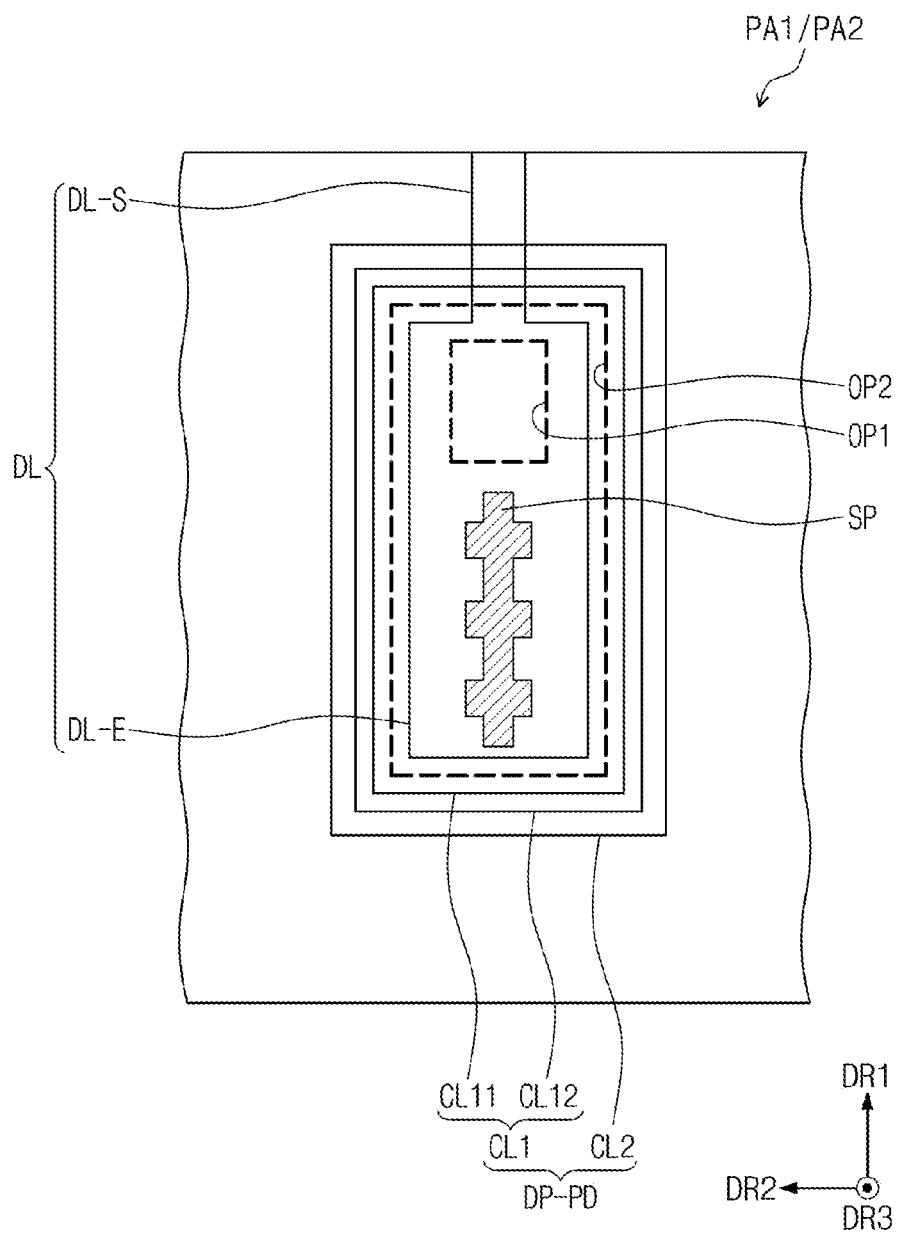

Referring to FIG. 7J, first contact holes OP1 may be alternately arranged with insulating patterns SP in the first direction DR1. The number of the first contact holes OP1 and the number of the insulating patterns SP are not particularly limited.

Referring to FIGS. 7K to 7O, an insulating pattern SP may have a variety of shapes. The insulating pattern SP may include a portion extending in the first direction DR1 and a portion extending in the second direction DR2. The portion extending in the first direction DR1 and the portion extending in the second direction DR2 may be provided integrally with each other.

Figure 7N:
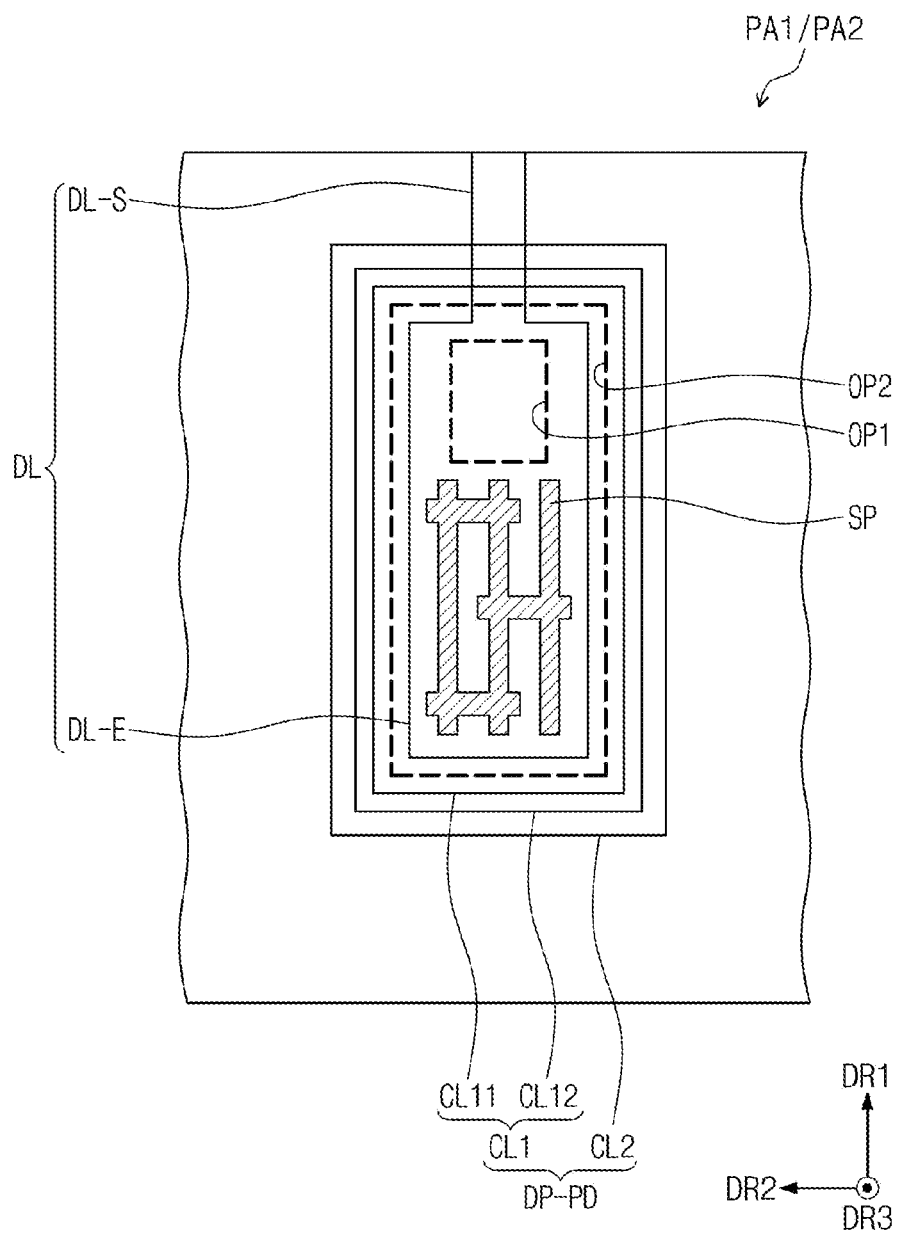
Figure 70:
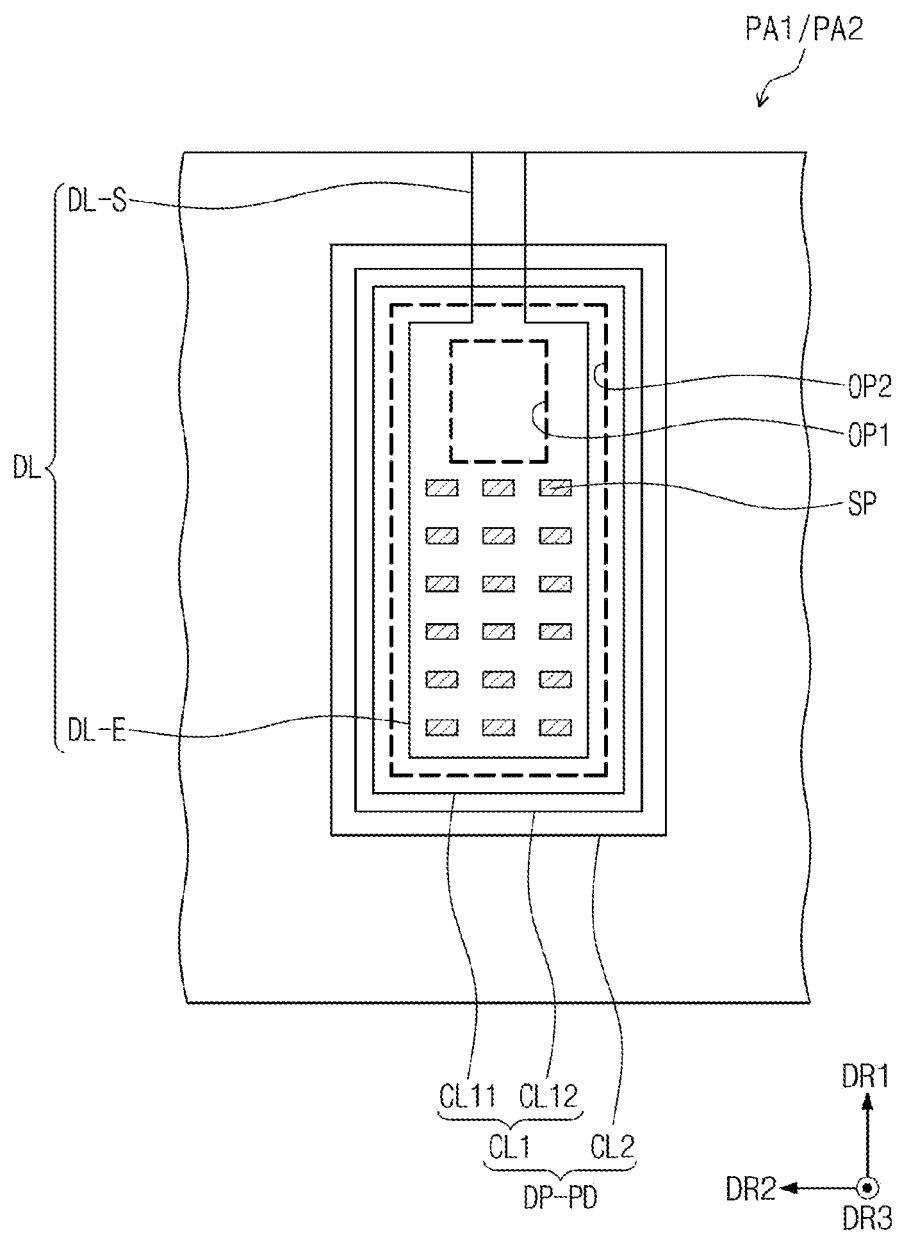

Referring to FIG. 7N, a plurality of portions of an insulating pattern SP extending in the first direction DR1 may be connected to each other by a plurality of portions of the insulating pattern SP extending in the second direction DR2. Referring to FIG. 7O, an insulating pattern SP may include a plurality of dot patterns.

Figure 7P:
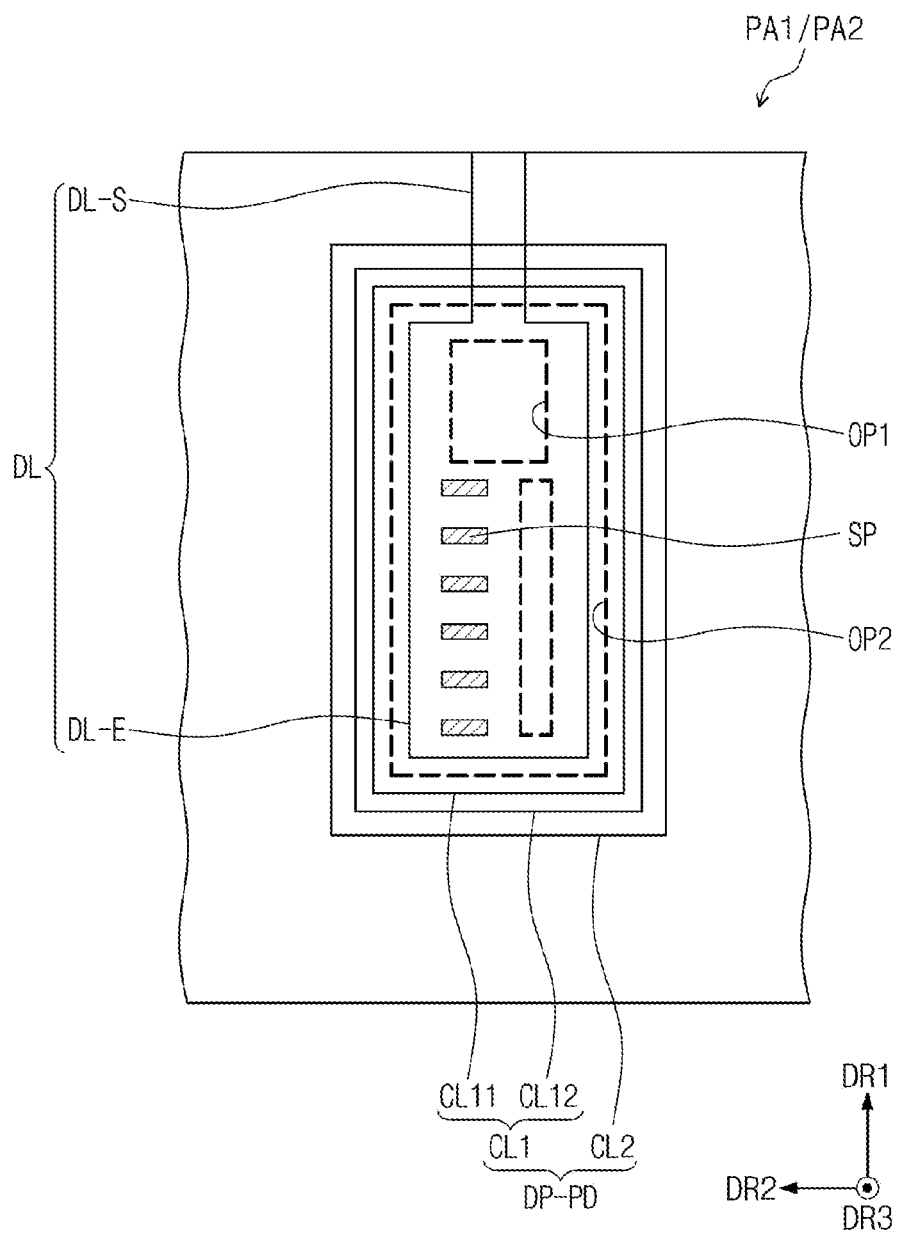

Referring to FIG. 7P, in an embodiment, a first contact hole OP1 does not overlap a second contact hole OP2. The second contact hole OP2 may have a shape extending in the first direction DR1. An insulating pattern SP may be disposed at one side of the second contact hole OP2 in the second direction DR2.

Figure 9A:
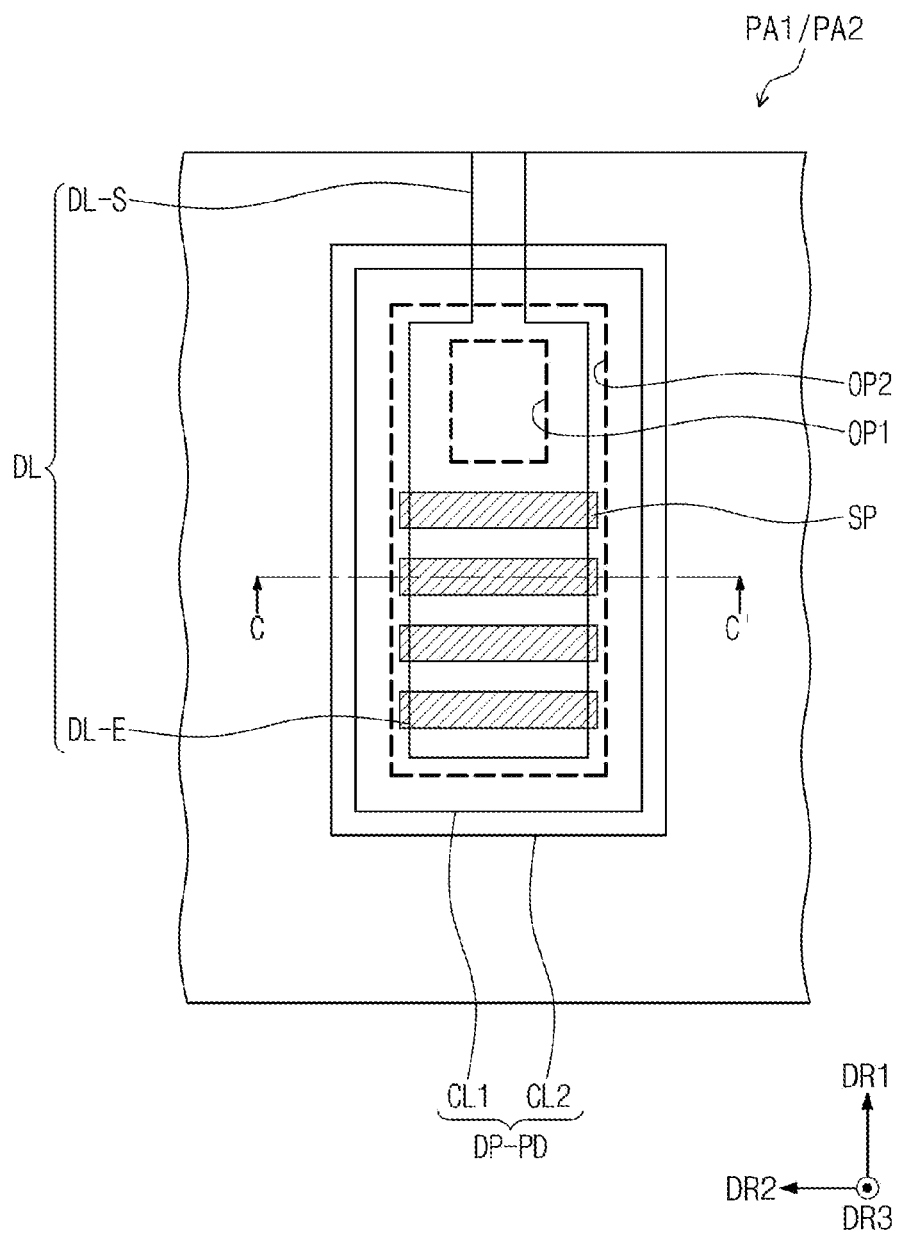
FIG. 9A is a plan view of pad areas according to an embodiment of the present disclosure.

FIG. 9A is a plan view of pad areas PA1 and PA2 according to an embodiment of the present disclosure. FIG. 9B is a cross-sectional view of the pad areas of FIG. 9A according to an embodiment of the present disclosure. In FIGS. 9A and 9B, the same reference numerals denote the same elements in FIGS. 7A to 8, and thus, for convenience of explanation, a further detailed description thereof may be omitted.

Referring to FIGS. 9A and 9B, a length in the second direction DR2 of insulating patterns SP may be greater than a width of an end portion DL-E. In an embodiment, a portion of the insulating patterns SP does not overlap the end portion DL-E. According to an embodiment, a contact portion CL2-C may have an area greater than that of the contact portion CL2-C of the second conductive pattern CL2 described with reference to FIGS. 7D and 7E.

A first conductive pattern CL1 shown in FIGS. 9A and 9B may have a single-layer structure. However, embodiments are not limited thereto. For example, in embodiments, the first conductive pattern CL1 may have a multi-layer structure. A second group of insulating layers IS-IL may have a single-layer structure. However, embodiments are not limited thereto. For example, in embodiments, the second group of insulating layers IS-IL may have a multi-layer structure. The above description of the first conductive pattern CL1 or the second group of insulating layers IS-IL may be applicable to embodiments described hereafter.

Figure 10A:
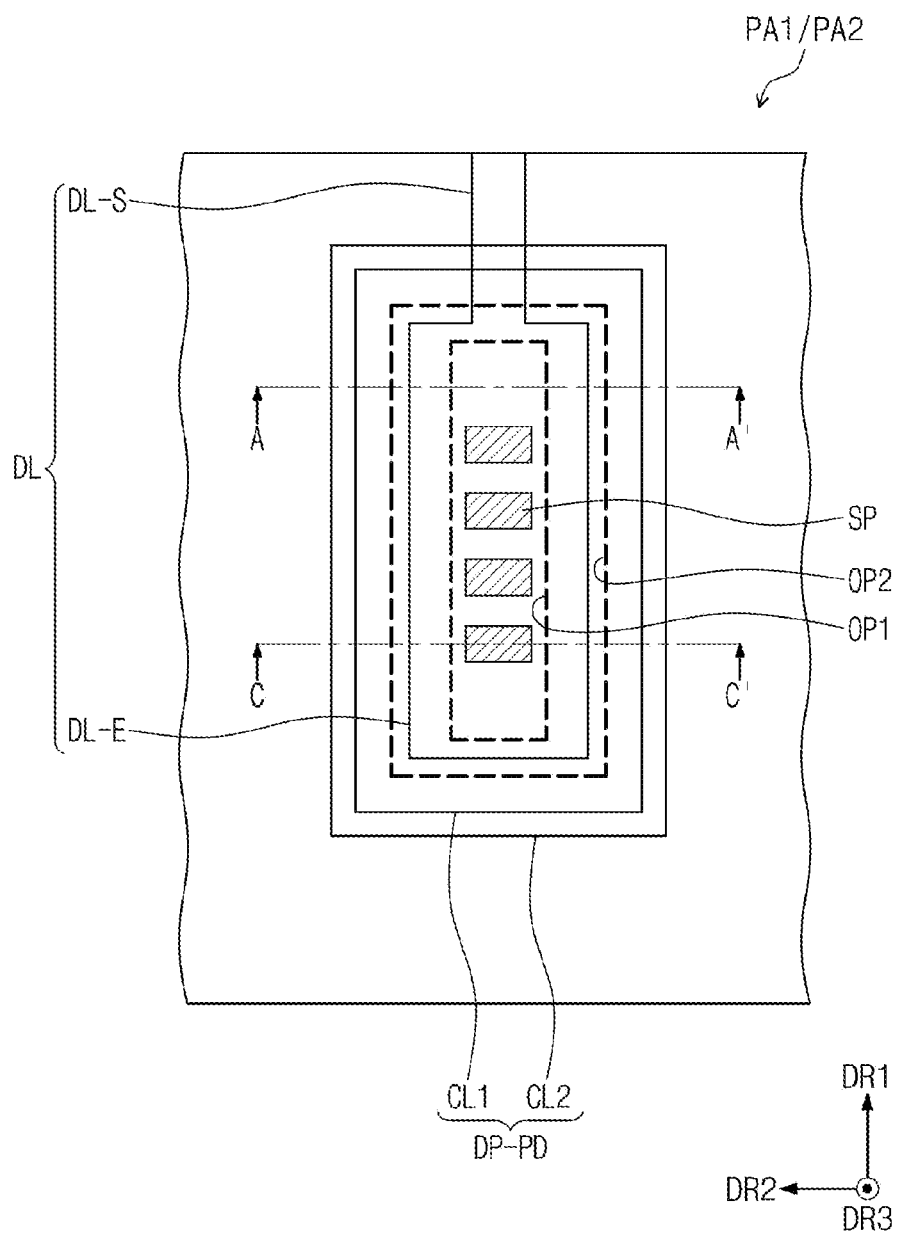
FIG. 10A is a plan view of pad areas according to an embodiment of the present disclosure.
Figure 10B:
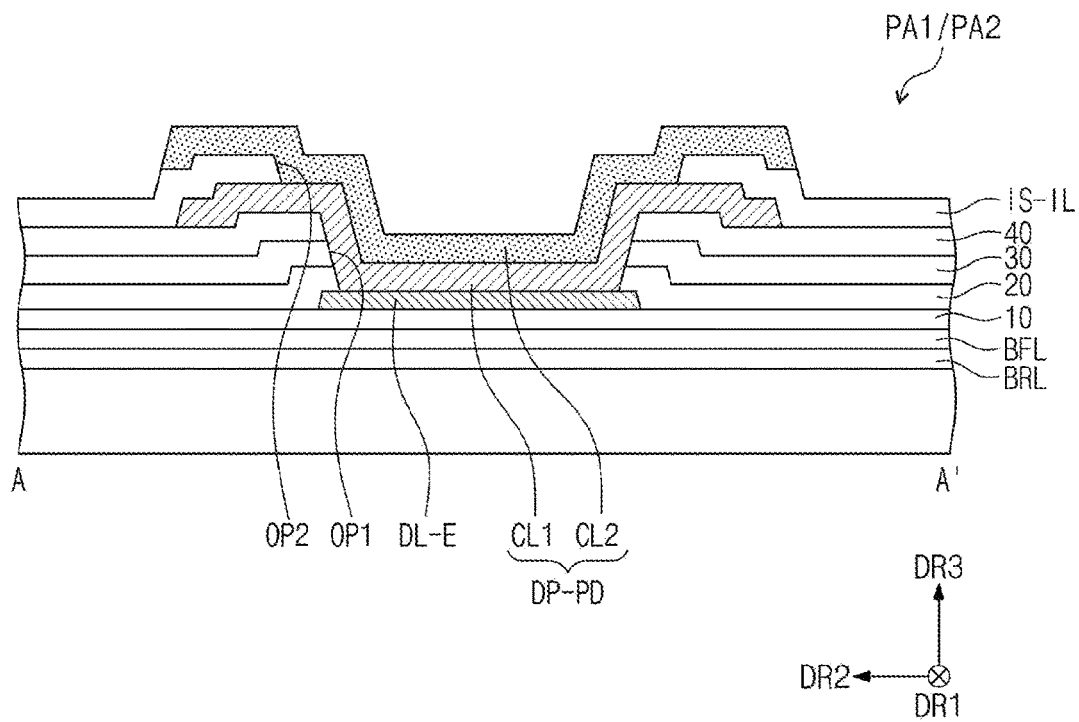
FIGS. 10B and 10C are cross-sectional views of the pad areas of FIG. 10A according to embodiments of the present disclosure.
Figure 10C:
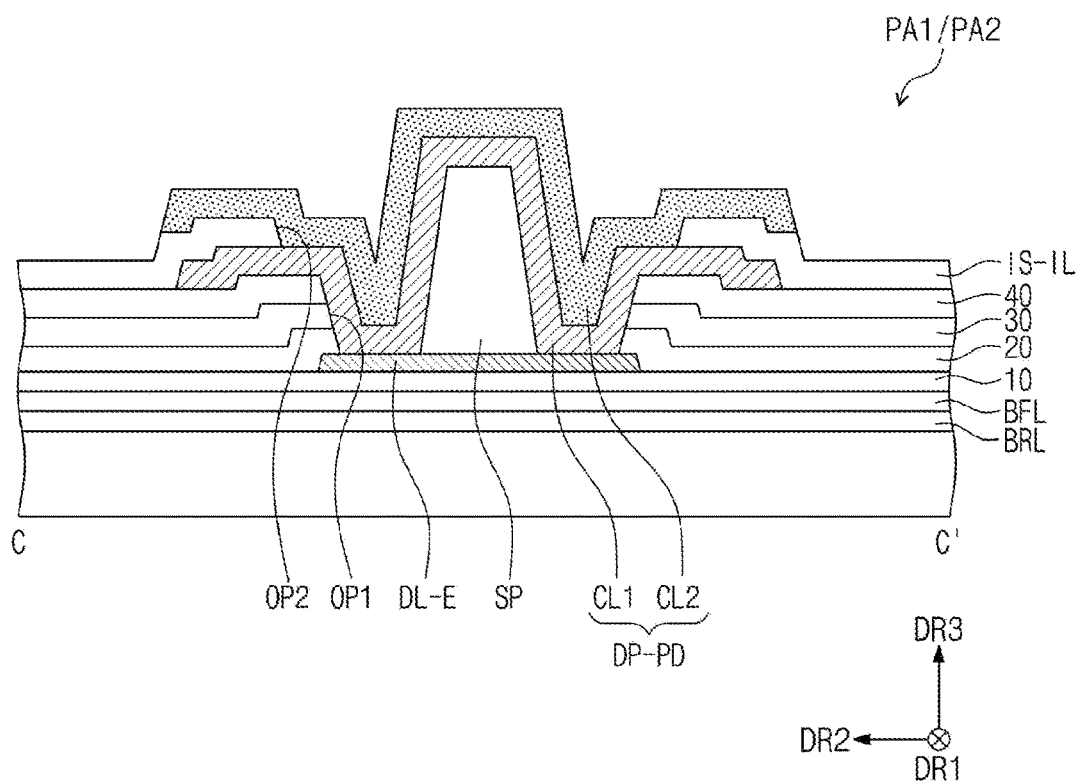
Figure 11A:
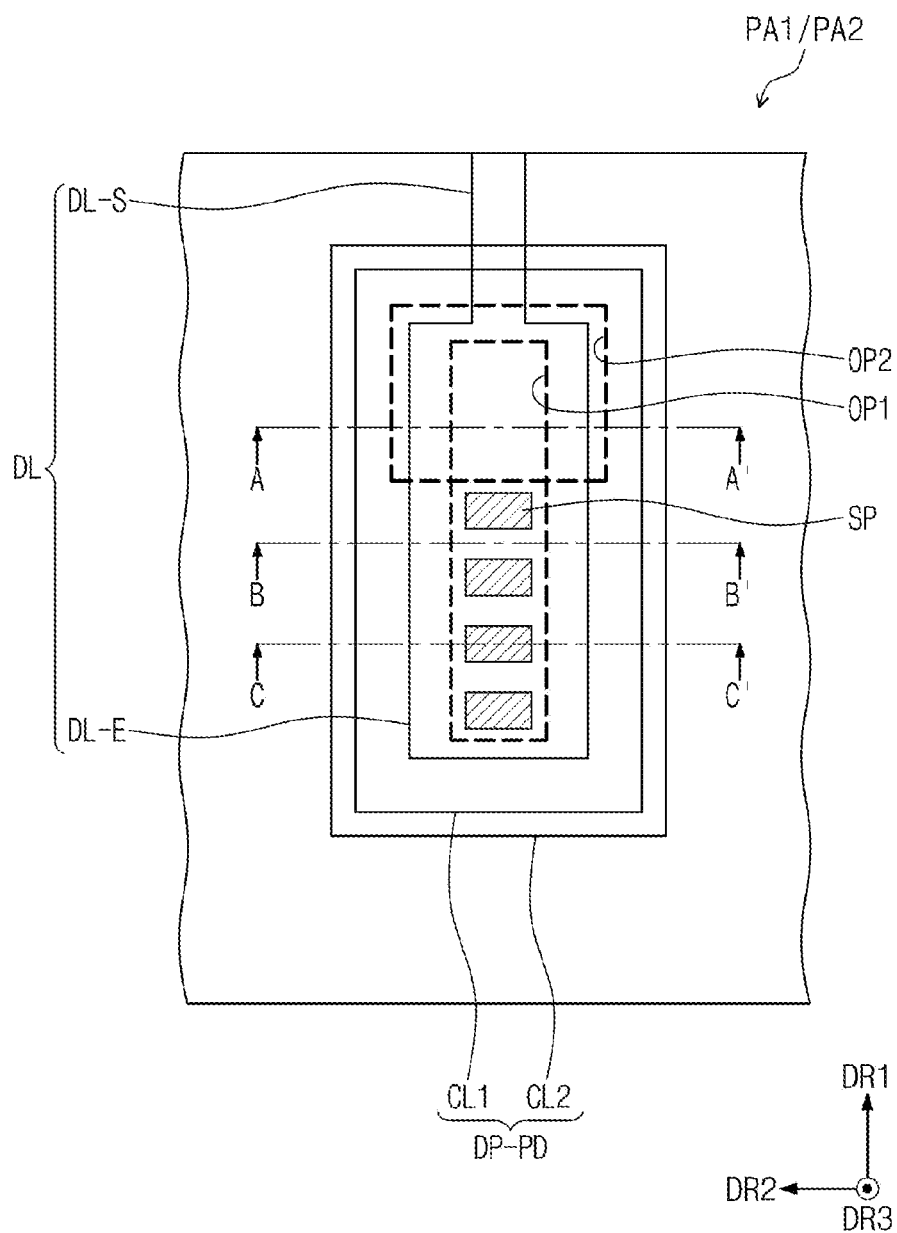
FIG. 11A is a plan view of pad areas according to an embodiment of the present disclosure.
Figure 11B:
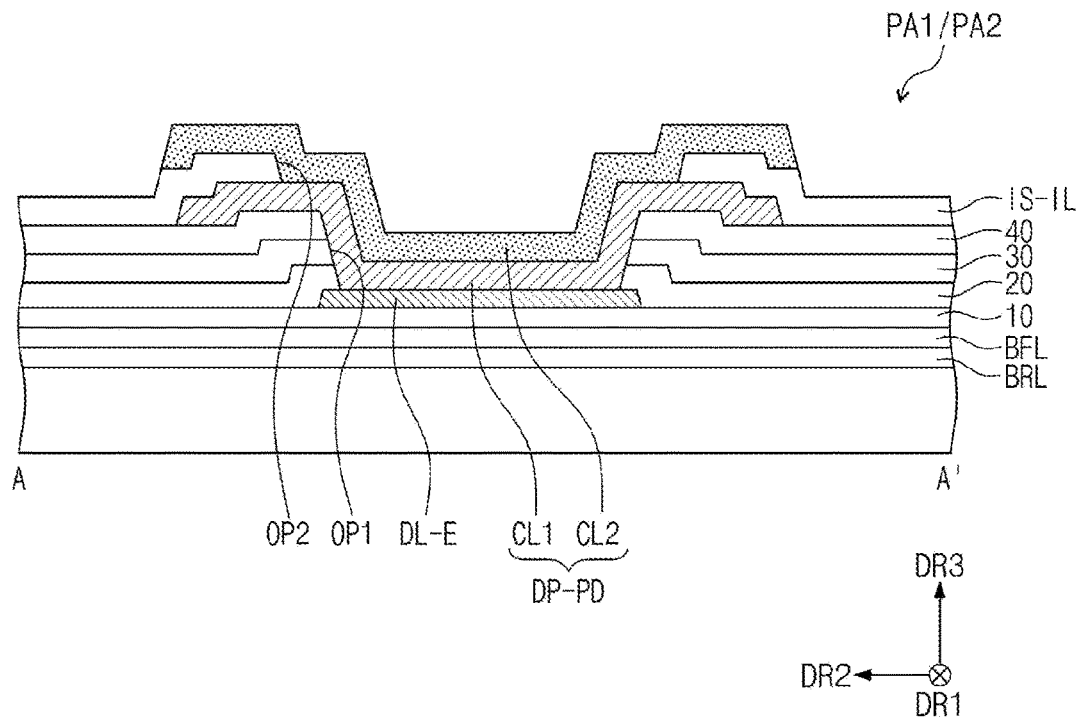
FIGS. 11B to 11D are cross-sectional views of the pad areas of FIG. 11A according to embodiments of the present disclosure.
Figure 11C:
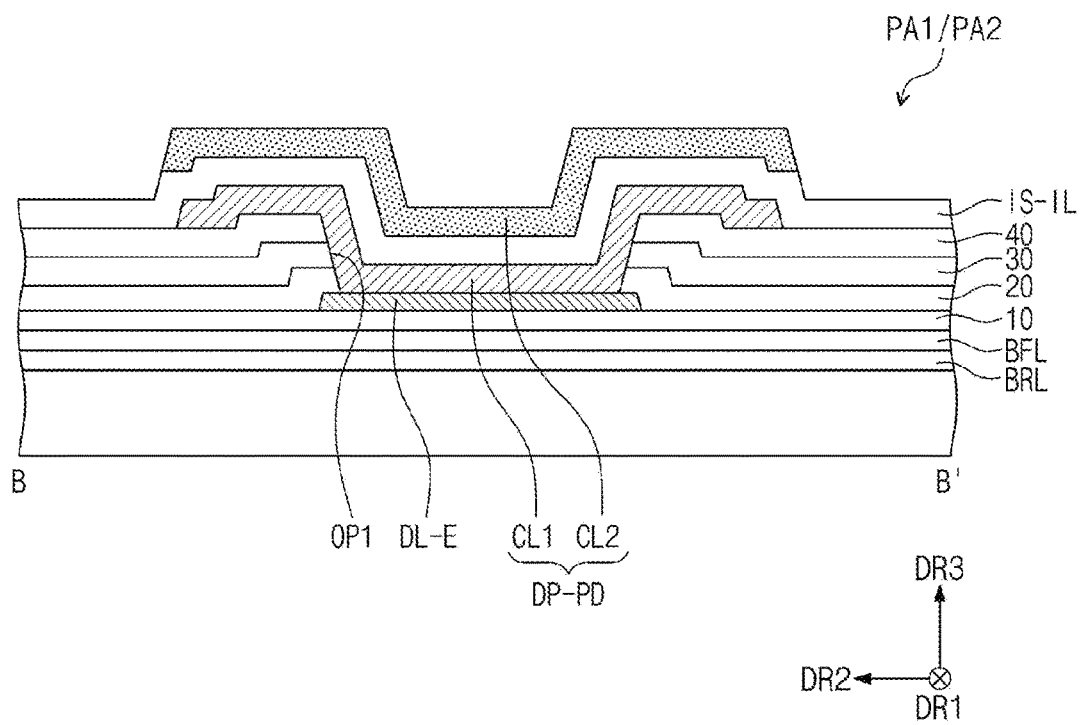
Figure 11D:
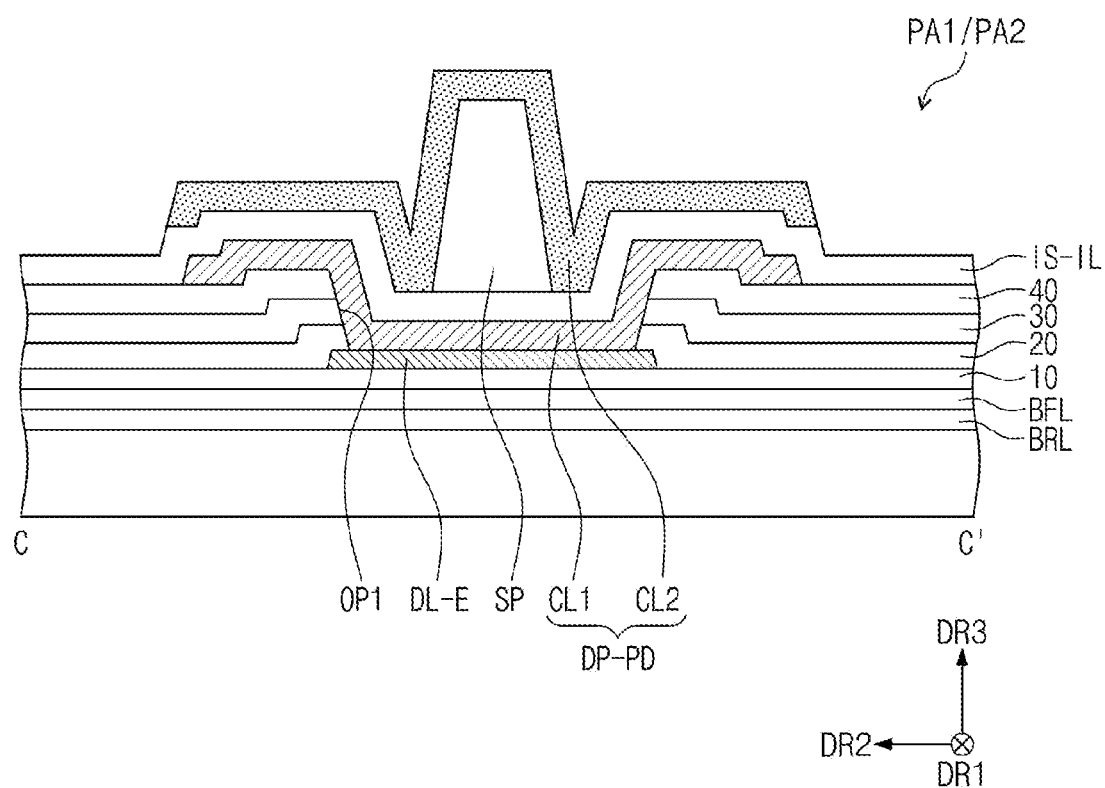

FIG. 10A is a plan view of pad areas PA1 and PA2 according to an embodiment of the present disclosure. FIGS. 10B and 10C are cross-sectional views of the pad areas PA1 and PS2 of FIG. 10A according to embodiments of the present disclosure. FIG. 11A is a plan view of pad areas PA1 and PA2 according to an embodiment of the present disclosure. FIGS. 11B to 11D are cross-sectional views of the pad areas PA1 and PA2 of FIG. 11A according to embodiments of the present disclosure. Hereinafter, in FIGS. 10A to 10C, and 11A to 11D, a further description of components and technical aspects previously described with reference to FIGS. 7A to 9B may be omitted.

Referring to FIGS. 10A to 10C, a first contact hole OP1 may be disposed inside a second contact hole OP2 when viewed in a plane. An insulating pattern SP may be disposed inside the first contact hole OP1 in the plane. The insulating pattern SP may be disposed inside the first contact hole OP1 and the second contact hole OP2. As shown in FIG. 10C, the insulating pattern SP may be disposed between an end portion DL-E and a first conductive pattern CL1. In embodiments, the insulating pattern SP may be disposed between the first conductive pattern CL1 and a second conductive pattern CL2.

Referring to FIGS. 10A to 10C, a contact area between the end portion DL-E and the first conductive pattern CL1 may increase, and a contact area between the first conductive pattern CL1 and the second conductive pattern CL2 may increase.

Referring to FIGS. 11A to 11D, a portion of a first contact hole OP1 may partially overlap the second contact hole OP2 when viewed in a plane. Insulating patterns SP may be disposed outside the second contact hole OP2 when viewed in the plane. As shown in FIG. 11C, a second group of insulating layers IS-IL may be disposed between a first conductive pattern CL1 and a second conductive pattern CL2 in some areas. As shown in FIG. 11D, an insulating pattern SP may be disposed between a second group of insulating layers IS-IL and a second conductive pattern CL2. In embodiments, the insulating pattern SP may be disposed between a first conductive pattern CL1 and the second group of insulating layers IS-IL.

Figure 12A:
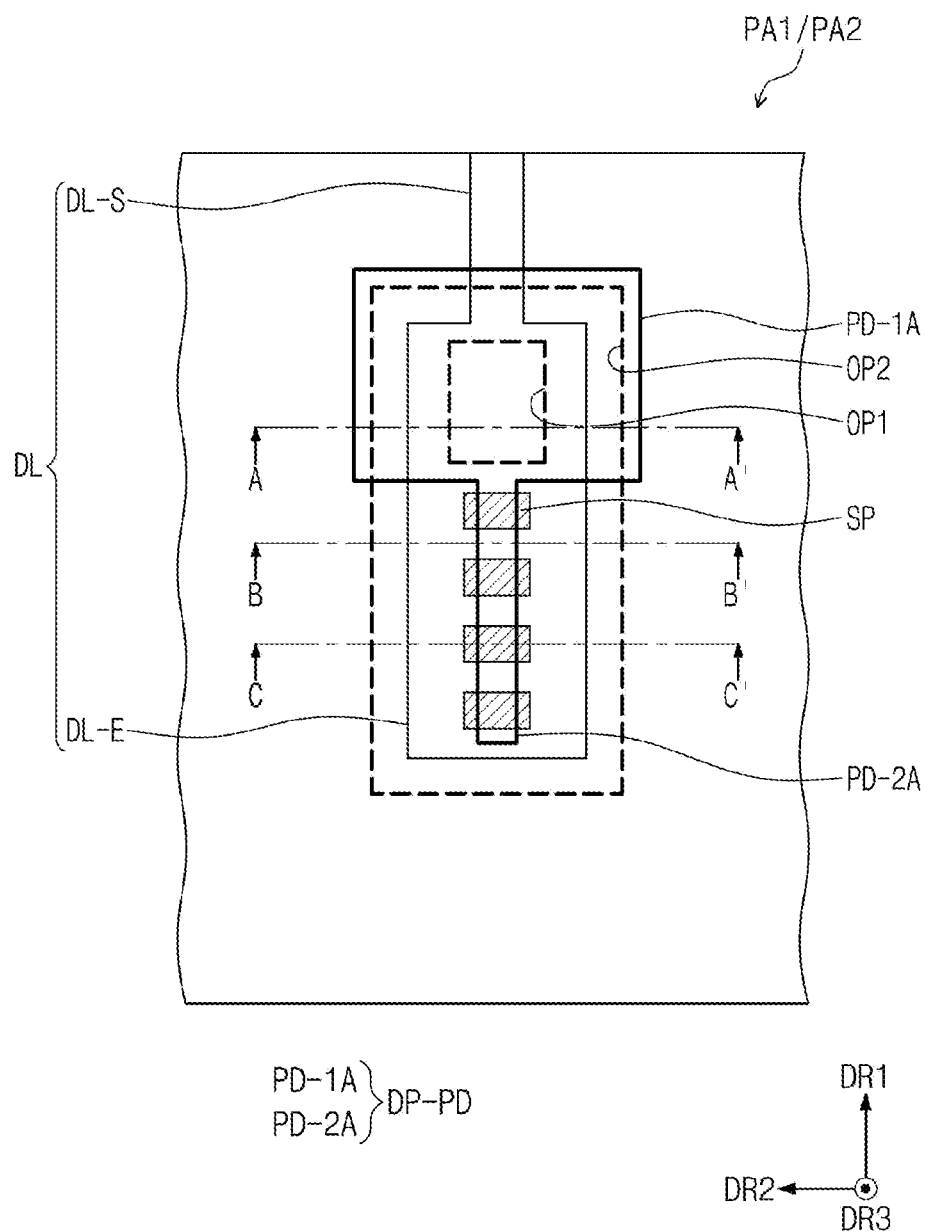
FIG. 12A is a plan view of pad areas according to an embodiment of the present disclosure.
Figure 12B:
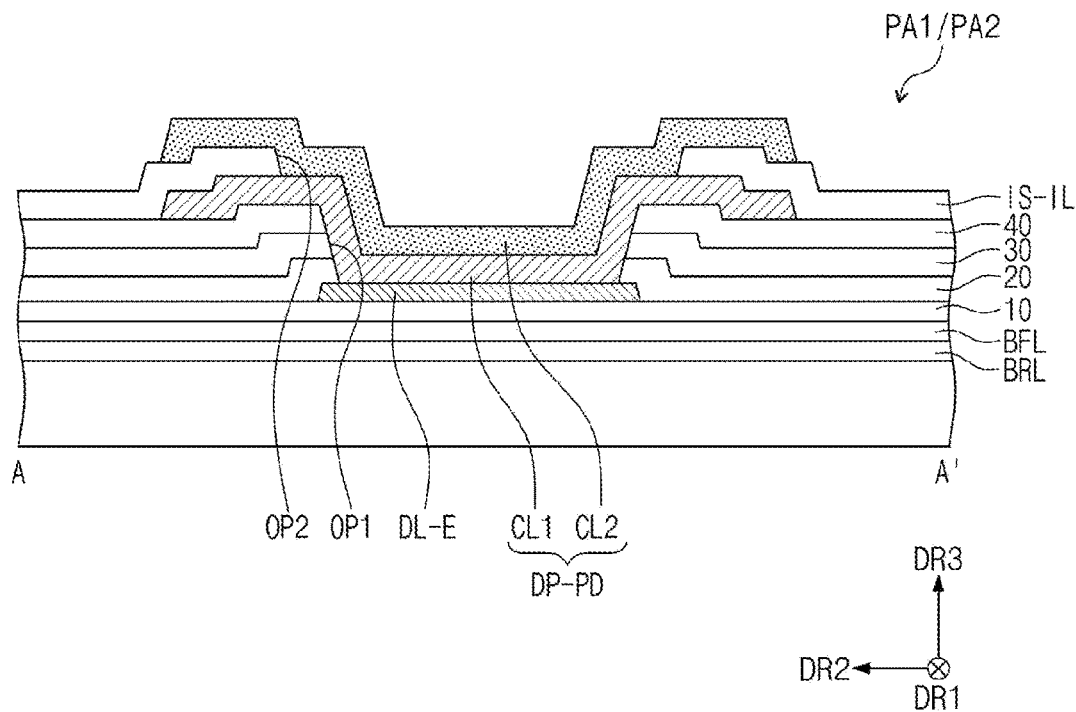
FIGS. 12B to 12D are cross-sectional views of the pad areas of FIG. 12A according to embodiments of the present disclosure.
Figure 12C:
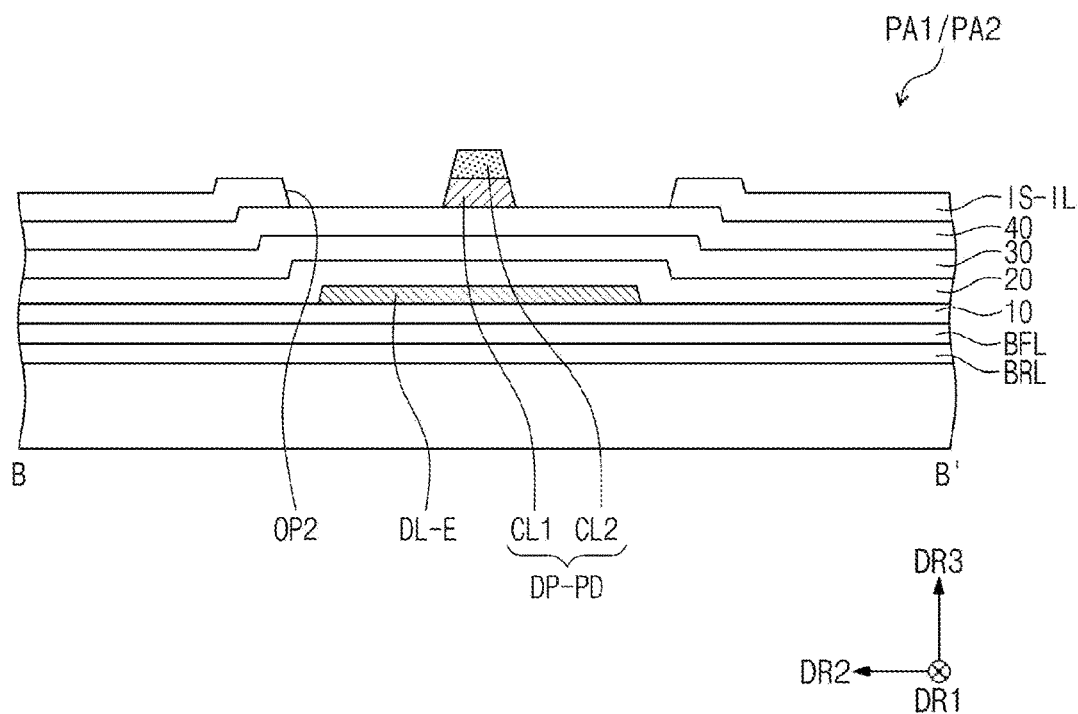
Figure 12D:
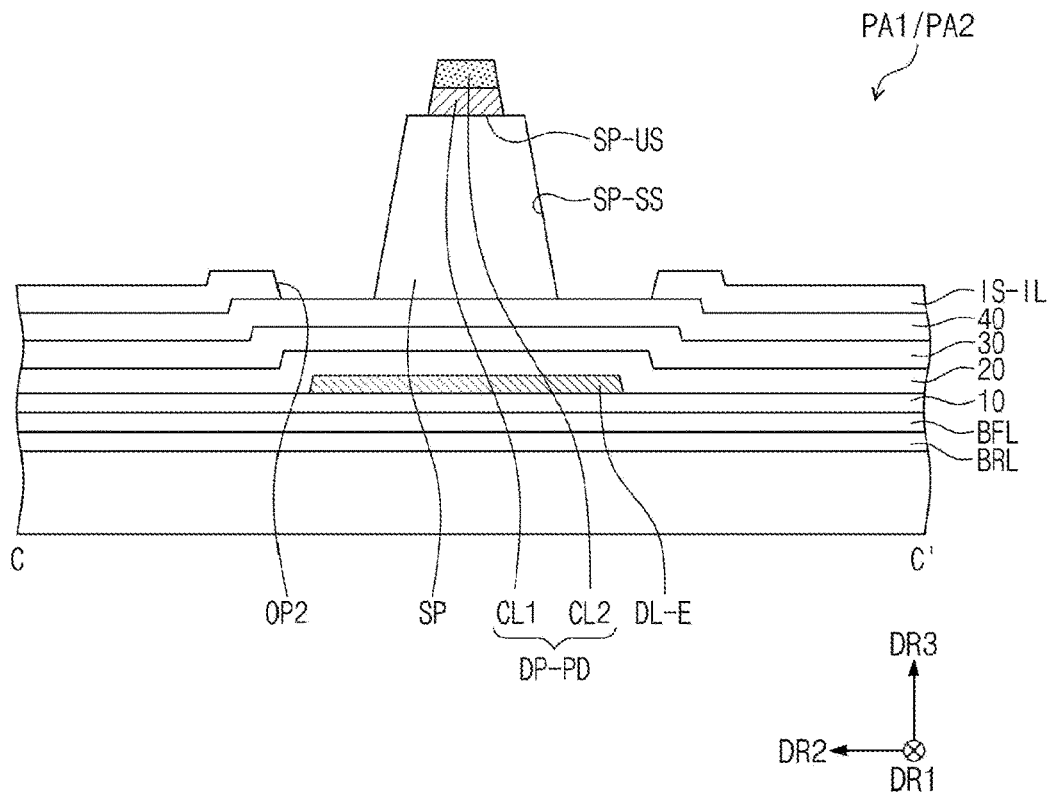

FIG. 12A is a plan view of pad areas PA1 and PA2 according to an embodiment of the present disclosure. FIGS. 12B to 12D are cross-sectional views of the pad areas PA1 and PA2 of FIG. 12A according to embodiments of the present disclosure. FIGS. 12E to 12L are cross-sectional views of the pad areas PA1 and PA2 of FIG. 12D according to embodiments of the present disclosure. FIGS. 12M and 12N are plan views of pad areas PA1 and PA2 according to embodiments of the present disclosure. Hereinafter, in FIGS. 12A to 12N, a further description of components and technical aspects previously described with reference to FIGS. 7A to 11D may be omitted.

According to an embodiment, the pad areas PA1 and PA2 and a signal pad DP-PD may have shapes different from those of the pad areas PA1 and PA2 and the signal pad DP-PD described with reference to FIGS. 7A to 7D. Referring to FIG. 12A to 12D, a first conductive pattern CL1 and a second conductive pattern CL2 may have substantially the same shape as each other when viewed in a plane. However, the first conductive pattern CL1 and the second conductive pattern CL2 are not limited thereto.

At least a portion of a side surface SP-SS of insulating patterns SP may be exposed without being covered by the first conductive pattern CL1 and the second conductive pattern CL2. These are different from the structure in which the side surface SP-SS of the insulating patterns SP is surrounded by one of the first conductive pattern CL1 and the second conductive pattern CL2, which is described with reference to FIGS. 7A to 11D.

Referring to FIG. 12A, the signal pad DP-PD may include a first portion PD-1A overlapping a first contact hole OP1 and a second portion PD-2A having a width smaller than that of the first portion PD-1A in the second direction DR2 and overlapping the insulating patterns SP. The second portion PD-2A may extend in the first direction DR1 and may have a uniform width.

Referring to FIG. 12C, a portion of the signal pad DP-PD may be disposed on a fourth insulating layer 40, and a portion of the signal pad DP-PD may be disposed on an upper surface SP-US of the insulating pattern SP as shown in FIG. 12D. In an embodiment, the signal pad DP-PD does not overlap the side surface SP-SS of the insulating pattern SP. As the side surface of the insulating pattern SP is exposed without being covered by the signal pad DP-PD, the insulating pattern SP may be deformed in the bonding process described with reference to FIG. 8, and the insulating pattern SP may absorb a portion of the bonding pressure. Since the signal pad DP-PD has a relatively larger modulus than that of the insulating pattern SP, the signal pad DP-PD may not be easily deformed. According to an embodiment, occurrence of cracks in the signal pad DP-PD may be reduced in the bonding process.

Figure 12E:
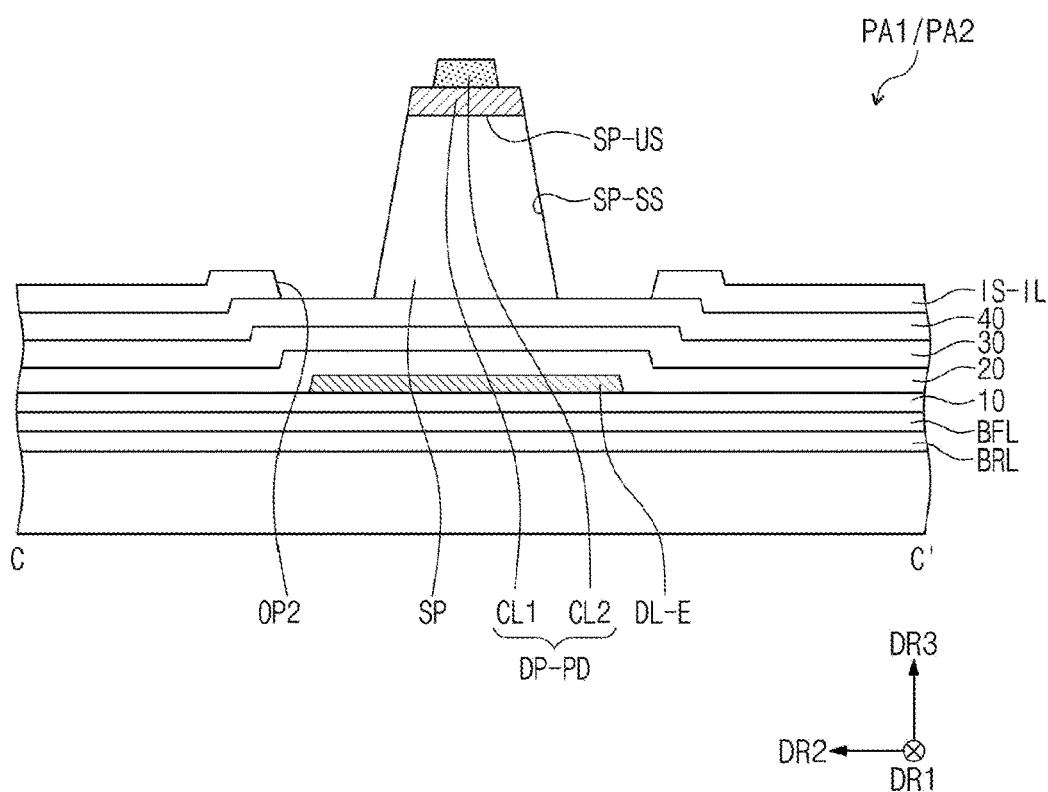
FIGS. 12E to 12L are cross-sectional views of the pad areas of FIG. 12D according to embodiments of the present disclosure.
Figure 12F:
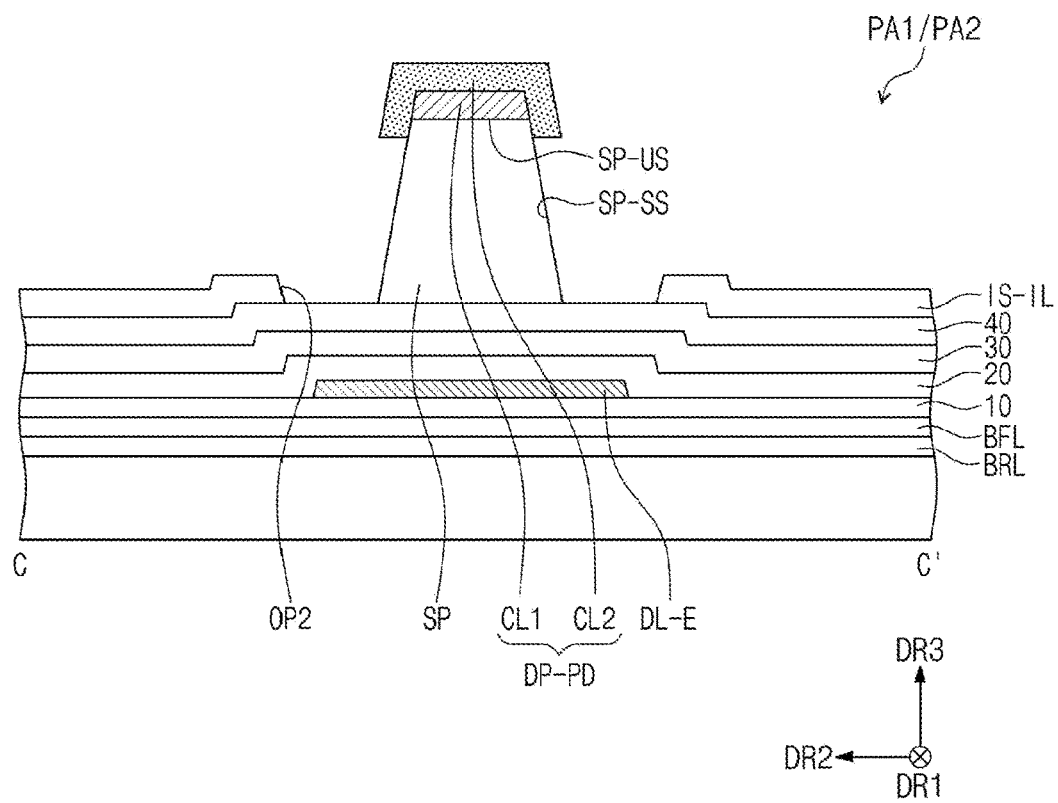
Figure 12G:
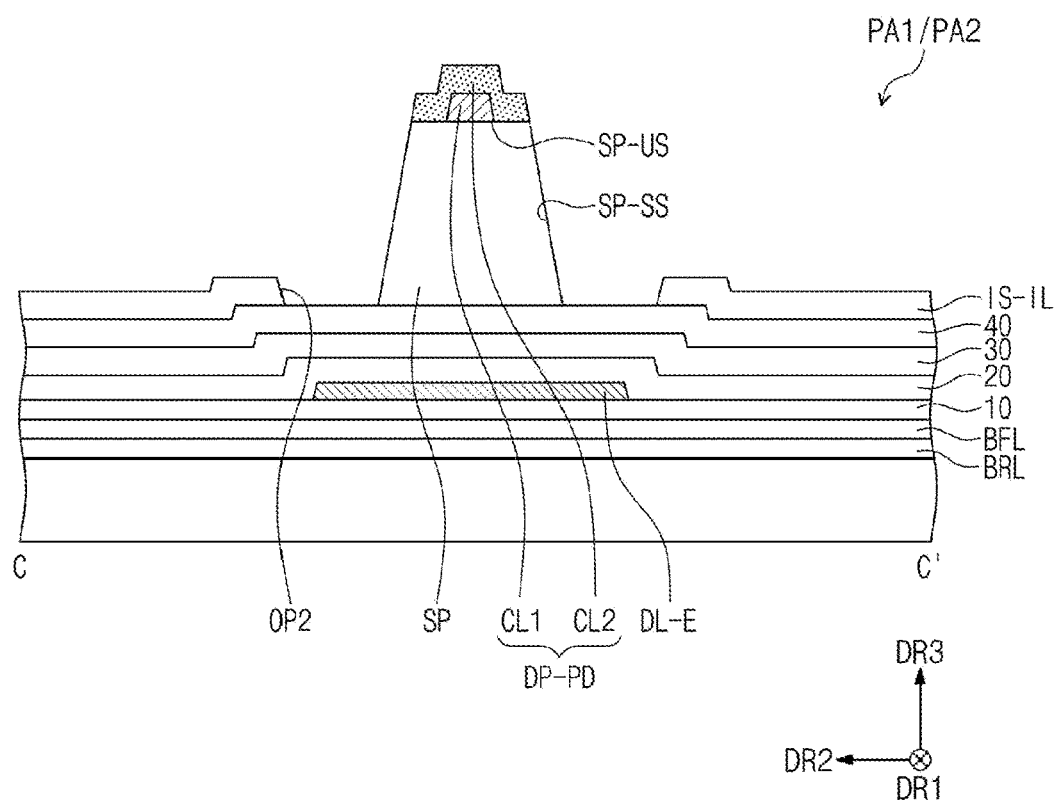
Figure 12H:
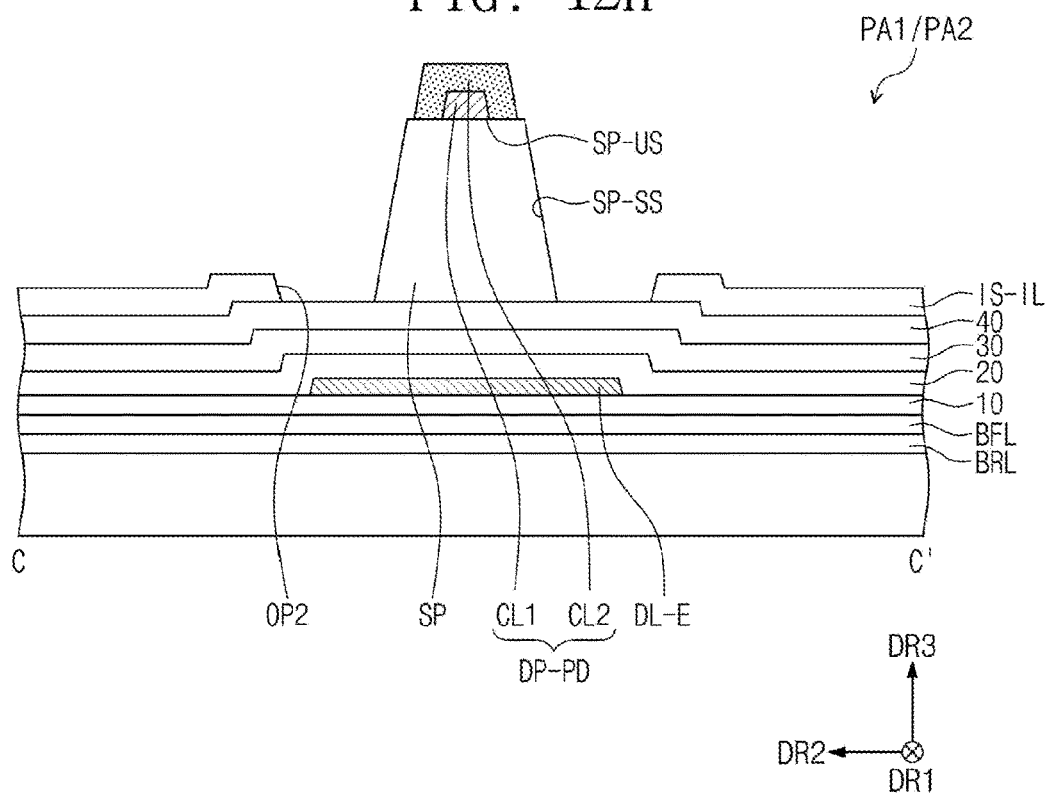
Figure 12I:
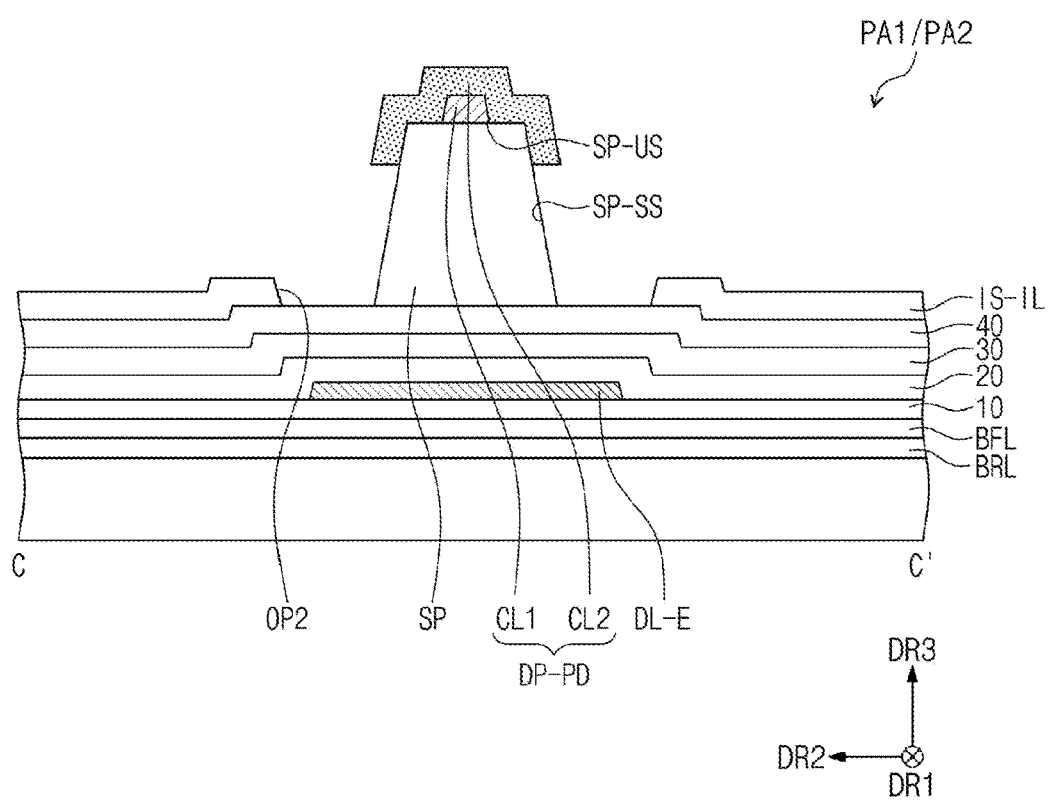
Figure 12J:
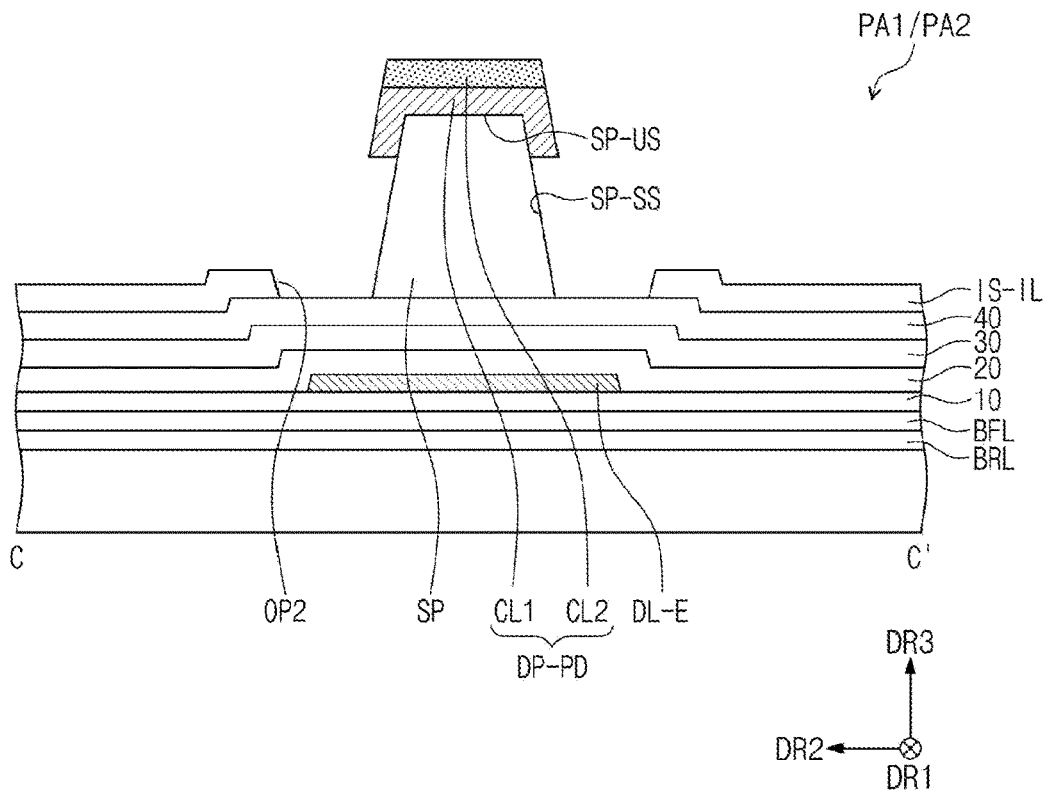
Figure 12K:
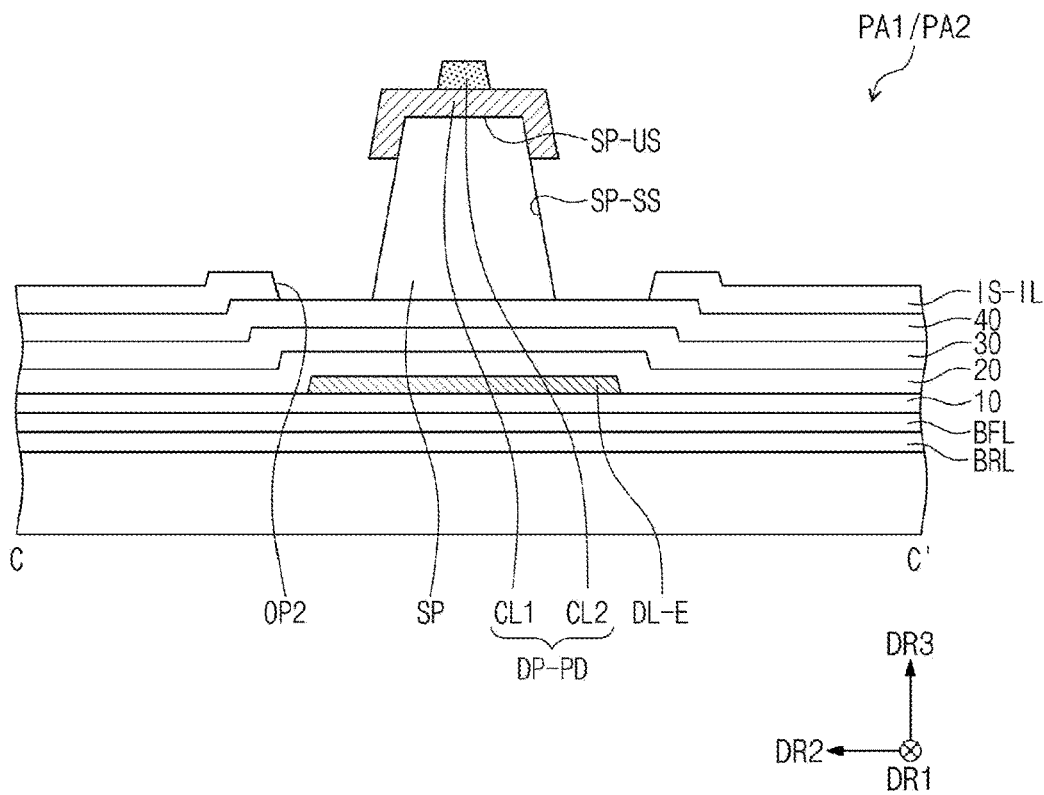
Figure 12L:
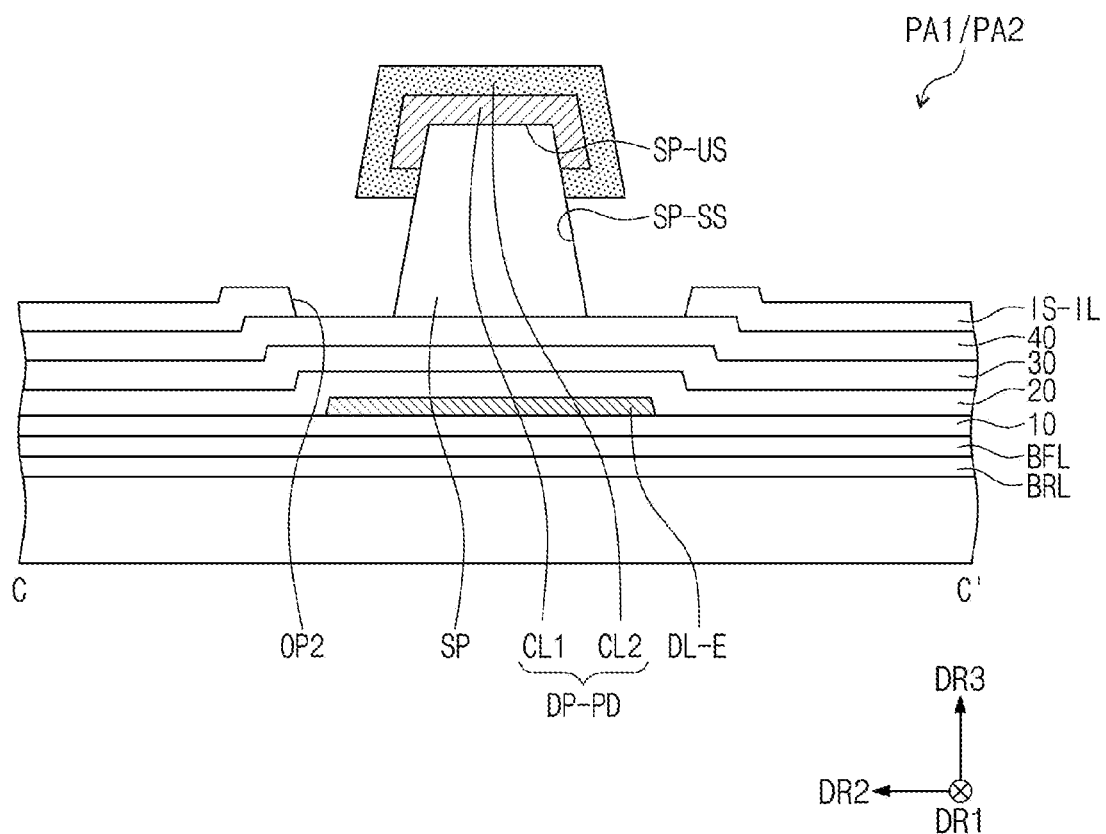
Figure 12M:
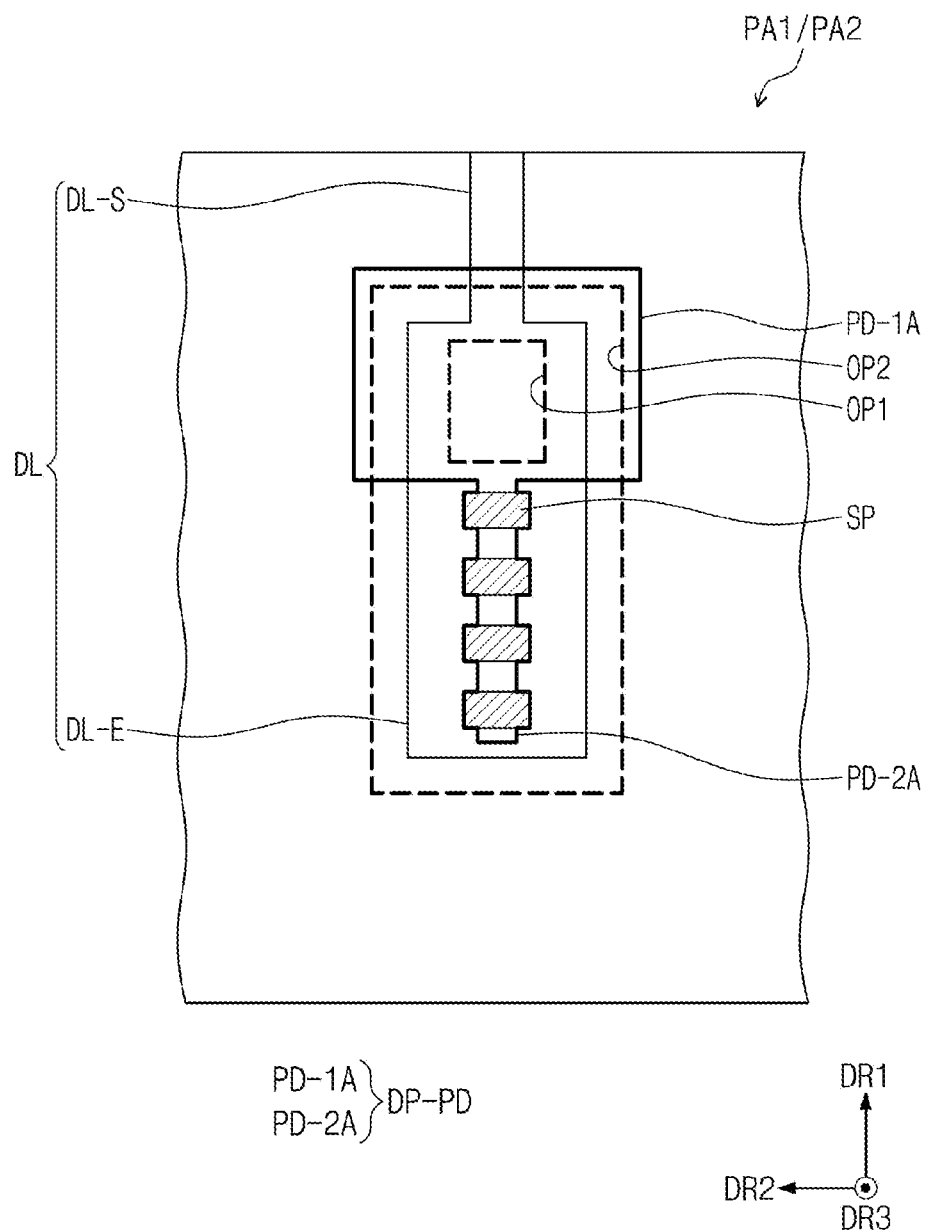
FIGS. 12M and 12N are plan views of pad areas according to embodiments of the present disclosure.
Figure 12N:
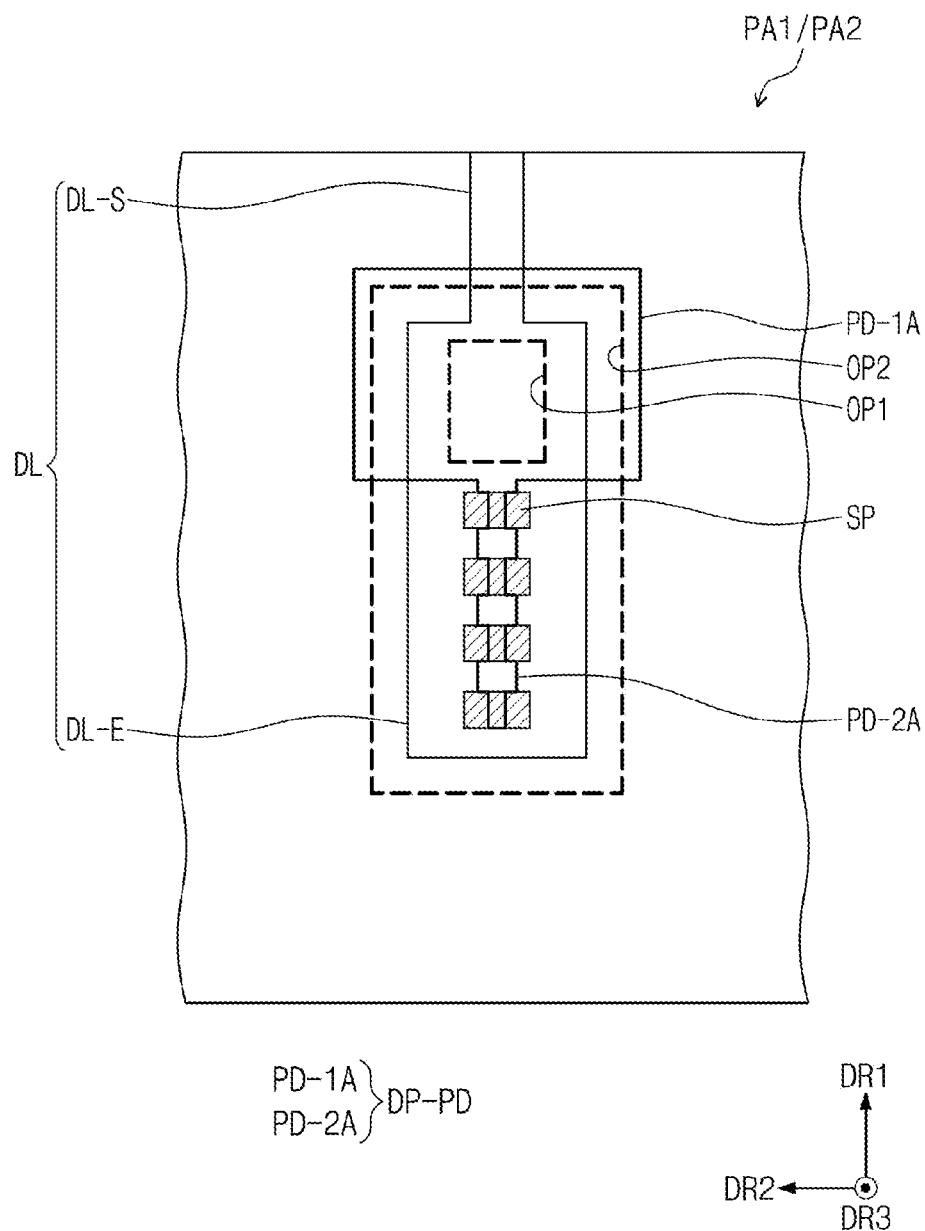

FIGS. 12E to 12L show a cross-section of various signal pads DP-PD. Referring to FIG. 12E, a first conductive pattern CL1 may have a width greater than that of a second conductive pattern CL2, or as shown in FIGS. 12F to 12I, a first conductive pattern CL1 may have a relatively smaller width than that of a second conductive pattern CL2. Referring to FIGS. 12F and 12I, a portion of the second conductive pattern CL2 may be in contact with a portion of a side surface SP-SS of an insulating pattern SP. Referring to FIGS. 12J and 12K, a portion of a first conductive pattern CL1 may be in contact with a portion of a side surface SP-SS of an insulating pattern SP, and the other portion of the side surface SP-SS of the insulating pattern SP may be exposed. In an embodiment, a second conductive pattern CL2 does not overlap the side surface SP-SS of the insulating pattern SP. Referring to FIG. 12L, a portion of a first conductive pattern CL1 and a portion of a second conductive pattern CL2 may be in contact with a portion of a side surface SP-SS of an insulating pattern SP. The portion of the second conductive pattern CL2 may surround the portion of the first conductive pattern CL1.

FIGS. 12M and 12N show signal pads DP-PD having a different shape from that of the signal pad DP-PD of FIG. 12A when viewed in a plane. A second portion PD-2A may have a width varying according to its area. As shown in FIG. 12M, an area of the second portion PD-2A, which overlaps an insulating pattern SP, may have a width greater than an area of the second portion PD-2A, which does not overlap the insulating pattern SP. Referring to FIG. 12N, an area of a second portion PD-2A, which overlaps an insulating pattern SP, may have a width smaller than an area of the second portion PD-2A, which does not overlap the insulating pattern SP.

Figure 13A:
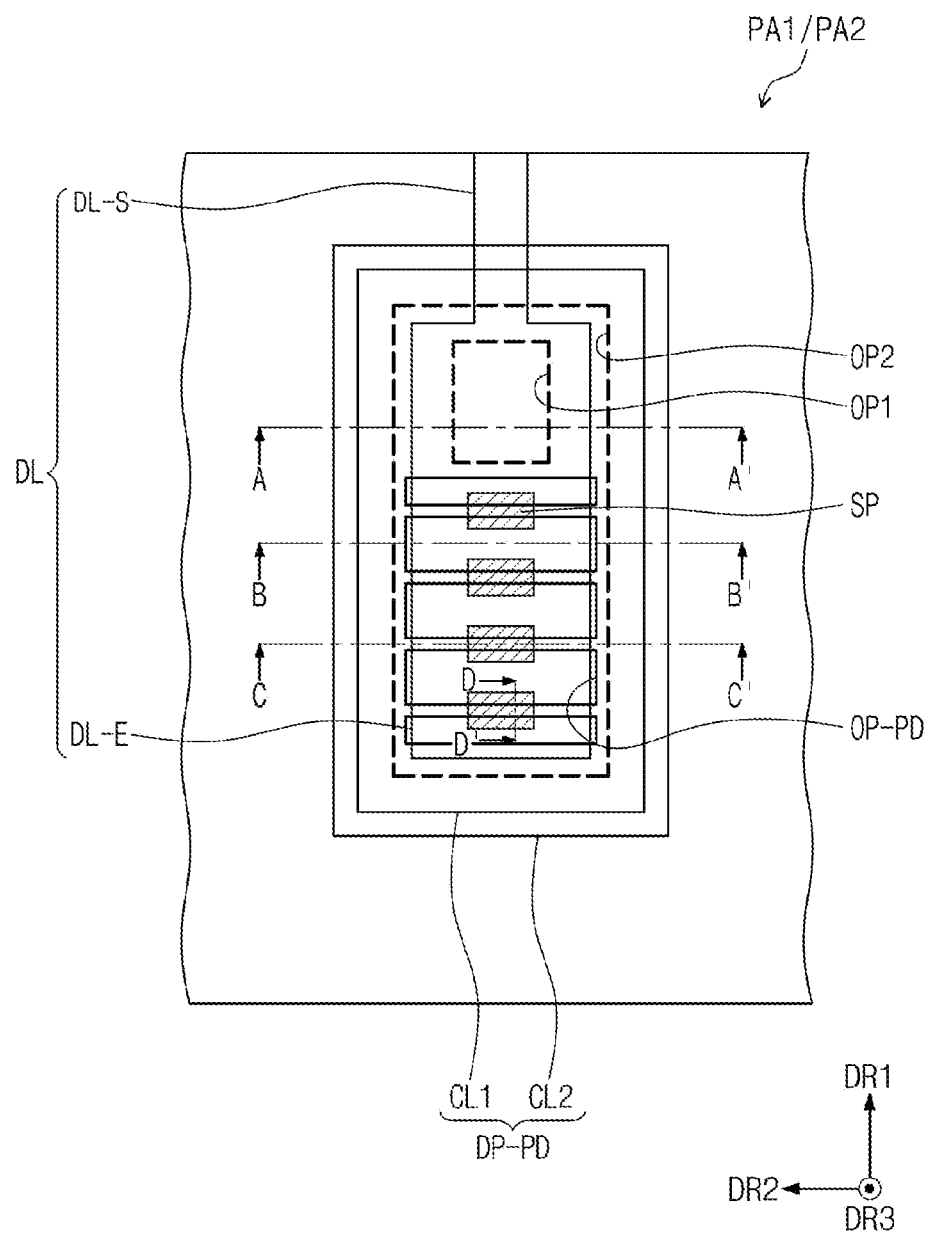
FIG. 13A is a plan view of pad areas according to an embodiment of the present disclosure.
Figure 13B:
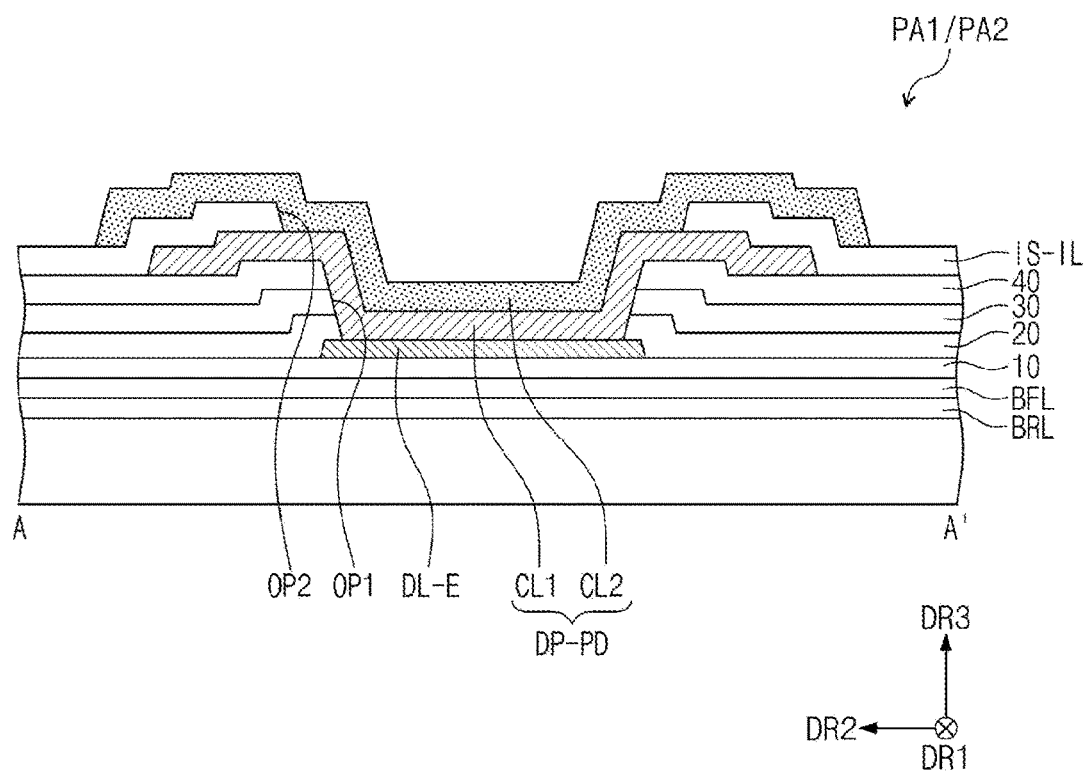
FIGS. 13B to 13E are cross-sectional views of the pad areas of FIG. 13A.

FIG. 13A is a plan view of pad areas PA1 and PA2 according to an embodiment of the present disclosure. FIGS. 13B to 13E are cross-sectional views corresponding to those of FIG. 13A according to embodiments of the present disclosure. FIGS. 13F to 13I are plan views of pad areas PA1 and PA2 according to embodiments of the present disclosure. Hereinafter, in FIGS. 13A to 13I, a further description of components and technical aspects previously described with reference to FIGS. 7A to 12N may be omitted.

Figure 13C:
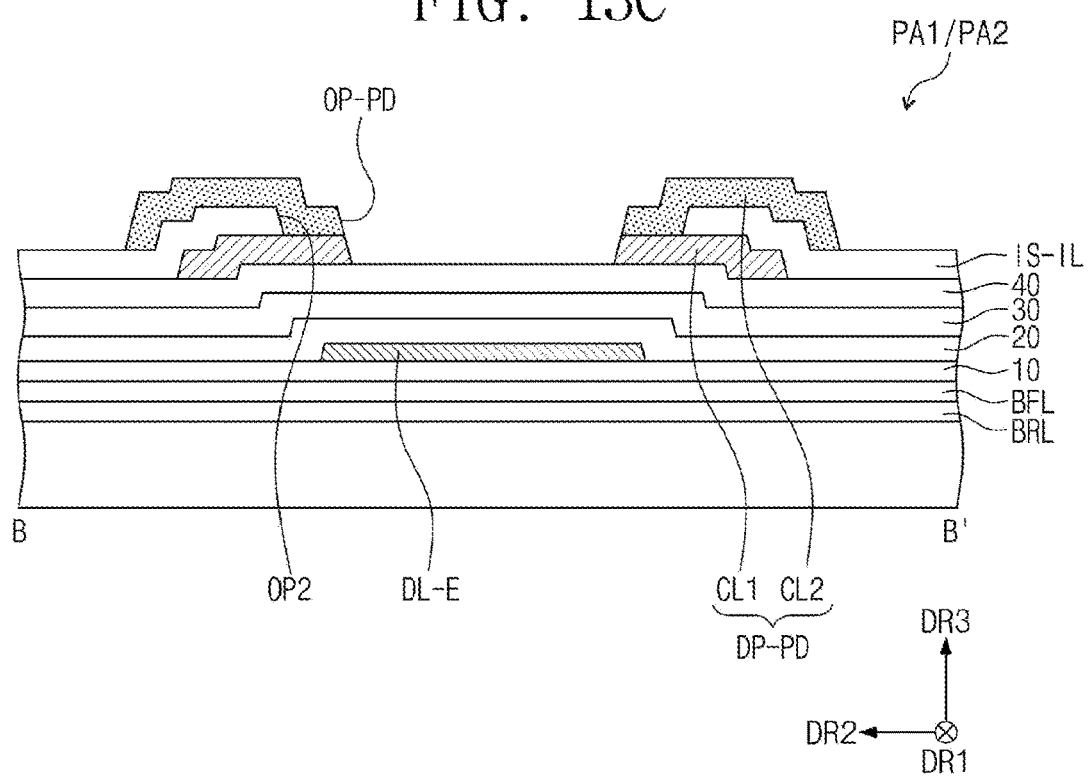

According to an embodiment, the pad areas PA1 and PA2 and a signal pad DP-PD may have shapes different from those of the pad areas PA1 and PA2 and the signal pad DP-PD described with reference to FIGS. 7A to 7D. As shown in FIGS. 13A to 13E, according to an embodiment, an opening OP-PD may be defined through the signal pad DP-PD. As shown in FIG. 13C, the opening OP-PD may be defined through a first conductive pattern CL1 and a second conductive pattern CL2.

Referring to FIG. 13A, the opening OP-PD may partially overlap an insulating pattern SP when viewed in a plane. The opening OP-PD may overlap a portion of at least one insulating pattern SP or may overlap a portion of each of two insulating patterns SP adjacent to each other.

Figure 13D:
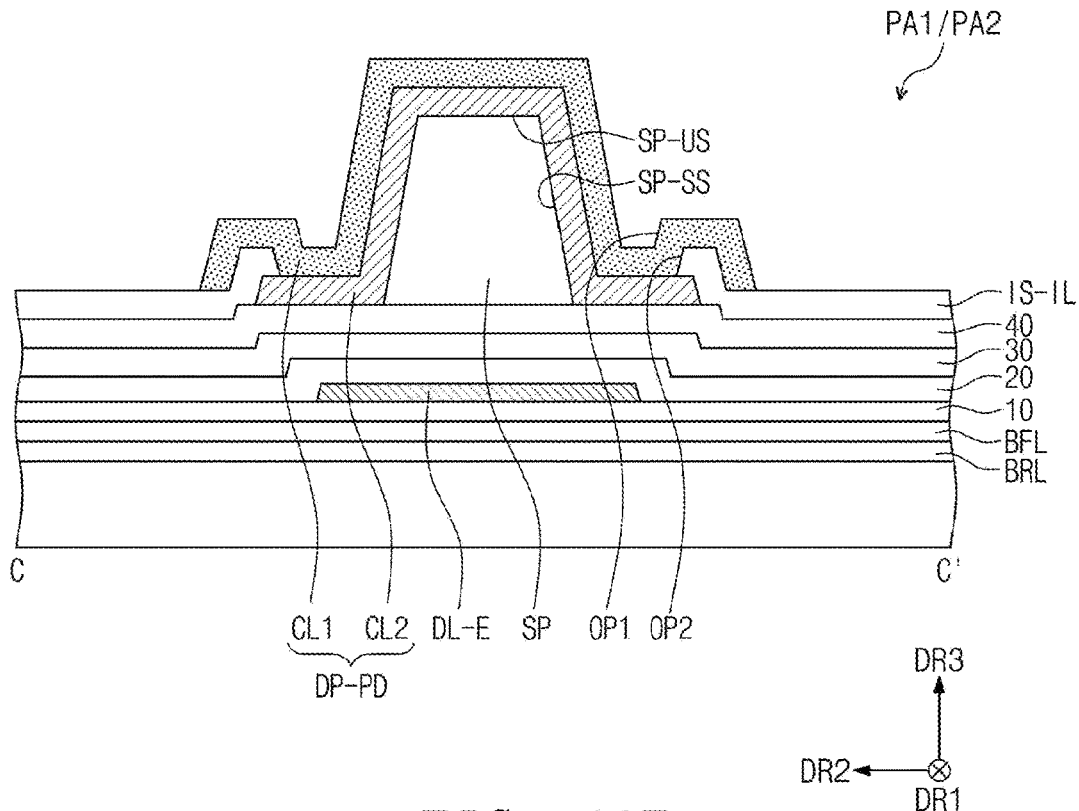
Figure 13E:
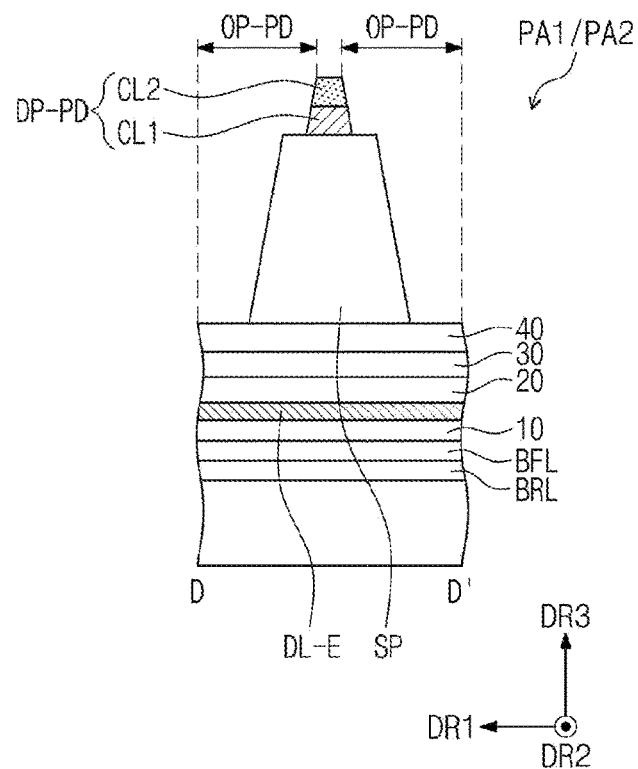

Referring to FIGS. 13A and 13D, at least a portion of a side surface SP-SS of the insulating pattern SP may be exposed through the opening OP-PD. Similar to the pad areas PA1 and PA2 described with reference to FIGS. 12A to 12N, the insulating pattern SP may be deformed in the bonding process, and the insulating pattern SP may absorb a portion of the bonding pressure.

Figure 13F:
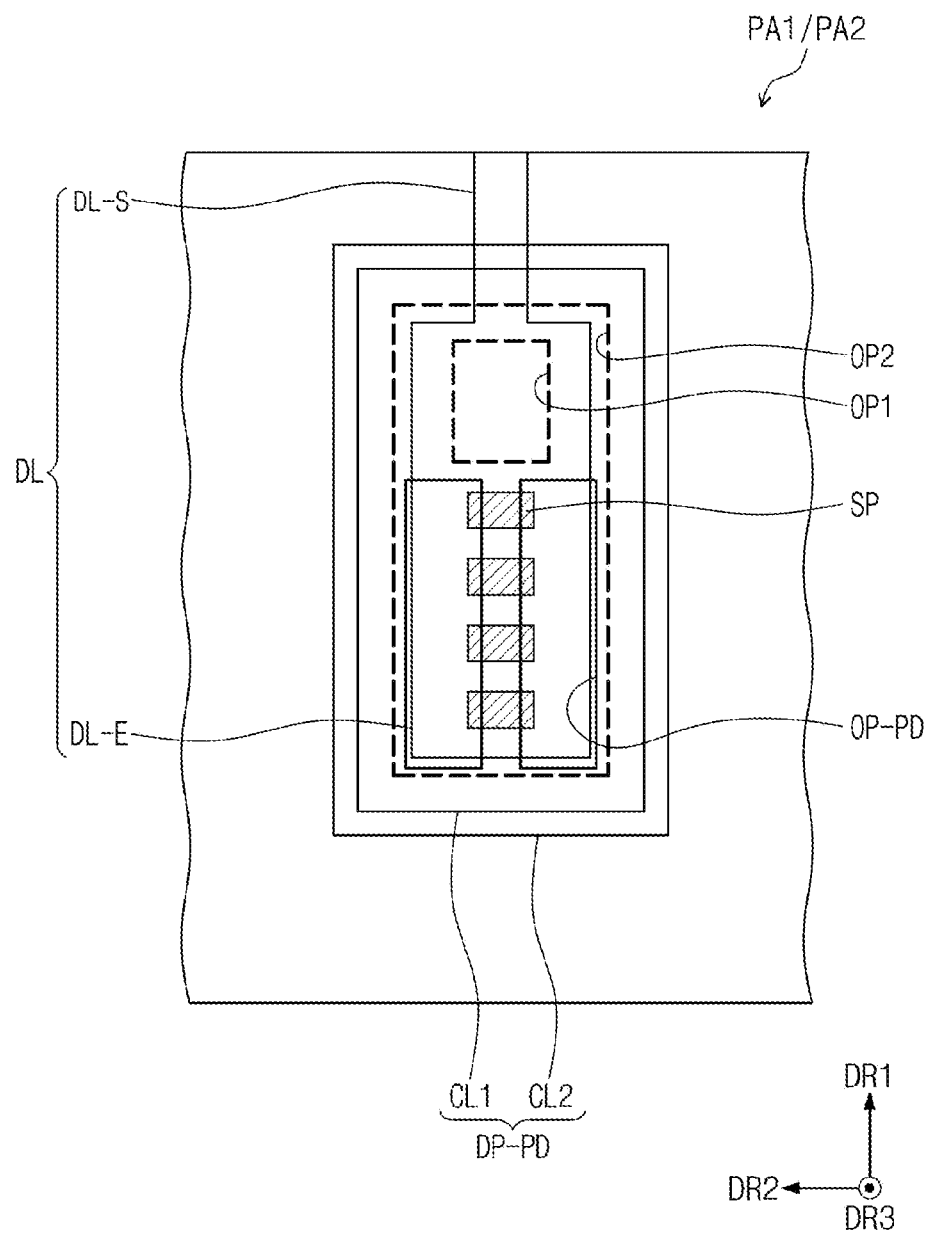
FIGS. 13F to 13I are cross-sectional views of pad areas according to an embodiment of the present disclosure.

FIGS. 13F to 13I are plan views of various signal pads DP-PD. Referring to FIG. 13F, two openings OP-PD facing each other in the second direction DR2 may be defined through the signal pad DP-PD. Each of the two openings OP-PD may overlap a portion of each of the insulating patterns SP.

Figure 13G:
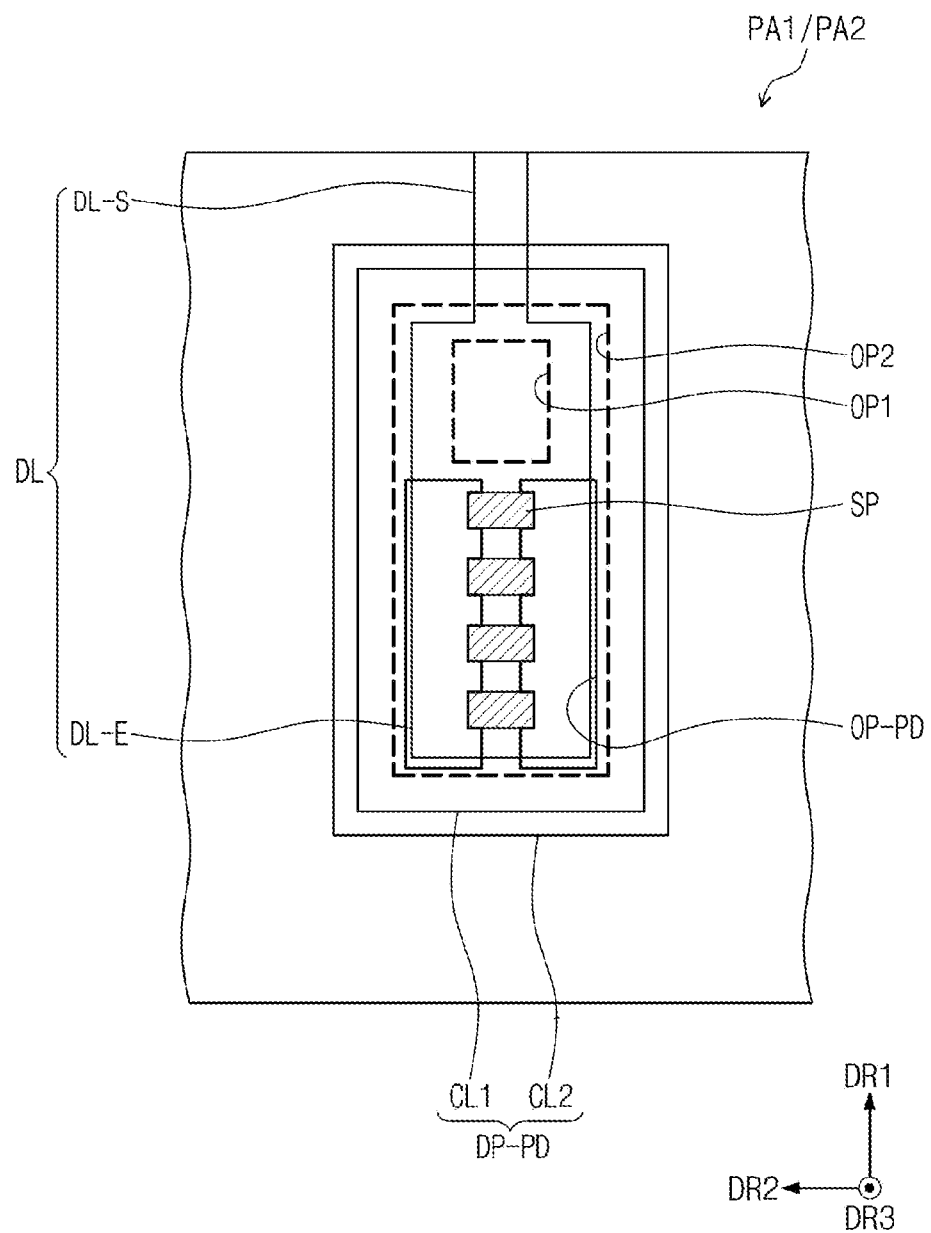

Referring to FIG. 13G, in an embodiment, an opening OP-PD does not overlap insulating patterns SP when viewed in a plane. However, a portion of a side surface SP-SS (refer to FIG. 13E) of the insulating patterns SP may be exposed through the opening OP-PD.

Figure 13H:
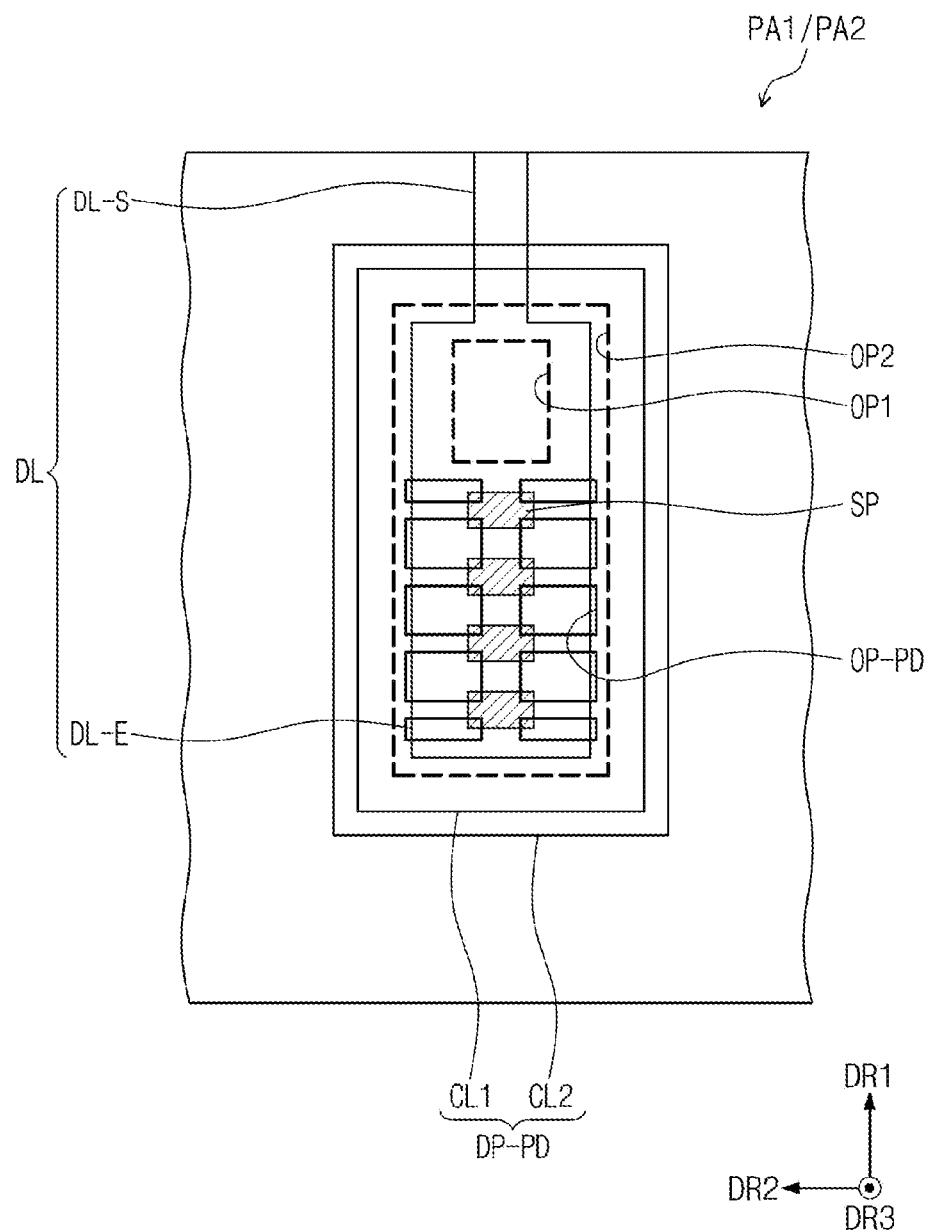
Figure 13I:
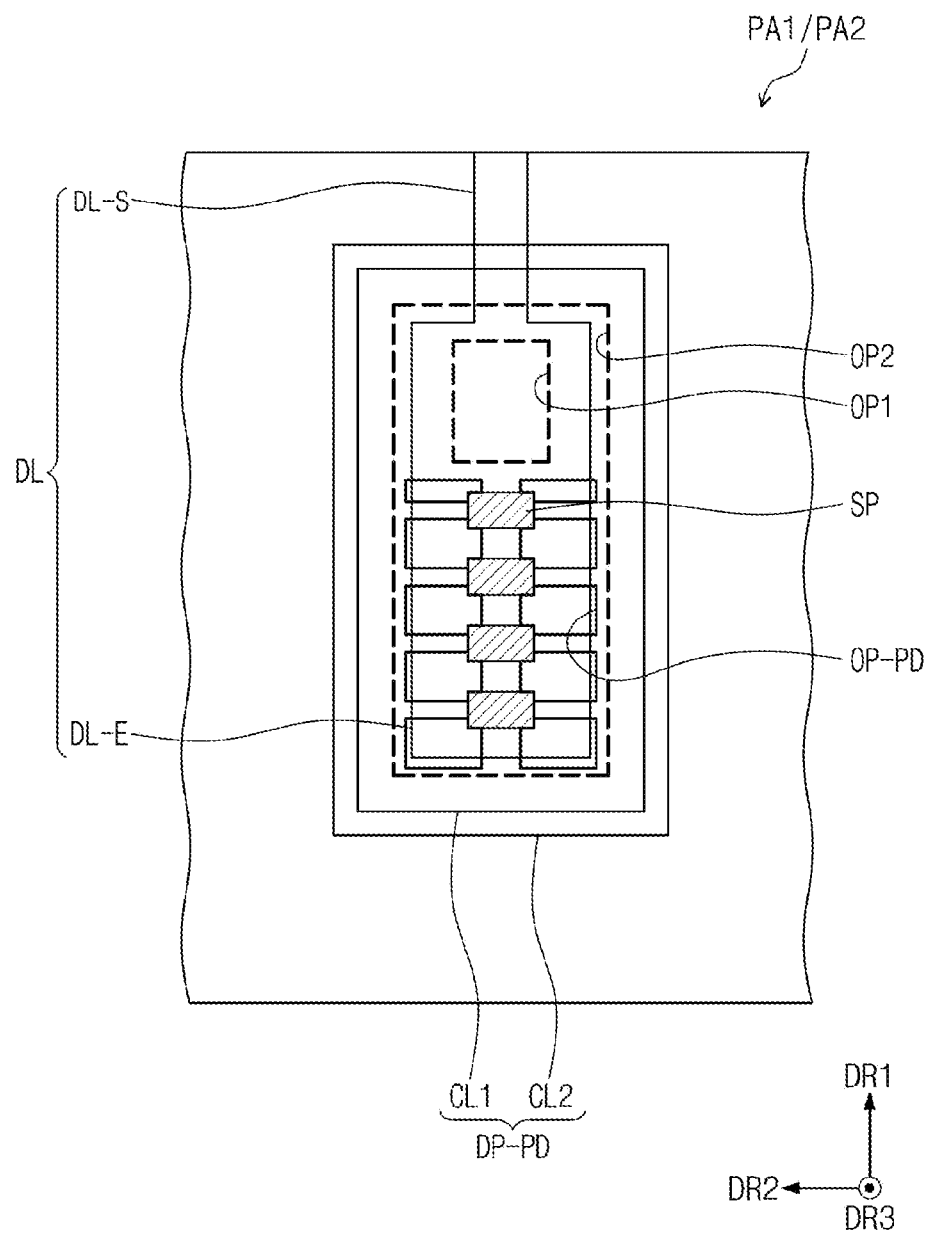

Referring to FIG. 13H, a plurality of openings OP-PD may be defined through the signal pad DP-PD. Each of the openings OP-PD may overlap a corner of insulating patterns SP when viewed in a plane. Referring to FIG. 13I, in an embodiment, an opening OP-PD does not overlap the insulating patterns SP when viewed in a plane, and a portion of a side surface SP-SS (refer to FIG. 13E) of insulating patterns SP may be exposed through the opening OP-PD.

Figure 14A:
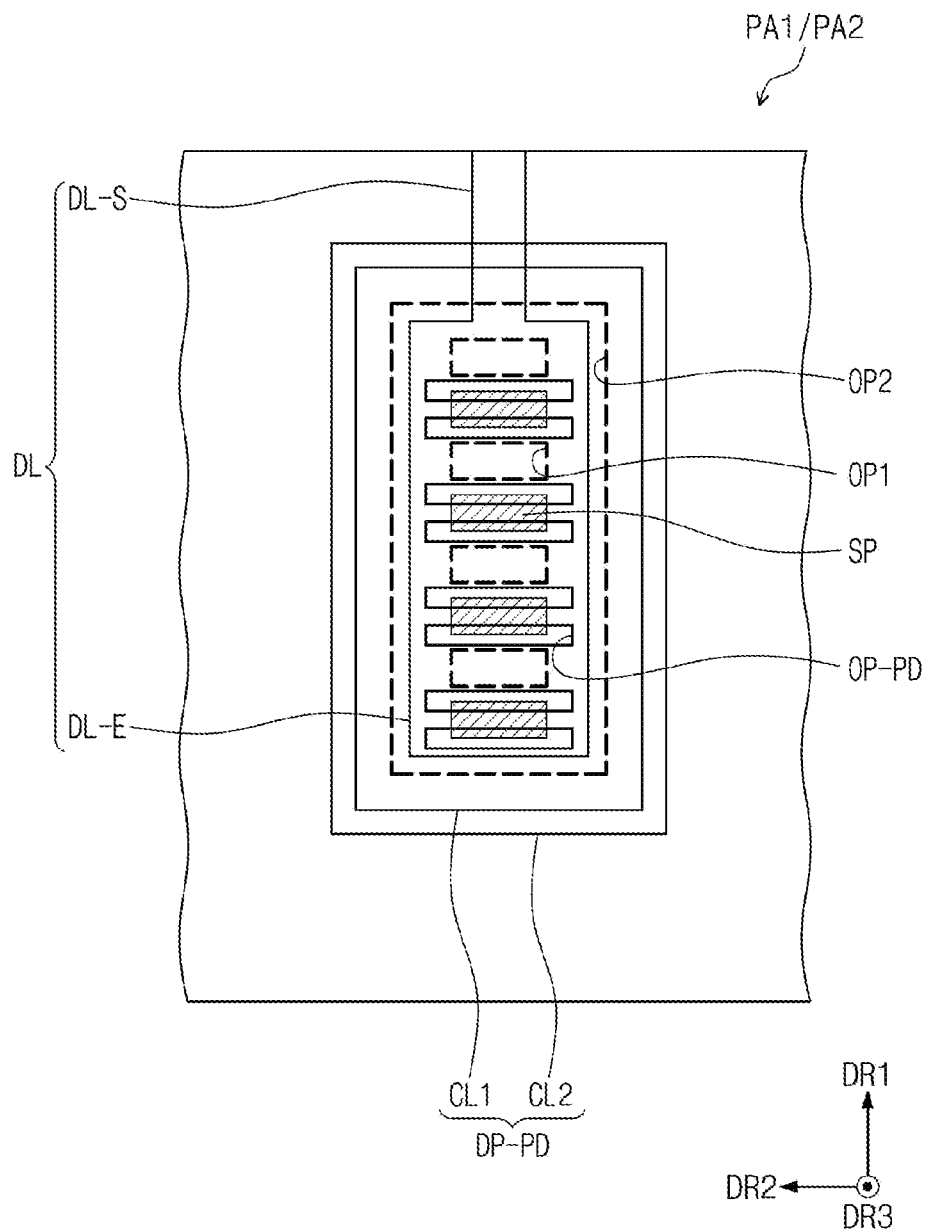
FIGS. 14A and 14B are cross-sectional views of pad areas according to embodiments of the present disclosure.
Figure 14B:
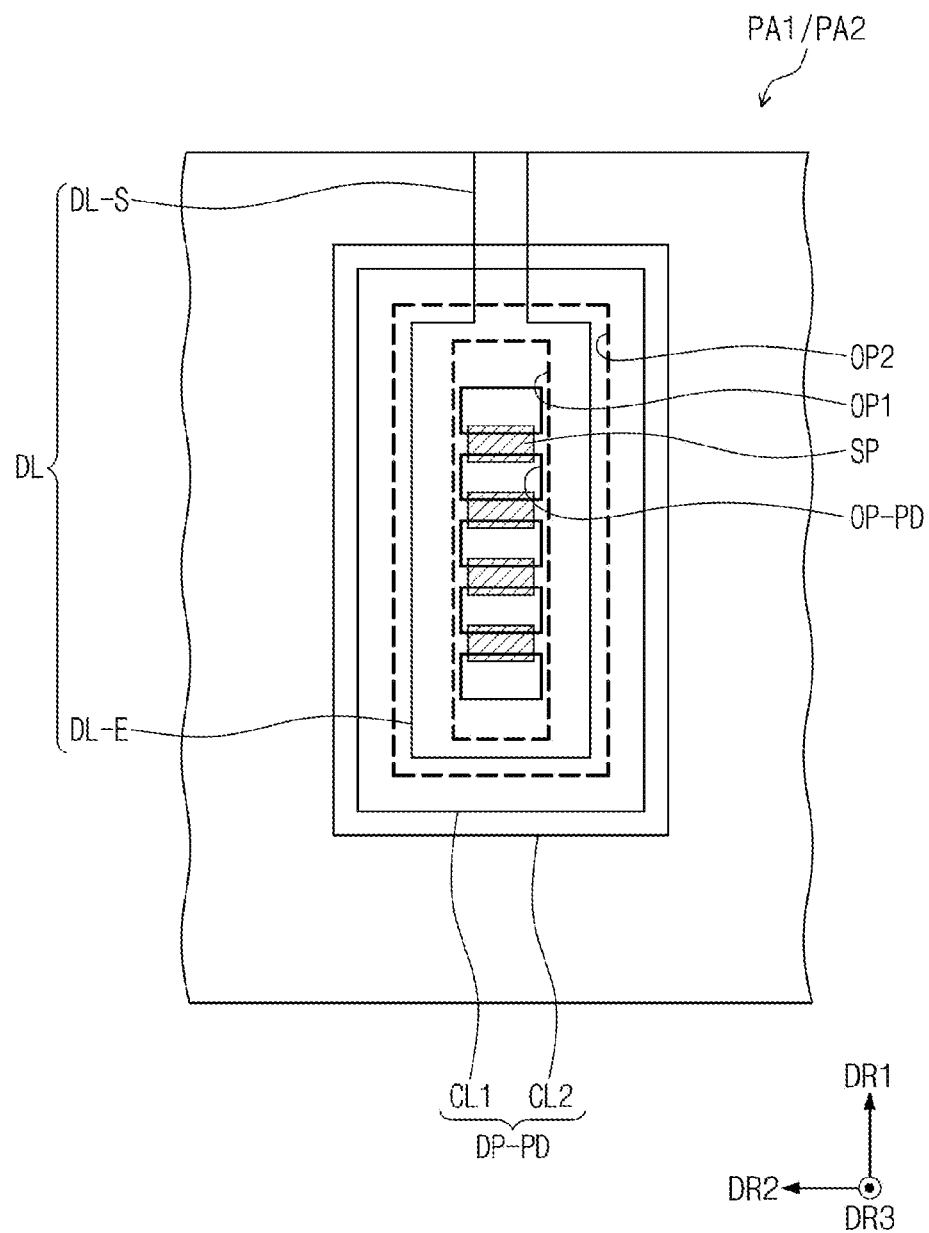

FIGS. 14A and 14B are plan views of pad areas PA1 and PA2 according to embodiments of the present disclosure. Hereinafter, in FIGS. 14A and 14B, a further description of components and technical aspects previously described with reference to FIGS. 7A to 13I may be omitted.

FIG. 14A shows pad areas PA1 and PA2 similar to that of FIG. 7J. According to an embodiment, openings OP-PD may be defined through a signal pad DP-PD when compared with the pad areas PA1 and PA2 of FIG. 7J. A portion of a side surface SP-SS (refer to FIG. 13E) of insulating patterns SP may be exposed through the openings OP-PD.

When viewed in a plane, each of the openings OP-PD may be defined to overlap two edges, which face each other in the first direction DR1, of each of the insulating patterns SP. A portion of an upper surface of the insulating pattern SP and a portion of the side surface of the insulating pattern SP may be exposed through the openings OP-PD.

FIG. 14B shows the pad areas PA1 and PA2 similar to the pad areas PA1 and PA2 of FIG. 10A. According to an embodiment, openings OP-PD may be defined through a signal pad DP-PD when compared to the pad areas PA1 and PA2 of FIG. 10A. A portion of a side surface SP-SS (refer to FIG. 13E) of insulating patterns SP may be exposed through the openings OP-PD.

Similar to the pad areas PA1 and PA2 described with reference to FIGS. 12A to 12N, the insulating pattern SP may be deformed in the bonding process, and the insulating pattern SP may absorb a portion of the bonding pressure.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:
1. A display device, comprising:
a base layer;
a pixel disposed on the base layer;
a signal line electrically connected to the pixel;
a signal pad connected to the signal line; and
a plurality of insulating layers disposed on the base layer,
wherein the signal pad comprises:
  a first conductive pattern connected to an end portion of the signal line;
  a second conductive pattern connected to the first conductive pattern; and
  at least one insulating pattern disposed between the end portion of the signal line and the second conductive pattern in a cross-sectional view and overlapping the second conductive pattern in a plan view,
  wherein a first group of insulating layers among the insulating layers is disposed between the end portion of the signal line and the first conductive pattern,
  the end portion of the signal line is connected to the first conductive pattern via a first contact hole defined through the first group of insulating layers,
  a second group of insulating layers among the insulating layers is disposed between the first conductive pattern and the second conductive pattern, and
  the first conductive pattern is connected to the second conductive pattern via a second contact hole defined through the second group of insulating layers.
2. The display device of claim 1, wherein the at least one insulating pattern is disposed outside the first contact hole in the plan view.

3. The display device of claim 1, wherein the first contact hole is disposed inside the second contact hole in the plan view.

4. The display device of claim 1, wherein the at least one insulating pattern is in contact with an upper surface of the first group of insulating layers, and the at least one insulating pattern is disposed between the first group of insulating layers and the second conductive pattern in the cross-sectional view.

5. The display device of claim 1, wherein the first contact hole is one of a plurality of first contact holes.

6. The display device of claim 5, wherein the first contact holes comprise: \
one side contact hole defined at one side; and
another side contact hole defined at another side and spaced apart from the one side contact hole,
wherein the at least one insulating pattern is disposed between the one side contact hole and the another side contact hole in a direction in which the end portion of the signal line extends.

7. The display device of claim 5, wherein the at least one insulating pattern is one of a plurality of insulating patterns, and the insulating patterns are alternately arranged with the first contact holes in a direction in which the end portion of the signal line extends.

8. The display device of claim 1, wherein the at least one insulating pattern is one of a plurality of insulating patterns, and the insulating patterns comprise:
a first insulating pattern disposed at one side; and
a second insulating pattern disposed at another side and spaced apart from the first insulating pattern,
wherein the first contact hole is disposed between the first insulating pattern and the second insulating pattern in a direction in which the end portion of the signal line extends.

9. The display device of claim 1, wherein the at least one insulating pattern is disposed inside the end portion of the signal line in the plan view.

10. The display device of claim 1, wherein the end portion of the signal line extends in a first direction, and a portion of the at least one insulating pattern does not overlap the end portion of the signal line in a second direction crossing the first direction.

11. The display device of claim 1, wherein the at least one insulating pattern is in contact with an upper surface of the first conductive pattern, and the at least one insulating pattern is disposed between the first conductive pattern and the second conductive pattern in the cross-sectional view.

12. The display device of claim 1, wherein the at least one insulating pattern is disposed inside the first contact hole and the second contact hole in the plan view.

13. The display device of claim 1, wherein the at least one insulating pattern is disposed inside the first contact hole and is disposed outside the second contact hole in the plan view.

14. The display device of claim 13, wherein the at least one insulating pattern is in contact with an upper surface of the second group of insulating layers, and the at least one insulating pattern is disposed between the second group of insulating layers and the second conductive pattern in the cross-sectional view.

15. The display device of claim 1, wherein at least one of the first conductive pattern and the second conductive pattern surrounds an upper surface of the at least one insulating pattern and a side surface of the at least one insulating pattern.

16. The display device of claim 1, wherein at least a portion of a side surface of the at least one insulating pattern is exposed without being covered by the first conductive pattern and the second conductive pattern.

17. The display device of claim 16, wherein each of the first conductive pattern and the second conductive pattern does not overlap the side surface of the at least one insulating pattern.

18. The display device of claim 17, wherein the first conductive pattern exposes a portion of the side surface of the at least one insulating pattern, and the second conductive pattern does not overlap the side surface of the at least one insulating pattern.

19. The display device of claim 17, wherein the first conductive pattern and the second conductive pattern comprise an opening defined therethrough, and a portion of the opening overlaps a portion of the at least one insulating pattern in the plan view.

20. The display device of claim 1, wherein the pixel comprises:
a light emitting element;
a transistor electrically connected to the light emitting element and comprising a semiconductor pattern and a gate overlapping the semiconductor pattern;
an upper electrode disposed on the gate; and
a plurality of connection electrodes electrically connected to the transistor and disposed on different layers from each other,
wherein the end portion of the signal line comprises a same material as the gate or the upper electrode, and the first conductive pattern comprises a same material as at least one of the connection electrodes.

21. The display device of claim 20, wherein the end portion of the signal line and the first conductive pattern comprise different materials from each other.

22. The display device of claim 21, further comprising:
a thin film encapsulation layer disposed on the pixel; and
a sensing electrode disposed on the thin film encapsulation layer.

23. The display device of claim 22, wherein the second conductive pattern comprises a same material as the sensing electrode.

24. A display device, comprising:
a display panel;
an input sensor disposed on the display panel;
an electronic component electrically connected to the display panel; and
an adhesive layer disposed between the display panel and the electronic component,
wherein the display panel comprises:
a base layer;
a pixel disposed on the base layer;
a signal line electrically connected to the pixel;
a signal pad connected to the signal line; and
a plurality of insulating layers disposed on the base layer,
wherein the signal pad comprises:
a first conductive pattern connected to an end portion of the signal line;
a second conductive pattern connected to the first conductive pattern; and
at least one insulating pattern disposed between the end portion of the signal line and the second conductive pattern in a cross-sectional view and overlapping the end portion of the signal line and the second conductive pattern in a plan view,
wherein the electronic component comprises a bump or a signal pad that is in contact with the second conductive pattern.

25. The display device of claim 24, wherein a first group of insulating layers among the insulating layers is disposed between the end portion of the signal line and the first conductive pattern, the end portion of the signal line is connected to the first conductive pattern via a first contact hole defined through the first group of insulating layers, a second group of insulating layers among the insulating layers is disposed between the first conductive pattern and the second conductive pattern, and the first conductive pattern is connected to the second conductive pattern via a second contact hole defined through the second group of insulating layers.

26. The display device of claim 25, wherein the input sensor comprises a sensing electrode, and the second conductive pattern comprises a same material as the sensing electrode.

27. The display device of claim 26, wherein the second conductive pattern and the sensing electrode are in contact with the second group of insulating layers.

28. The display device of claim 25, wherein the second group of insulating layers has a multi-layer structure.

29. The display device of claim 24, wherein the electronic component comprises a driving chip that provides a data signal to the pixel.

* * * * *